(12) United States Patent
Miyairi et al.

(10) Patent No.: US 8,895,407 B2
(45) Date of Patent: Nov. 25, 2014

(54) MANUFACTURING METHOD OF SOI SUBSTRATE AND MANUFACTURING METHOD OF SEMICONDUCTOR DEVICE

(75) Inventors: Hidekazu Miyairi, Isehara (JP); Akihisa Shimomura, Isehara (JP); Tatsuya Mizoi, Atsugi (JP); Eiji Higa, Atsugi (JP); Yoji Nagano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/891,271

(22) Filed: Sep. 27, 2010

(65) Prior Publication Data

US 2011/0076837 A1 Mar. 31, 2011

Related U.S. Application Data

(62) Division of application No. 12/078,212, filed on Mar. 28, 2008, now Pat. No. 7,820,524.

(30) Foreign Application Priority Data

May 18, 2007 (JP) ................................ 2007-132380

(51) Int. Cl.
*H01L 21/46* (2006.01)
*H01L 21/762* (2006.01)
*H01L 27/12* (2006.01)
*H01L 51/00* (2006.01)
*H01L 29/786* (2006.01)

(52) U.S. Cl.
CPC ...... *H01L 21/76254* (2013.01); *H01L 27/1214* (2013.01); *H01L 27/1266* (2013.01); *H01L 51/0027* (2013.01); *H01L 29/78654* (2013.01); *H01L 2224/03552* (2013.01)

USPC .......... 438/458; 438/149; 438/370; 438/402; 438/473; 257/E21.12; 257/E21.317; 257/E21.319; 257/E21.563; 257/E21.568

(58) Field of Classification Search
None
See application file for complete search history.

(56) References Cited

U.S. PATENT DOCUMENTS 5,294,811 A 3/1994 Aoyama et al.
5,374,564 A 12/1994 Bruel (Continued)

FOREIGN PATENT DOCUMENTS

CN 1180238 4/1998
EP 0 871 216 10/1998

(Continued)

OTHER PUBLICATIONS

European Office Action (Application No. 08005687.2) dated Apr. 5, 2011.

(Continued)

*Primary Examiner* — Yasser A Abdelaziez
(74) *Attorney, Agent, or Firm* — Eric J. Robinson; Robinson Intellectual Property Law Office, P.C.

(57) ABSTRACT

A manufacturing method of an SOI substrate which possesses a base substrate having low heat resistance and a very thin semiconductor layer having high planarity is demonstrated. The method includes: implanting hydrogen ions into a semiconductor substrate to form an ion implantation layer; bonding the semiconductor substrate and a base substrate such as a glass substrate, placing a bonding layer therebetween; heating the substrates bonded to each other to separate the semiconductor substrate from the base substrate, leaving a thin semiconductor layer over the base substrate; irradiating the surface of the thin semiconductor layer with laser light to improve the planarity and recover the crystallinity of the thin semiconductor layer; and thinning the thin semiconductor layer. This method allows the formation of an SOI substrate which has a single-crystalline semiconductor layer with a thickness of 100 nm or less over a base substrate.

8 Claims, 56 Drawing Sheets

(56) References Cited

U.S. PATENT DOCUMENTS

| | | | |
|---|---|---|---|
| 5,383,993 A * | 1/1995 | Katada et al. | 156/153 |
| 6,110,845 A | 8/2000 | Seguchi et al. | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,534,380 B1 | 3/2003 | Yamauchi et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,927,148 B2 | 8/2005 | Ito | |
| 6,946,361 B2 | 9/2005 | Takayama et al. | |
| 6,972,246 B2 | 12/2005 | Nakano et al. | |
| 6,992,025 B2 | 1/2006 | Maa et al. | |
| 7,064,049 B2 | 6/2006 | Ito et al. | |
| 7,119,365 B2 | 10/2006 | Takafuji et al. | |
| 7,148,124 B1 | 12/2006 | Usenko | |
| 7,176,525 B2 | 2/2007 | Fukunaga | |
| 7,189,665 B2 | 3/2007 | Nakano et al. | |
| 7,199,024 B2 | 4/2007 | Yamazaki | |
| 7,256,776 B2 | 8/2007 | Yamazaki et al. | |
| 7,361,573 B2 | 4/2008 | Takayama et al. | |
| 7,390,725 B2 | 6/2008 | Maa et al. | |
| 7,410,882 B2 | 8/2008 | Wong et al. | |
| 7,442,631 B2 | 10/2008 | Koezuka et al. | |
| 7,473,971 B2 | 1/2009 | Yamazaki et al. | |
| 7,476,576 B2 | 1/2009 | Yamazaki et al. | |
| 7,491,342 B2 | 2/2009 | Kamiyama et al. | |
| 7,535,053 B2 | 5/2009 | Yamazaki | |
| 7,579,654 B2 | 8/2009 | Couillard et al. | |
| 7,619,250 B2 | 11/2009 | Takafuji et al. | |
| 7,674,687 B2 | 3/2010 | Henley | |
| 7,897,443 B2 | 3/2011 | Moriguchi et al. | |
| 7,911,016 B2 | 3/2011 | Henley | |
| 8,012,855 B2 | 9/2011 | Henley | |
| 8,071,463 B2 | 12/2011 | Henley | |
| 8,153,513 B2 | 4/2012 | Henley | |
| 2002/0011627 A1 | 1/2002 | Takemura et al. | |
| 2002/0070454 A1 | 6/2002 | Yasukawa | |
| 2004/0038504 A1 | 2/2004 | Ito | |
| 2005/0006646 A1 | 1/2005 | Nakano et al. | |
| 2005/0042798 A1 | 2/2005 | Nagao et al. | |
| 2006/0118868 A1 * | 6/2006 | Yoshimura et al. | 257/347 |
| 2007/0108510 A1 | 5/2007 | Fukunaga | |
| 2007/0141803 A1 | 6/2007 | Boussagol et al. | |
| 2007/0173000 A1 | 7/2007 | Yamazaki | |
| 2007/0238312 A1 | 10/2007 | Murakami et al. | |
| 2007/0281172 A1 * | 12/2007 | Couillard et al. | 428/446 |
| 2007/0281440 A1 | 12/2007 | Cites et al. | |
| 2007/0291022 A1 | 12/2007 | Yamazaki et al. | |
| 2008/0038908 A1 | 2/2008 | Henley | |
| 2008/0261376 A1 | 10/2008 | Yamazaki et al. | |
| 2010/0126587 A1 | 5/2010 | Henley | |
| 2010/0129950 A1 | 5/2010 | Henley | |
| 2010/0129951 A1 | 5/2010 | Henley | |
| 2011/0136320 A1 | 6/2011 | Yamazaki et al. | |

FOREIGN PATENT DOCUMENTS

| | | |
|---|---|---|
| EP | 1 635 396 | 3/2006 |
| JP | 04-286318 A | 10/1992 |
| JP | 06-020895 A | 1/1994 |
| JP | 08-255762 | 10/1996 |
| JP | 10-284431 | 10/1998 |
| JP | 11-040786 | 2/1999 |
| JP | 11-097379 | 4/1999 |
| JP | 11-163363 | 6/1999 |
| JP | 2000-077287 A | 3/2000 |
| JP | 2000-294754 | 10/2000 |
| JP | 2004-087606 | 3/2004 |
| JP | 2004-179649 A | 6/2004 |
| JP | 2005-005381 A | 1/2005 |
| JP | 2005-203596 | 7/2005 |
| JP | 2005-252244 | 9/2005 |
| JP | 2006-203219 | 8/2006 |
| JP | 2006-253659 | 9/2006 |
| JP | 2006-294703 | 10/2006 |
| JP | 2009-507363 | 2/2009 |
| WO | WO-2006/117900 | 11/2006 |
| WO | WO 2007/014320 | 2/2007 |
| WO | WO-2008/014339 | 1/2008 |

OTHER PUBLICATIONS

Chinese Office Action (Application No. 200810088432.7) dated Mar. 9, 2011.

Search Report (Application No. 08005687.2) dated May 27, 2010.

Kahlert et al., "UV-Optics for Excimer Laser based Crystallization Process," Mat. Res. Soc. Symp. Proc., vol. 685E, 2001.

Kahlert et al., "UV-Optics for Excimer Laser based Crystallization Process," Mat. Res. Soc. Symp. Proc., vol. 685E, 2001, pp. D6.2.1-D6.2.6.

Taiwanese Office Action (Application No. 97111178) Dated Feb. 17, 2014.

Korean Office Action (Application No. 2008-0029033) Dated Feb. 24, 2014.

* cited by examiner

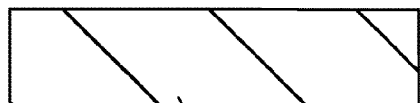
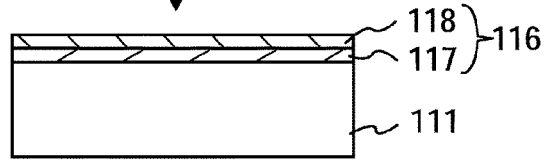
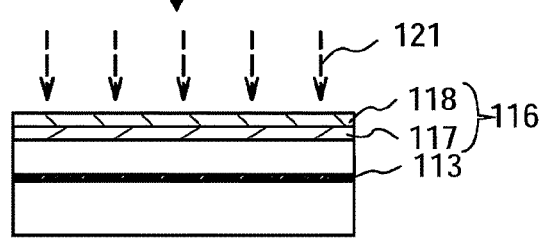
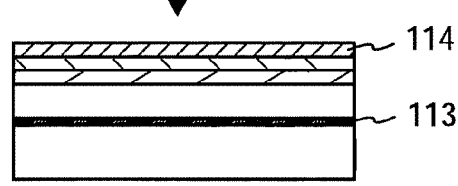
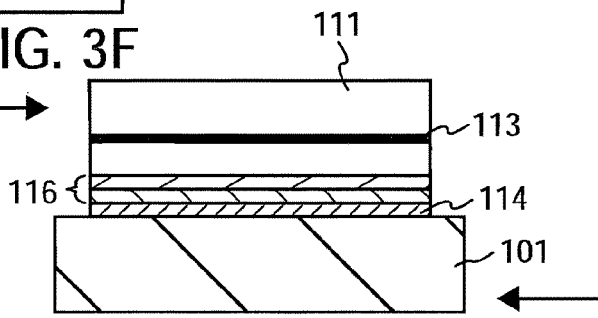
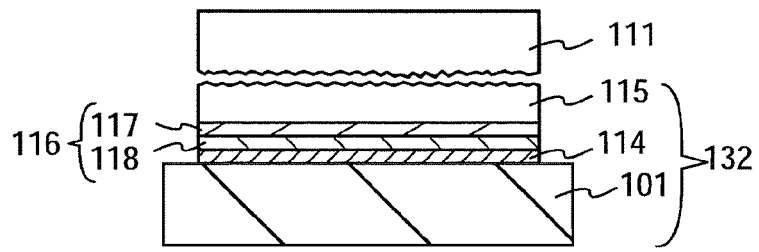

| | 302 | Semiconductor layer |
| | 310 | Formation region of display panel |
| | 311 | Formation region of scanning line driver circuit |
| | 312 | Formation region of signal line driver circuit |
| | 313 | Pixel formation region |

FIG. 19A
(A) Before laser irradiation
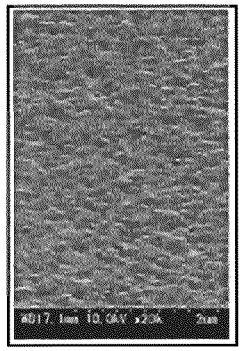
FIG. 19B
(B) Under air
FIG. 19C
(C) Under nitrogen
347 mJ/cm²
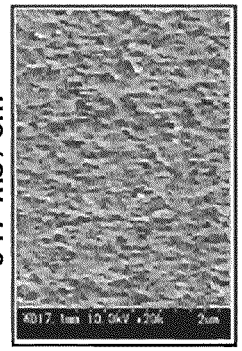 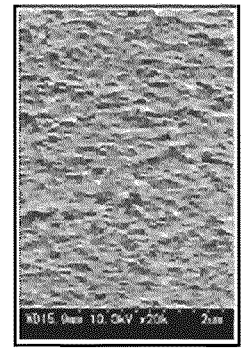
525 mJ/cm²
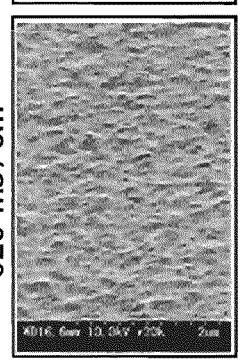 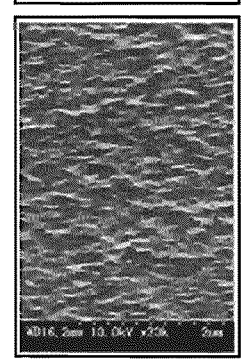
619 mJ/cm²
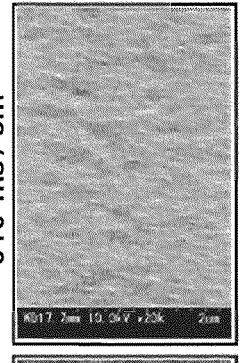 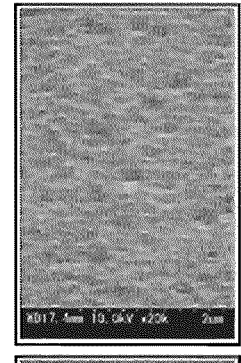
743 mJ/cm²
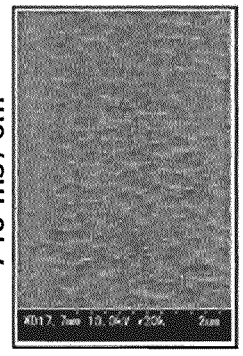 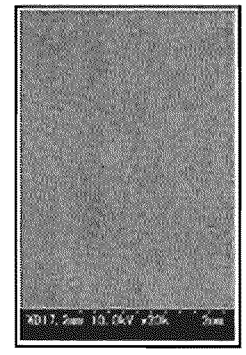

(A) Before laser irradiation (B) Under air, 525 mJ/cm$^2$ (C) Under nitrogen, 431 mJ/cm$^2$ (D) Under nitrogen, 525 mJ/cm$^2$ (E) Under nitrogen, 619 mJ/cm$^2$ (A) Before laser irradiation (C) Under nitrogen, 431 mJ/cm$^2$ (B) Under air, 525 mJ/cm$^2$ (D) Under nitrogen, 525 mJ/cm$^2$ (E) Under nitrogen, 619 mJ/cm$^2$

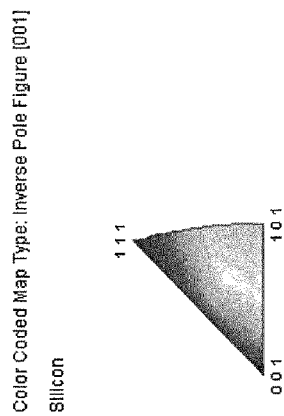
FIG. 24D
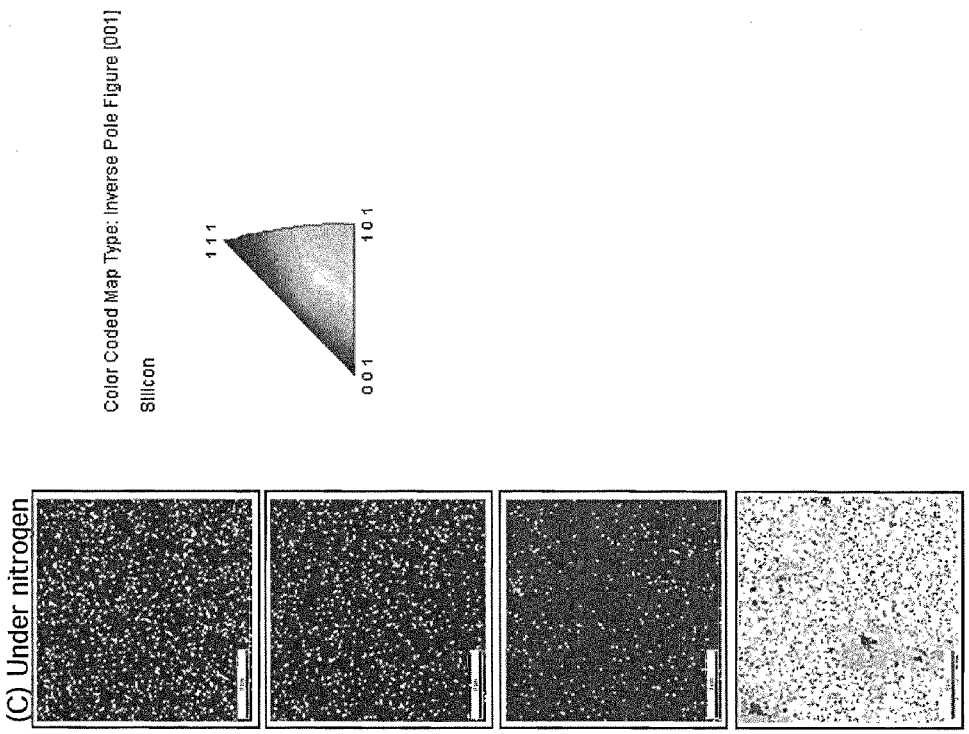
FIG. 24C (C) Under nitrogen
FIG. 24B (B) Under air
387 mJ/cm² 525 mJ/cm² 619 mJ/cm² 743 mJ/cm²
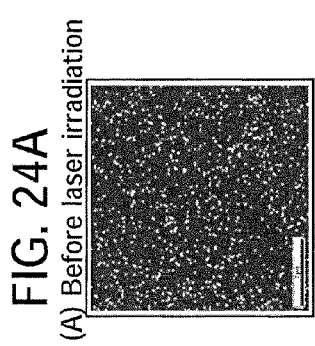
FIG. 24A (A) Before laser irradiation

FIG. 29A
(A) Before laser irradiation
FIG. 29B
(B) Under air
FIG. 29C
(C) Under nitrogen
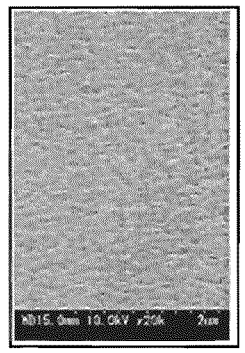
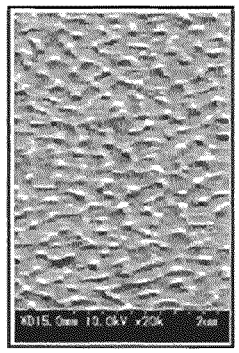 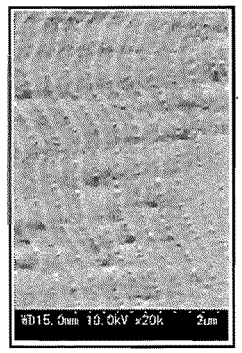
448 mJ/cm²
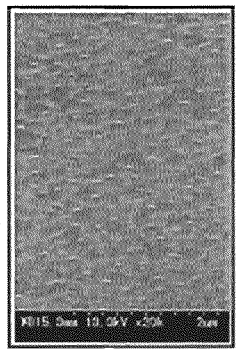 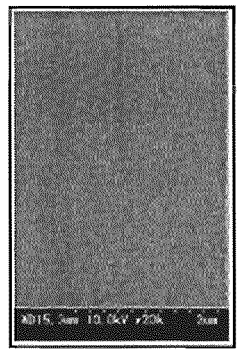
495 mJ/cm²
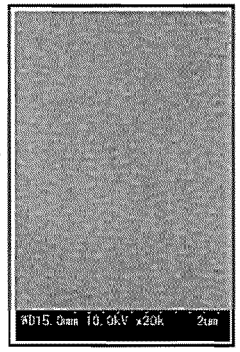 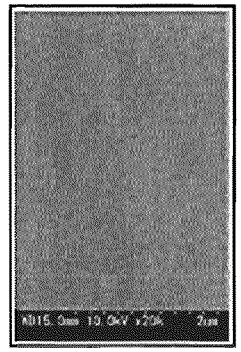
590 mJ/cm²
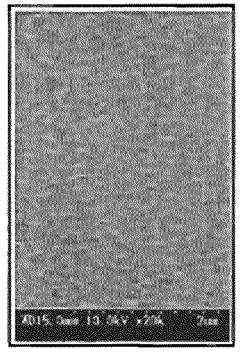 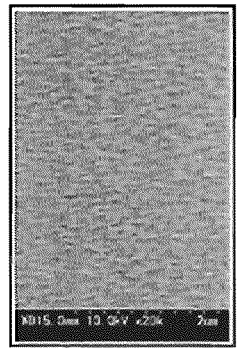
680 mJ/cm²

(A) Before laser irradiation (B) Under air, 495 mJ/cm$^2$ (C) Under nitrogen, 404 mJ/cm$^2$ (D) Under nitrogen, 495 mJ/cm$^2$ (E) Under nitrogen, 590 mJ/cm$^2$ (A) Before laser irradiation (B) Under air, 495 mJ/cm$^2$ (C) Under nitrogen, 404 mJ/cm$^2$ (D) Under nitrogen, 495 mJ/cm$^2$ (E) Under nitrogen, 590 mJ/cm$^2$ FIG. 34A (A) Before laser irradiation
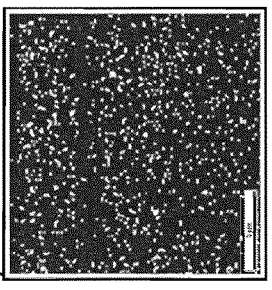
FIG. 34B (B) Under air
FIG. 34C (C) Under nitrogen
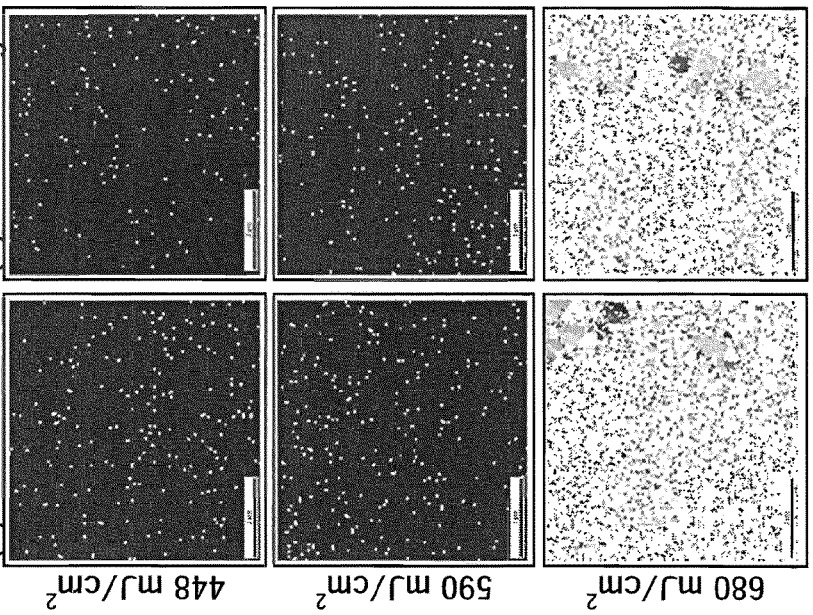
448 mJ/cm²
590 mJ/cm²
680 mJ/cm²
FIG. 34D
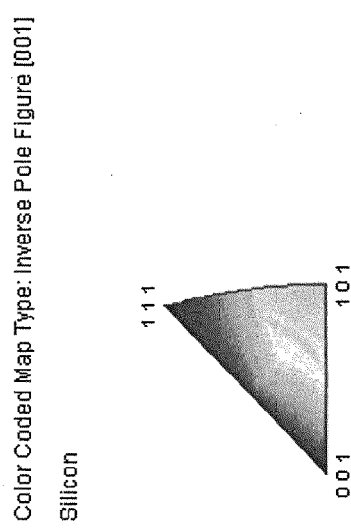

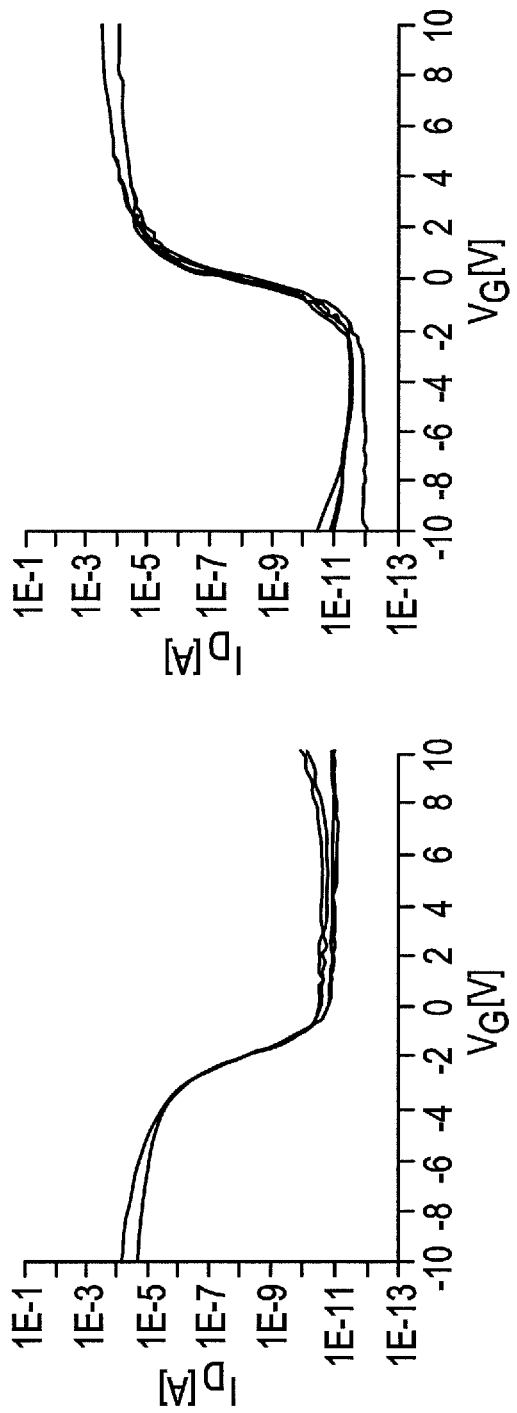

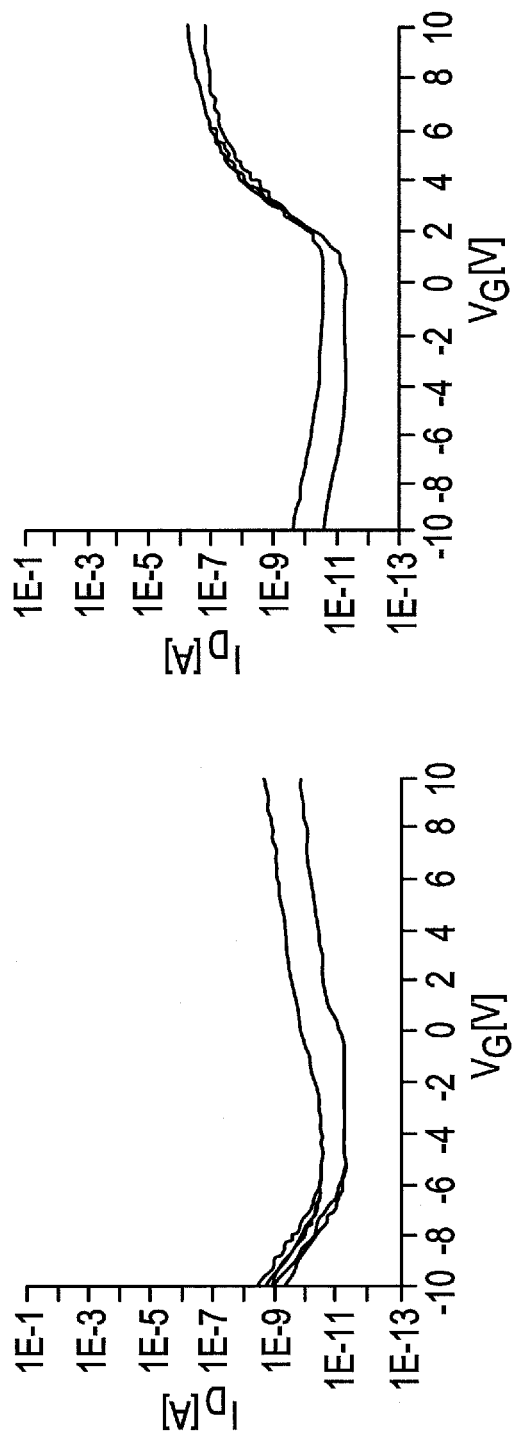

A process with the laser irradiation (under air) and the thinning

A process with the laser irradiation (under nitrogen) and the thinning

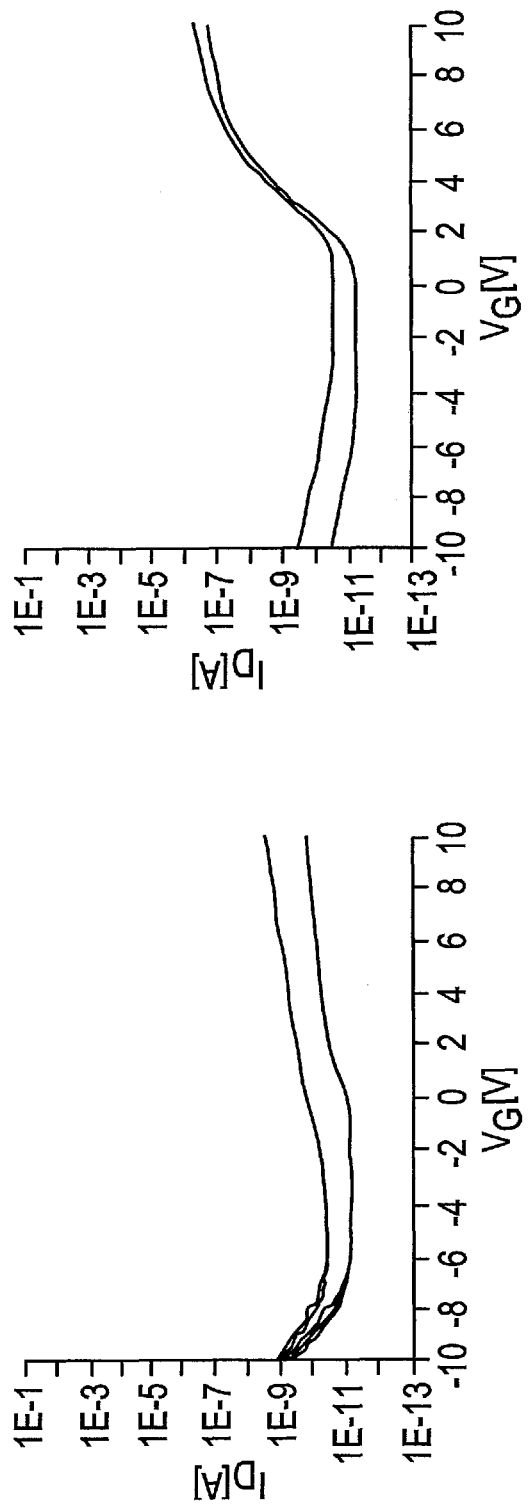

FIG. 45

| Acceleration voltage | Ratio of hydrogen element (H) (X : Y) | Ratio of hydrogen ion species (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

Before laser irradiation max = 39.560
39.560
18.959
9.086
4.354
2.087
1.000
0.479
min = -4.449

Under Nitrogen

Under Nitrogen

Before laser irradiation max = 39.560
39.560
18.959
9.086
4.354
2.087
1.000
0.479
min = -4.449

Under Nitrogen

Under Nitrogen

MANUFACTURING METHOD OF SOI SUBSTRATE AND MANUFACTURING METHOD OF SEMICONDUCTOR DEVICE

BACKGROUND OF THE INVENTION

1. Field of the Invention

The present invention relates to a manufacturing method of an SOI (silicon on insulator) substrate including a semiconductor layer formed of a semiconductor material such as silicon.

Note that semiconductor devices in this specification refer to general devices which can function by utilization of semiconductor characteristics, and electro-optical devices, semiconductor circuits, and electronic appliances are all semiconductor devices.

2. Description of the Related Art

Instead of a bulk silicon wafer, integrated circuits using an SOI (silicon on insulator) substrate in which a thin single-crystalline silicon layer is formed on an insulating layer have been developed. By utilizing characteristics of the thin single-crystalline silicon layer, transistors formed in the integrated circuit can be electrically separated from each other completely. Further, since the fully depleted transistors can be formed, a semiconductor integrated circuit with high added value such as high integration, high speed driving, and low power consumption can be realized.

As a manufacturing method of an SOI substrate, a hydrogen ion implantation separation method in which hydrogen ion implantation and separation are combined is known. In the hydrogen ion implantation separation method, an SOI substrate is manufactured mainly in the following process. Hydrogen ions are implanted into a silicon wafer to form an ion implantation layer including microbubbles at a predetermined depth from the surface. A silicon oxide film is formed by oxidizing another silicon wafer which serves as a base substrate. The silicon wafer into which the hydrogen ions are implanted is bonded to the silicon oxide film of the other silicon wafer, so that the two silicon wafers are bonded. Heat treatment is conducted to separate the wafers at the ion implantation layer. Heat treatment is further conducted to improve bonding force of the silicon layer which is bonded to the base substrate.

A method for manufacturing an SOI substrate by bonding a silicon layer which is separated by the hydrogen ion implantation separation method to a glass substrate is known (Patent Document 1: Japanese Published Patent Application No. H11-097379 and Patent Document 2: Japanese Published Patent Application No. 2005-252244). In Patent Document 1, a separation plane of the silicon layer, which is exposed after the separation, is mechanically polished in order to remove a defective layer formed by ion implantation and steps of several nm to several tens of nm at the separation plane. In Patent Document 2, a Si thin film bonded to a glass substrate is irradiated with laser light to be recrystallized, so that crystal quality of the Si thin film is improved.

SUMMARY OF THE INVENTION

A glass substrate is an inexpensive substrate and can be prepared with larger area than a silicon wafer. Thus, the glass substrate is mainly used for manufacturing a liquid crystal display device. By using a glass substrate as a base substrate, an inexpensive and large-area SOI substrate can be manufactured. However, the strain point of the glass substrate is equal to or lower than 700° C., and thus the glass substrate has low heat resistance. Therefore, an SOT substrate after bonding a single-crystalline silicon layer cannot be heated at a temperature which exceeds a heat resistance temperature of the glass substrate, and the process temperature in manufacturing an SOI substrate is limited to be equal to or lower than 700° C.

Accordingly, the method to remove crystal defects and projections and depressions at a separation plane, which is shown in Patent Document 1, is limited within the process temperature. In addition, there is also a process temperature limit in manufacturing a transistor using a single-crystalline silicon layer bonded to a glass substrate. Further, since the substrate is large, the apparatus and the processing method which can be used are naturally limited.

To realize high speed operation and miniaturization of a transistor, thinning of a gate insulating layer is required. Therefore, as described in Patent Document 1, it is important to remove projections and depressions at a separation plane of a single-crystalline silicon layer. However, it is difficult to remove the projections and depressions of the single-crystalline silicon layer which is bonded to a large-sized glass substrate by mechanical polishing with high throughput because the glass substrate and the silicon wafer have different shapes and sizes, and so on.

In order to form a thin gate insulating layer with favorable step coverage on a surface of a silicon layer which is bonded to a glass substrate, the silicon layer is preferably as thin as 50 nm or less. However, since the mass of a hydrogen element is small, it is difficult to introduce hydrogen ions at a depth equal to or less than 50 nm, and in addition, it is difficult to separate a silicon layer having a thickness of equal to or less than 50 nm from a silicon wafer. In particular, in the case where hydrogen ions are introduced by an ion doping apparatus with which ions of a source gas are introduced without mass separation, it is very difficult to evenly introduce hydrogen ions to a depth of equal to or less than 100 nm.

The silicon layer is recrystallized by laser light irradiation in Patent Document 2. However, since the optimal energy range of the laser light for recrystallization of the silicon layer having a thickness of equal to or less than 50 nm is narrow, it is difficult to uniformly recrystallize the silicon layer with laser light.

In other words, when a transistor is manufactured using an SOI substrate in which a silicon layer is bonded to a glass substrate by a conventional technique, it is difficult to sufficiently obtain characteristics which can be realized with an SOI substrate. In consideration of these problems, it is an object of the present invention to provide a manufacturing method of an SOI substrate with which a semiconductor device with high performance can be manufactured, even in the case of using a substrate having low heat resistance such as a glass substrate as a base substrate. Further, it is another object of the present invention to provide a manufacturing method of an SOI substrate which enables manufacturing of a semiconductor device with high performance, even in the case of introducing ions by an ion doping apparatus.

One aspect of the present invention relates to a manufacturing method of an SOI substrate including a semiconductor layer separated from a semiconductor substrate and a base substrate to which the semiconductor layer is fixed.

In the present invention, a source gas which includes one or plural gasses selected from a hydrogen gas, a rare gas, a halogen gas, or a halogen compound gas is excited to produce ion species, and the ion species are introduced into a semiconductor substrate to form an ion introduction layer in a region at a predetermined depth from the surface of the semiconductor substrate.

A bonding layer for bonding a base substrate and a semiconductor substrate is formed on at least one side of the base substrate and the semiconductor substrate. In the case of forming a bonding layer on the side of the semiconductor substrate, the bonding layer may be formed after formation of an ion introduction layer, or the ion introduction layer can be formed after formation of the bonding layer.

The base substrate and the semiconductor substrate are made in close contact with each other with the bonding layer interposed therebetween so that a surface of the bonding layer and a surface which is in contact with the bonding layer are bonded; accordingly, the base substrate and the semiconductor substrate are bonded. Next, a crack is generated at the ion introduction layer by heating the semiconductor substrate, and the semiconductor substrate is separated from the base substrate, so that the base substrate to which a semiconductor layer separated from the semiconductor substrate is fixed is formed.

Then, the semiconductor layer is irradiated with laser light to be melted. This process improves planarity of a separation plane of the semiconductor layer and reduces crystal defects of the semiconductor layer. After laser light irradiation, the semiconductor layer is thinned. The thickness of the semiconductor layer is preferably equal to or less than 100 nm and more preferably equal to or less than 50 nm.

Improvement in planarity of a semiconductor layer surface by laser light irradiation means that the mean surface roughness of the semiconductor layer surface is reduced to 3 nm or less, and more preferably to 2.5 nm or less. Alternatively, the improvement in planarity of a semiconductor layer surface means that the root mean square of surface roughness of the semiconductor layer surface is reduced to 3.5 nm or less, and more preferably to 2.5 nm or less.

By thinning a semiconductor layer after laser light irradiation, an SOI substrate which includes a thin semiconductor layer with high surface planarity and in which a substrate having low heat resistance such as a glass substrate is used as a base substrate, can be manufactured. Even when an ion doping apparatus for which a mass separation function is not provided is used in forming an ion introduction layer, an SOI substrate including a thin semiconductor layer with high surface planarity can be manufactured. Accordingly, by using an SOI substrate of the present invention, a semiconductor device with high added value such as high integration, high speed driving, and low power consumption can be manufactured.

BRIEF DESCRIPTION OF THE DRAWINGS

In the accompanying drawings:

FIGS. 3A to 3G are cross-sectional views of a manufacturing method of an SOI substrate;

FIGS. 15A to 15I are cross-sectional views of a manufacturing method of an SOI substrate;

FIGS. 19A to 19C are images of silicon layers observed with a scanning electron microscope (SEM);

FIGS. 24A to 24C are inverse pole figure (IPF) maps of silicon layers, which are obtained from measurement data of the electron back scatter diffraction pattern (EBSP), and FIG. 24D is a color code map showing the relationship between colors of the IPF maps and crystal orientation;

FIGS. 25A to 25I are cross-sectional views of a manufacturing method of an SOI substrate;

FIGS. 29A to 29C are images of silicon layers observed with a SEM;

FIGS. 34A to 34C are IPF maps of silicon layers, which are obtained from measurement data of the EBSP, and FIG. 34D is a color coded map showing the relationship between colors of the IPF maps and crystal orientation;

FIGS. 36A to 36C are graphs of drain current-gate voltage characteristics of transistors;

FIGS. 37A to 37C are graphs of drain current-voltage characteristics of transistors;

FIG. 45 is a table of fitting parameters of the fitting function shown in FIGS. 42 to 44 (hydrogen atom ratios and hydrogen ion species ratios);

DETAILED DESCRIPTION OF THE INVENTION

Figure 1B:
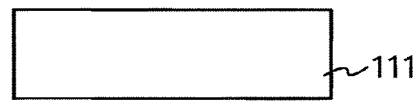
FIGS. 1A to 1G are cross-sectional views of a manufacturing method of an SOI substrate.

The present invention will be described below. It is easily understood by those skilled in the art that various changes may be made in forms and details without departing from the spirit and the scope of the invention. Therefore, the present invention should not be interpreted as being limited to the descriptions of the embodiment modes and embodiments below. The components denoted by the same reference numerals throughout different drawings are the same components, and repeated description of materials, shapes, manufacturing methods, and the like is omitted.

(Embodiment Mode 1)

FIGS. 1A to 2C are cross-sectional views showing an example of a manufacturing method of an SOI substrate. With reference to FIGS. 1A to 2C, an example of a manufacturing method of an SOI substrate is described.

Figure 1C:
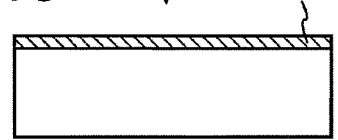
Figure 1A:
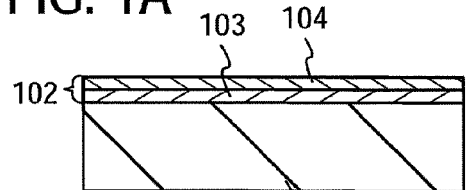

As shown in FIG. 1A, a base substrate of an SOI substrate 101 is prepared. As the base substrate 101, a light-transmitting glass substrate used for the products of electronics industry such as a liquid crystal display device can be used. It is preferable to use a glass substrate having a coefficient of thermal expansion of equal to or higher than $25 \times 10^{-7}/°$ C. and equal to or lower than $50 \times 10^{-7}/°$ C. (preferably, equal to or higher than $30 \times 10^{-7}/°$ C. and equal to or lower than $40 \times 10^{-7}/°$ C.) and a strain point equal to or higher than 580° C. and equal to or lower than 680° C. (preferably, equal to or higher than 600° C. and equal to or lower than 680° C.) in terms of heat resistance, cost, and the like. Further, a non-alkali glass substrate is preferable as the glass substrate. As a material of the non-alkali glass substrate, a glass material such as aluminosilicate glass, aluminoborosilicate glass, or barium borosilicate glass is used, for example.

As the base substrate 101, as well as the glass substrate, an insulating substrate which is formed of an insulating material, such as a ceramic substrate, a quartz substrate, or a sapphire substrate; a conductive substrate which is formed of a conductive material such as metal or stainless steel; a semiconductor substrate which is formed of a semiconductor such as silicon or gallium arsenide; or the like can be used.

Next, the base substrate 101 is washed, and an insulating layer 102 having a thickness equal to or greater than 10 nm and equal to or less than 400 nm is formed thereover. The insulating layer 102 can have a single-layer structure or a multilayer structure of two or more layers. In this embodiment mode, the insulating layer 102 functions as a bonding layer.

As a film which forms the insulating layer 102, an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride film; or an insulating film including a metal nitride oxide such as an aluminum nitride oxide film can also be used.

Note that in this specification, an oxynitride is a substance that contains more oxygen than nitrogen, and a nitride oxide is a substance that contains more nitrogen than oxygen. For example, silicon oxynitride includes oxygen in the range of equal to or higher than 55 at. % and equal to or lower than 65 at. %, nitrogen in the range of equal to or higher than 1 at. % and equal to or lower than 20 at. %, Si in the range of equal to or higher than 25 at. % and equal to or lower than 35 at. %, and hydrogen in the range of equal to or higher than 0.1 at. % and equal to or lower than 10 at. %. Further, silicon nitride oxide includes, for example, oxygen in the range of equal to or higher than 15 at. % and equal to or lower than 30 at. %, nitrogen in the range of equal to or higher than 20 at. % and equal to or lower than 35 at. %, Si in the range of equal to or higher than 25 at. % and equal to or lower than 35 at. %, and hydrogen in the range of equal to or higher than 15 at. % and equal to or lower than 25 at. %.

In the case of using a substrate including an impurity which reduces reliability of a semiconductor device such as an alkali metal or an alkaline earth metal as the base substrate 101, at least one layer of film which can prevent such an impurity from diffusing from the base substrate 101 into a semiconductor layer of an SOI substrate is preferably provided. As such a film, a silicon nitride film, a silicon nitride oxide film, an aluminum nitride film, an aluminum nitride oxide film, or the like can be given. When such a film is included, the insulating layer 102 can serve as a barrier layer.

For example, in the case of forming the insulating layer 102 as a barrier layer with a single-layer structure, a silicon nitride film, a silicon nitride oxide film, an aluminum nitride film, or an aluminum nitride oxide film having a thickness equal to or greater than 10 nm and equal to or less than 200 nm can be formed.

In the case where the insulating layer 102 serves as a barrier layer and has a two-layer structure, the following films having a two-layer structure can be given, for example: stacked films of a silicon nitride film and a silicon oxide film, stacked films of a silicon nitride film and a silicon oxynitride film, stacked films of a silicon nitride oxide film and a silicon oxide film, and stacked films of a silicon nitride oxide film and a silicon oxynitride film. Note that in each combination of the above-described films having a two-layer structure, the film mentioned first is formed over the base substrate 101. In the insulating layer 102 having a two-layer structure, a film which relaxes stress is preferably selected as an upper layer so that internal stress of a lower layer having a high blocking effect does not affect a semiconductor layer. The thickness of the upper layer can be equal to or greater than 10 nm and equal to or less than 200 nm, and the thickness of the lower layer can be equal to or greater than 10 nm and equal to or less than 200 nm.

In this embodiment mode, the insulating layer 102 has a two-layer structure, in which the lower layer is a silicon nitride oxide film 103 formed by a plasma CVD method using $SiH_4$ and $NH_3$ as a process gas, and the upper layer is a silicon oxynitride film 104 formed by a plasma CVD method using $SiH_4$ and $N_2O$ as a process gas.

As shown in FIG. 1B, a semiconductor substrate 111 is prepared. An SOI substrate is manufactured by bonding a semiconductor layer which is a thin slice of the semiconductor substrate 111 to the base substrate 101. As the semiconductor substrate 111, a single-crystalline semiconductor substrate is preferable. A polycrystalline semiconductor substrate can also be used. As the semiconductor substrate 111, a semiconductor substrate including an element in Group 4 such as silicon, germanium, silicon-germanium, or silicon carbonate can be used. In addition, a semiconductor substrate including a compound semiconductor such as gallium arsenide or indium phosphide can also be used as the semiconductor substrate 111.

The semiconductor substrate is washed to be clean. Then, as shown in FIG. 1C, a protective film 112 is formed on a surface of the semiconductor substrate 111. The protective film 112 is formed for the purpose of preventing the semiconductor substrate 111 from being contaminated by an impurity such as a metal and from being damaged by shock of applied ions in an ion introduction step for forming an ion introduction layer. This protective film 112 can be formed by a CVD method or the like by depositing an insulating material such as a silicon oxide film, a silicon nitride film, a silicon nitride oxide film, or a silicon oxynitride film. Alternatively, by oxidizing or nitriding the semiconductor substrate 111, the protective film 112 can be formed.

Figure 1D:
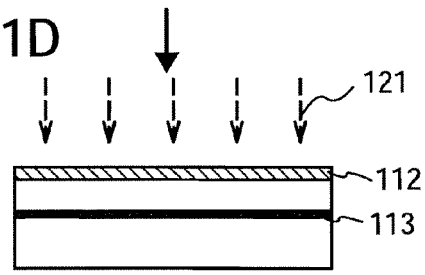

As shown in FIG. 1D, an ion beam 121 including ions accelerated by electric field is applied to the semiconductor substrate 111 through the protective film 112, so that an ion introduction layer 113 is formed in a region at a predetermined depth from the surface of the semiconductor substrate 111. In other words, when the semiconductor substrate 111 is irradiated with the ion beam 121, a weakened layer whose crystal structure becomes brittle by shock of accelerated ion species is formed at a predetermined depth in the semiconductor substrate. This layer is the ion introduction layer 113. The depth of the region where the ion introduction layer 113 is formed can be controlled by the acceleration energy of the ion beam 121 and the introduction angle of the ion beam 121. The ion introduction layer 113 is formed in a region at a depth almost equal to the average depth of introduced ions. Therefore, the ion introduction layer 113 is formed by adding an element included in the ion species of the ion beam 121 to the semiconductor substrate 111.

The depth to which ions are introduced determines the depth of the ion introduction layer 113 and accordingly determines the thickness of a semiconductor layer which is separated from the semiconductor substrate 111. The depth of the ion introduction layer 113 is equal to or greater than 50 nm and equal to or less than 500 nm, and preferably equal to or greater than 50 nm and equal to or less than 200 nm. In consideration of the average depth of introduced ions, the accelerating voltage, the introduction angle, and the like of the ion beam 121 are adjusted.

In order to introduce ions into the semiconductor substrate 111, an ion implantation apparatus or an ion doping apparatus can be used. In an ion implantation apparatus, a source gas is excited to produce ion species, the produced ion species are mass-separated, the ion beam 121 including an ion species having a predetermined mass is generated, and this ion beam 121 is applied to a process object. In an ion doping apparatus, a source gas is excited to produce ion species, without mass separation of the produced ion species, the ion beam 121 including all of the produced ion species is generated, and the ion beam 121 is applied to a process object. Note that in an ion doping apparatus provided with a mass separator, ion implantation with mass separation can be conducted similarly to the ion implantation apparatus.

For example, an ion implantation step in the case of using an ion doping apparatus can be performed under the following conditions.

Accelerating voltage 10 kV or higher and 100 kV or lower (preferably, 30 kV or higher and 80 kV or lower)
Dose $1\times10^{16}/cm^2$ or higher and $4\times10^{16}/cm^2$ or lower
Beam current density 2 $\mu A/cm^2$ or higher (preferably, 5 $\mu A/cm^2$ or higher, more preferably, 10 $\mu A/cm^2$ or higher)

As a source gas in the ion introduction step, a hydrogen gas can be used. The hydrogen gas ($H_2$ gas) is excited so that $H^+$, $H_2^+$, and $H_3^+$ can be produced. In the case of using a hydrogen gas as a source gas, it is preferable that $H_3^+$ ions be the largest number of ions introduced to the semiconductor substrate 111. By adding $H_3^+$ ions to the semiconductor substrate 111 as hydrogen, the ion introduction efficiency is improved compared to the case of introducing $H^+$ or $H_2^+$; accordingly, ion introduction time can be shortened and a crack can be generated easily in the ion introduction layer 113. In addition, the average depth of introduced ions can be smaller in the case of using $H_3^+$ than the case of using $H^+$ or $H_2^+$, and thus, the ion introduction layer 113 can be formed in a shallower region. In order to form the ion introduction layer 113 in a shallow region, the accelerating voltage of ions needs to be low. When the proportion of $H_3^+$ ions in plasma generated by excitation of a hydrogen gas is high, atomic hydrogen (H) can be efficiently added to the semiconductor substrate 111. This is because an $H_3^+$ ion has three times as large mass as an $H^+$ ion, and in the case of adding hydrogen atoms to the same depth, the accelerating voltage of the $H_3^+$ ion can be three times as high as that of the $H^+$ ion. If the accelerating voltage of ions is increased, tact time in an ion irradiation step can be shortened, and productivity and throughput can be improved. Therefore, when the proportion of $H_3^+$ ions included in the ion beam 121 is increased, variation in the average depth of introduced ions is decreased; accordingly, in the semiconductor substrate 111, the concentration profile in the hydrogen depth direction becomes narrower and the peak position of the profile can be shifted to a shallow region.

In the case of using an ion implantation apparatus, it is preferable to conduct mass separation to implant $H_3^+$ ions. Of course, $H_2^+$ ions may be implanted.

In the case of using the ion doping apparatus, it is preferable that $H_3^+$ ions be included at 70% or more of the total amount of $H^+$, $H_2^+$, and $H_3^+$ in the ion beam 121. The proportion of $H_3^+$ ions are preferably 80% or more. With a high proportion of $H_3^+$ in this manner, the ion introduction layer 113 can contain hydrogen at a concentration of $1\times10^{20}$ atoms/$cm^3$ or higher by an ion doping apparatus. In order to facilitate the separation of a semiconductor layer from the semiconductor substrate 111, the ion introduction layer 113 preferably contains hydrogen at a concentration of $5 \times 10^{20}$ atoms/$cm^3$ or higher. When hydrogen is locally introduced to the semiconductor substrate 111 at a high concentration, a crystal structure is distorted, and micropores containing a gas are formed. In other words, the ion introduction layer 113 has a porous structure and is a brittle layer whose crystal structure is weaken. Therefore, the introduced gas is expanded by heat treatment, so that the volume of the micropores formed in the ion introduction layer 113 is changed; and thus, the semiconductor substrate 111 can be cleaved along the ion introduction layer 113.

As the source gas in the ion introduction step, other than the hydrogen gas, a deuterium gas can also be used. Alternatively, as the source gas in the ion introduction step, instead of a hydrogen gas, one or more kinds of gas selected from a rare gas such as helium or argon, a halogen gas typified by a fluorine gas or a chlorine gas, or a halogen compound gas such as a fluorine compound gas (e.g., $BF_3$) can be used. When helium is used for a source gas, the ion beam 121 with high proportion of He ions can be formed without mass separation. The ion beam 121 is applied to the semiconductor substrate 111, whereby micropores can be formed in the ion introduction layer 113 efficiently.

Further, the ion introduction layer 113 can also be formed by performing the ion introduction step plural times. In this case, the same source gas may be used in all ion introduction steps or a different source gas may be used for each ion introduction step. For example, ion introduction is performed first using a rare gas as a source gas. Next, ion introduction is performed using a hydrogen gas as a source gas. Alternatively, ion introduction can be performed using a halogen gas or a halogen compound gas, and next, ion introduction can be performed using a hydrogen gas.

Figure 1E:
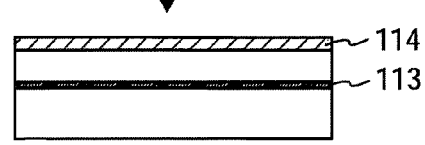

After the ion introduction layer 113 is formed, the protective film 112 is removed by etching. Next, a bonding layer 114 is formed on the surface of the semiconductor substrate 111 as shown in FIG. 1E. Without removal of the protective film 112, the bonding layer 114 can be formed on the protective film 112 as well. FIG. 1E is a cross-sectional view of a formation step of the bonding layer.

The bonding layer 114 is a layer for forming a smooth and hydrophilic bonding plane on the semiconductor substrate 111. Such a bonding layer 114 is preferably an insulating film formed by chemical reaction, and a silicon oxide film is preferable. The thickness of the bonding layer 114 can be equal to or greater than 10 nm and equal to or less than 200 nm. The preferable thickness is equal to or greater than 10 nm and equal to or less than 100 nm, and the more preferable thickness is equal to or greater than 20 nm and equal to or less than 50 nm.

In a step of forming the bonding layer 114, the heat temperature of the semiconductor substrate 111 is set at a temperature at which an element or molecule introduced into the ion introduction layer 113 is not released, and the heat temperature is preferably 350° C. or lower. In other words, the heat temperature is set at a temperature at which degassing from the ion introduction layer 113 does not occur. That is, the heat treatment temperature for separating a semiconductor layer 115 from the semiconductor substrate 111 is set to be higher than the film formation temperature of the bonding layer 114.

A silicon oxide film can be formed as the bonding layer 114. When the silicon oxide film is formed by a plasma CVD method, an organic silane gas is preferably used as a silicon source gas. An oxygen ($O_2$) gas can be used as an oxygen source gas. As an organic silane gas, the following can be employed, such as ethyl silicate (tetraethoxysilane, abbrev.: TEOS, chemical formula: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$). As the silicon source gas, silane ($SiH_4$), disilane ($Si_2H_6$), or the like can also be used.

The silicon oxide film to be the bonding layer 114 can be formed by a thermal CVD method using a low temperature oxide (LTO) which is formed at a heat temperature of equal to or lower than 500° C. and equal to or higher than 200° C. In this case, silane ($SiH_4$), disilane ($Si_2H_6$), or the like can be used as the silicon source gas, and oxygen ($O_2$), dinitrogen monoxide ($N_2O$), or the like can be used as the oxygen source gas.

Figure 1F:
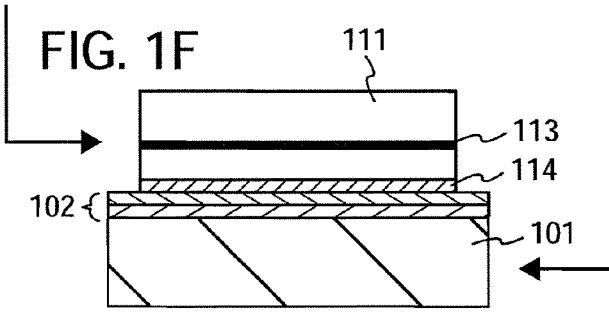

FIG. 1F is a cross-sectional view of a bonding step, which shows a state in which the base substrate 101 and the semiconductor substrate 111 are bonded. For performing the bonding step, first, the base substrate 101 on which the insulating layer 102 is formed and the semiconductor substrate 111 on which the bonding layer 114 is formed are washed by a method such as ultrasonic cleaning. Then, the bonding layer 114 and the insulating layer 102 are made in close contact with each other; accordingly, van der Waals force works on an interface between the insulating layer 102 and the bonding layer 114 and a hydrogen bond is formed at the interface. Then, a covalent bond is formed at the interface, and the bonding layer 114 and the insulating layer 102 are bonded. When a silicon oxide film formed by a CVD method using organic silane, a silicon oxide film formed by a thermal CVD method, or the like is used for the bonding layer 114, the insulating layer 102 and the bonding layer 114 can be bonded at normal temperature without heating. Therefore, it is possible to use a substrate having low heat resistance such as a glass substrate for the base substrate 101.

In this embodiment mode, formation of the insulating layer 102 on the base substrate 101 can be omitted. In such a case, the bonding layer 114 is bonded to the base substrate 101. In the case where the base substrate 101 is a glass substrate, the glass substrate and the bonding layer 114 can be bonded at room temperature by forming the bonding layer 114 with the use of a silicon oxide film formed by a CVD method using organic silane, an LTO film formed by a thermal CVD method, or a silicon oxide film formed using siloxane as a source material. Without formation of the bonding layer 114 on the semiconductor substrate 111, the semiconductor substrate 111 and the glass substrate can be bonded at room temperature.

In order to form a stronger bond between the insulating layer 102 and the bonding layer 114, a method can be performed, for example, in which the surface of the insulating layer 102 is subjected to oxygen plasma treatment or ozone treatment to have a hydrophilic property. By this treatment, a hydroxyl group is formed on the surface of the insulating layer 102. Therefore, the hydroxyl group on the surface of the insulating layer 102 acts to form a hydrogen bond at the bonding interface between the insulating layer 102 and the bonding layer 114. In the case where the insulating layer 102 is not formed, treatment for providing the surface of the base substrate 101 a hydrophilic property may be performed.

After the first substrate 101 and the semiconductor substrate 111 are made in close contact with each other, heat treatment or pressure treatment is preferably performed. The bonding force between the insulating layer 102 and the bonding layer 114 can be improved by performing heat treatment or pressure treatment. The temperature of heat treatment is preferably equal to or lower than an allowable temperature limit of the base substrate 101, and the heat temperature can be equal to or higher than 400° C. and equal to or lower than 700° C. The upper limit of the heat temperature is set so as not to exceed a strain point of the base substrate 101. Pressure treatment is performed so that force is applied in a direction perpendicular to the bonding interface, and the pressure to be applied is determined in consideration of strength of the base substrate 101 and the semiconductor substrate 111.

Figure 1G:
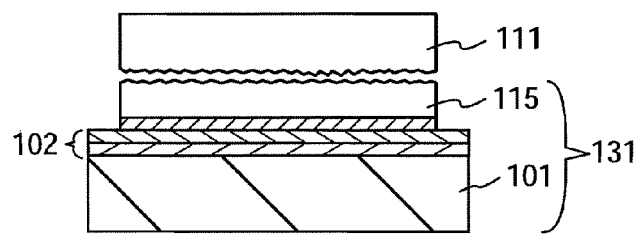

FIG. 1G shows a separation step of separating the semiconductor layer 115 from the semiconductor substrate 111, where reference numeral 111' shows the semiconductor substrate 111 from which the semiconductor layer 115 is separated. In order to separate the semiconductor layer 115, after the base substrate 101 and the semiconductor substrate 111 are bonded, heat treatment of the semiconductor substrate 111 is performed. The heat temperature of the semiconductor substrate 111 can be equal to or higher than 400° C. and equal to or lower than 700° C. The heat temperature of the semiconductor substrate 111 is preferably equal to or higher than the temperature of the semiconductor substrate 111 in forming the bonding layer 114, and the upper limit of the heat temperature is set so as not to exceed the strain point of the base substrate 101.

By heat treatment in the temperature range of equal to or higher than 400° C. and equal to or lower than 700° C., the volume of the micropores formed in the ion introduction layer 113 is changed, and a crack is generated in the ion introduction layer 113. As a result, the semiconductor substrate 111 is cleaved along the ion introduction layer 113. In other words, the semiconductor substrate 111 is separated at the ion introduction layer 113. Since the bonding layer 114 is bonded to the base substrate 101, the semiconductor layer 115 separated from the semiconductor substrate 111 is fixed to the base substrate 101. In addition, the bonding interface between the insulating layer 102 and the bonding layer 114 is heated by this heat treatment; accordingly, bonding force at this bonding interface can be improved.

By a separation step shown in FIG. 1G, an SOI substrate 131 in which the semiconductor layer 115 is provided over the base substrate 101 is manufactured. The SOI substrate 131 is a substrate with a multilayer structure, in which the insulating layer 102, the bonding layer 114, and the semiconductor layer 115 are stacked in this order over the base substrate 101, and is also a substrate in which the insulating layer 102 and the bonding layer 114 are bonded. In the case where the insulating layer 102 is not formed, the SOI substrate 131 is a substrate in which the bonding layer 114 and the base substrate 101 are bonded.

After forming the SOI substrate 131, heat treatment can be further performed to the SOI substrate 131 at a temperature equal to or higher than 400° C. and equal to or lower than 700° C. By this heat treatment, bonding force between the bonding layer 114 and the insulating layer 102 in the SOI substrate 131 can be improved. The upper limit of the heat temperature is set so as not to exceed the strain point of the base substrate 101.

By the separation step and the ion introduction step, the semiconductor layer 115 of the SOI substrate 131 has a crystal defect and a surface whose planarity is damaged and where projections and depressions are formed. It is difficult to form a thin gate insulating layer having high withstand voltage on such a surface having projections and depressions of the semiconductor layer 115. Therefore, in this embodiment mode, planarization treatment is performed to the semiconductor layer 115. When the semiconductor layer 115 has a crystal defect, performance and reliability of the transistor are affected, e.g., increase in a level density at a localized interface between the semiconductor layer 115B and the gate insulating layer. Therefore, together with the planarization, treatment for decreasing crystal defects of the semiconductor layer 115 is performed.

Figure 2A:
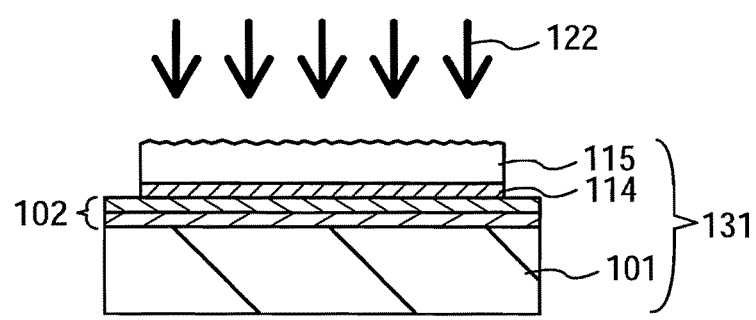
FIGS. 2A to 2C are cross-sectional views of a manufacturing method of an SOI substrate and show steps which follow FIG. 1G.
Figure 2B:
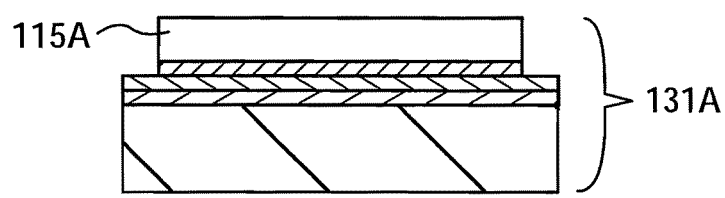

Planarization and decrease in crystal defects of the semiconductor layer 115 are realized by laser light irradiation of the semiconductor layer 115 as shown in FIG. 2A. By irradiation with laser light 122 from the semiconductor layer 115 side, the semiconductor layer 115 is melted from the upper surface. After melting, the semiconductor layer 115 is cooled and solidified, so that planarity of the upper surface thereof can be improved as shown in FIG. 2B. Since the laser light 122 is used in the planarization treatment, increase in temperature of the base substrate 101 can be suppressed, so that a substrate having low heat resistance such as a glass substrate can be used as the base substrate 101.

It is preferable that the semiconductor layer 115 be partially melted by irradiation with the laser light 122. If the semiconductor layer 115 is completely melted, there is a high possibility that the recrystallization of the semiconductor layer 115 is accompanied with disordered nucleation of the semiconductor layer 115 in a liquid phase and crystallinity of a semiconductor layer 115A is lowered. By partial melting, so-called longitudinal growth in which crystal growth proceeds from a solid portion which is not melted occurs in the semiconductor layer 115. Due to recrystallization by the longitudinal growth, crystal defects of the semiconductor layer 115 are decreased and crystallinity thereof is recovered. Note that the state where the semiconductor layer 115 is completely melted indicates, in the case of the stack structure of FIG. 2A, that the portion from the top surface of the semiconductor layer 115 to the interface with the bonding layer 114 is melted and is in a liquid phase. On the other hand, the state where the semiconductor layer 115 is partially melted indicates that the upper layer thereof is melted and is in a liquid phase and a lower layer thereof is in a solid phase.

A laser emitting the laser light can be a continuous wave laser, a pseudo continuous wave laser, or a pulsed laser. A pulsed laser is preferable for partial melting. The lasers which can be used in the step of FIG. 2A include, for example, a gas laser such as an excimer laser like a KrF laser, an Ar laser, or a Kr laser; and a solid laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, or a $Y_2O_3$ laser. An excimer laser is a pulsed laser, and some solid lasers such as a YAG laser can be used as a continuous laser, a pseudo continuous laser, and a pulsed laser.

The laser light 122 is set to have a wavelength that allows the absorption of the laser light 122 by the semiconductor layer 115 (the semiconductor substrate 111). The wavelength can be determined in consideration of the skin depth of the laser light and the like. For example, the wavelength can be in the range of equal to or higher than 250 nm and equal to or lower than 700 nm. In addition, the energy of the laser light 122 can be determined in consideration of the wavelength of the laser light 122, the skin depth of the laser light, the thickness of the semiconductor substrate 111, and the like. The energy of laser light 122 can be, for example, in the range of equal to or higher than 300 $mJ/cm^2$ and equal to or lower than 800 $mJ/cm^2$.

When the thickness of the semiconductor layer 115 is increased to greater than 50 nm by adjusting the depth of ions that are introduced in the ion introduction step of FIG. 1D, adjustment of the energy of the laser light 122 is readily carried out. Accordingly, by the irradiation with the laser light 122, improvement in planarity of the surface of the semiconductor layer 115 and in crystallinity of the semiconductor layer 115 can be achieved in high yield. Since the energy of the laser light 122 needs to be higher when the thickness of the semiconductor layer 115 is increased, the thickness of the semiconductor layer 115 is preferably equal to or lower than 200 nm.

Irradiation with the laser light 122 can be performed in an atmosphere containing oxygen such as an air atmosphere or an inert atmosphere such as a nitrogen atmosphere. In order to perform irradiation with the laser light 122 in an inert atmosphere, irradiation with the laser light 122 may be performed in an airtight chamber while the atmosphere in the chamber is controlled. In the case where the chamber is not used, by blowing an inert gas such as a nitrogen gas to the surface irradiated with the laser light 122, the inert atmosphere can be formed. Note that the inert atmosphere is an atmosphere which prevents the surface of the semiconductor layer 115 from being oxidized during the irradiation with the laser light 122.

According to research by the present inventors, the inert atmosphere such as nitrogen has higher effect of improving planarity of the semiconductor layer 115 than the air atmosphere. In addition, since the inert atmosphere has higher effect of suppressing generation of cracks and ridges than the air atmosphere, the applicable energy range for the laser light 122 is widened. As a gas for forming the inert atmosphere, a rare gas such as argon as well as the nitrogen gas can be used.

Figure 2C:
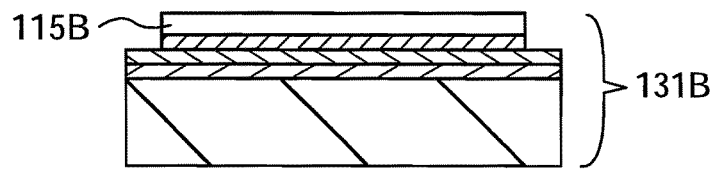

After forming an SOI substrate 131A including the semiconductor layer 115A as shown in FIG. 2B by irradiation with the laser light 122, a thinning step in which the semiconductor layer 115A is thinned is performed. FIG. 2C is a cross-sectional view of the thinning step.

In order to thin the semiconductor layer 115A, one of dry etching and wet etching or a combination of the both etchings may be performed. For example, in the case where the semiconductor substrate 111 is a silicon substrate, the semiconductor layer 115A can be thinned by dry etching treatment using $SF_6$ and $O_2$ as a process gas.

An SOI substrate 131B including a thin semiconductor layer 115B as shown in FIG. 2C can be manufactured by the etching treatment. Since the surface of the semiconductor layer 115A is planarized in advance by irradiation with the laser light 122, this thinning step can be performed by not etch back treatment but etching treatment. By this thinning step, the thickness of the semiconductor layer 115B is controlled preferably to be equal to or less than 100 nm and equal to or greater than 5 nm, and more preferably equal to or less than 50 nm and equal to or greater than 5 nm.

By using the steps of FIGS. 1A to 2C, the SOI substrate 131B in which the plural semiconductor layers 115B are bonded to one base substrate 101 can be manufactured. For example, the process described with reference to FIGS. 1B to 1E is repeated plural times, and plural semiconductor substrates 111 in each of which the ion introduction layer 113 and the bonding layer 114 are formed are prepared. Next, the bonding step of FIG. 1F is repeated plural times, and the plural semiconductor substrates 111 are fixed to the one base substrate 101. Then, the heating step of FIG. 1G is performed to separate the semiconductor substrates 111, so that the SOI substrates in which plural semiconductor layers 115 are fixed to the base substrate 101 is manufactured. Then, through the steps of FIGS. 2A to 2C, the SOI substrate 131B in which plural semiconductor layers 115B are bonded to the base substrate 101 can be manufactured.

As described above, in this embodiment mode, the planarization step of the semiconductor layer by irradiation with laser light and the subsequent thinning step of the semiconductor layer are combined, so that the semiconductor layer 115B whose thickness is equal to or less than 100 nm, whose planarity is improved, and whose crystal defects are decreased can be formed. That is, even when a glass substrate is employed as the base substrate 101 and an ion doping apparatus is used for formation of the ion introduction layer 113, the SOI substrate 131B in which the semiconductor layer 115B having the above-described characteristics is bonded can be manufactured.

Manufacturing a transistor with the SOI substrate 131B of this embodiment mode makes it possible to thin the gate insulating layer and reduce the level density at a localized interface between the semiconductor layer 115B and the gate insulating layer. In addition, by making the semiconductor layer 115B thin, a fully depleted transistor can be manufactured using the single-crystalline semiconductor layer over the glass substrate. Accordingly, a transistor having high performance and high reliability which can, for example, operate at high speed and have a low subthreshold value, high electron field-effect mobility, and low power consumption can be manufactured over a base substrate.

(Embodiment Mode 2)

FIGS. 3A to 4C are cross-sectional views showing an example of a manufacturing method of an SOI substrate. Hereinafter, the example of the manufacturing method of an SOI substrate is described with reference to FIGS. 3A to 4C.

As the above description with FIG. 1A, the base substrate 101 to be a base substrate of an SOI substrate is prepared. FIG. 3A is a cross-sectional view of the base substrate 101. As described with FIG. 1B, the semiconductor substrate 111 is prepared. FIG. 3B is a cross-sectional view of the semiconductor substrate 111.

The semiconductor substrate 111 is washed to be clean. Then, as shown in FIG. 3C, an insulating layer 116 is formed on an upper surface of the semiconductor substrate 111. The insulating layer 116 has a single-layer structure or a multi-layer structure of two or more layers. The thickness of the insulating layer 116 can be equal to or greater than 10 nm and equal to or less than 400 nm.

As a film which forms the insulating layer 116, an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride film; or an insulating film including a metal nitride oxide such as an aluminum nitride oxide film can also be used.

The insulating film included in the insulating layer 116 can be formed by a CVD method, a sputtering method, a method of oxidizing or nitriding the semiconductor substrate 111, or the like.

In the case of using a substrate containing an impurity which reduces reliability of a semiconductor device such as an alkali metal or an alkaline earth metal as the base substrate 101, at least one layer of film which can prevent such an impurity from diffusing from the base substrate 101 into a semiconductor layer of the SOI substrate is preferably provided. As such a film, a silicon nitride film, a silicon nitride oxide film, an aluminum nitride film, an aluminum nitride oxide film, or the like can be given. When such a film is included in the insulating layer 116, the insulating layer 116 can serve as a barrier layer.

For example, in the case of forming the insulating layer 116 as a barrier layer with a single-layer structure, a silicon nitride film, a silicon nitride oxide film, an aluminum nitride film, or an aluminum nitride oxide film having a thickness equal to or greater than 10 nm and equal to or less than 200 nm can be formed.

In the case where the insulating layer 116 is a film having a two-layer structure and serving as a barrier layer, for example, the following structure can be employed. As an upper layer, a layer having a high blocking effect is formed. On the other hand, as a lower layer which is formed in contact with the semiconductor substrate 111, a film which relaxes stress so that internal stress of the upper layer having a high blocking effect does not affect the semiconductor layer is preferably selected. The thickness of the upper layer can be equal to or greater than 10 nm and equal to or less than 200 nm, and the thickness of the lower layer can be equal to or greater than 10 nm and equal to or less than 200 nm.

In the case where the insulating layer 116 has a two-layer structure, the following structure can be given, for example: stacked films of a silicon oxide film and a silicon nitride film, stacked films of a silicon oxynitride film and a silicon nitride film, stacked films of a silicon oxide film and a silicon nitride oxide film, and stacked films of a silicon oxynitride film and a silicon nitride oxide film. Note that in each of the above-described two-layer structures, the film mentioned first is formed over the semiconductor substrate 111 side (as a lower layer).

In this embodiment mode, the insulating layer 116 has a two-layer structure, in which the lower layer is a silicon oxynitride film 117 formed by a plasma CVD method using $SiH_4$ and $N_2O$ as a process gas and the upper layer is a silicon nitride oxide film 118 formed by a plasma CVD method using $SiH_4$ and $NH_3$ as a process gas.

As shown in FIG. 3D, the ion beam 121 including ions accelerated by electric field is applied to the semiconductor substrate 111 through the insulating layer 116, so that an ion introduction layer 113 is formed in a region at a predetermined depth from the surface of the semiconductor substrate 111. This step can be performed similarly to the formation of the ion introduction layer 113 described with reference to FIG. 1D. By formation of the insulating layer 116, the semiconductor substrate 111 can be prevented from being contaminated by an impurity such as a metal and from being damaged by shock of application of the ions in an ion introduction step for forming the ion introduction layer 113.

After formation of the ion introduction layer 113, the bonding layer 114 is formed on an upper surface of the insulating layer 116 as shown in FIG. 3E.

Here, the bonding layer 114 is formed after the ion introduction step; however, the bonding layer 114 can be formed before the ion introduction step as well. In this case, after formation of the insulating layer 116 in FIG. 3C, the bonding layer 114 is formed on the insulating layer 116. In the step of FIG. 3D, the ion beam 121 is applied into the semiconductor substrate 111 through the bonding layer 114 and the insulating layer 116.

As Embodiment Mode 1, ion introduction can also be performed after formation of the protective film 112. In this case, after the steps of FIGS. 1B and 1C, the protective film 112 is removed, and the insulating layer 116 and the bonding layer 114 are formed on the semiconductor substrate 111.

FIG. 3F is a cross-sectional view of a bonding step, which shows a state in which the base substrate 101 and the semiconductor substrate 111 are bonded. For bonding the base substrate 101 and the semiconductor substrate 111 to each other, first, a surface of the base substrate 101 and a surface of the bonding layer 114, which form a bonding interface, are washed by a method such as ultrasonic cleaning. Then, a step similar to the bonding step described with reference to FIG. 1F is performed to make the base substrate 101 and the bonding layer 114 in close contact and thus, the base substrate 101 and the bonding layer 114 are bonded.

Before bonding the base substrate 101 and the bonding layer 114, the surface of the base substrate 101 can be subjected to oxygen plasma treatment or ozone treatment to provide a hydrophilic property to the surface of the base substrate 101. After bonding the base substrate 101 and the bonding layer 114, heat treatment or pressure treatment described in Embodiment Mode 1 can be performed to improve bonding force.

FIG. 3G shows a separation step where the semiconductor layer 115 is separated from the semiconductor substrate 111. The separation step of this embodiment mode can be performed similarly to the separation step described with reference to FIG. 1G. To separate the semiconductor layer 115, the semiconductor substrate 111 is heated at a temperature equal to or higher than 400° C. and equal to or lower than 700° C. after bonding the base substrate 101 and the bonding layer 114. This heat temperature is preferably equal to or higher than the temperature of the semiconductor substrate 111 in forming the bonding layer 114; however, the upper limit of the heat temperature is set so as not to exceed a strain point of the base substrate 101.

In the separation step shown in FIG. 3G an SOI substrate 132 in which the semiconductor layer 115 is provided over the base substrate 101 is manufactured. This SOI substrate 132 is a substrate with a multilayer structure, in which the bonding layer 114, the insulating layer 116, and the semiconductor layer 115 are stacked in this order over the base substrate 101, and is also a substrate in which the base substrate 101 and the bonding layer 114 are bonded.

Figure 4A:
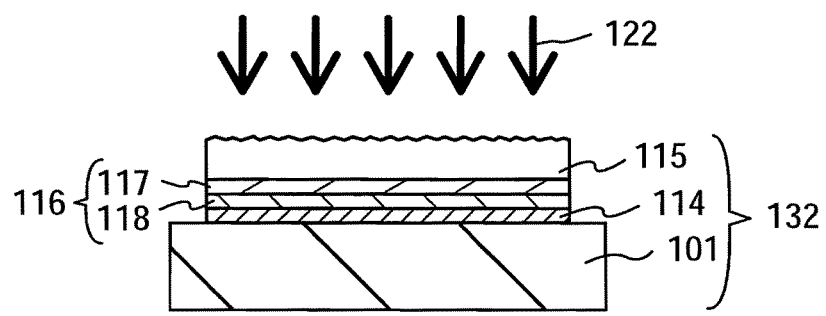
FIGS. 4A to 4C are cross-sectional views of a manufacturing method of an SOI substrate and show steps which follow FIG. 3G.
Figure 4B:
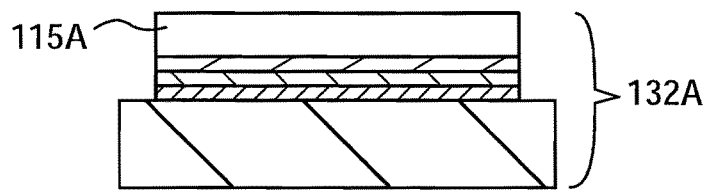

Further, in this embodiment mode as well, a planarization step in which the SOI substrate 132 is irradiated with the laser light 122 is performed as shown in FIG. 4A. This planarization step can be performed similarly to the irradiation step with the laser light 122 in FIG. 2A. As shown in FIG. 4A, irradiation with the laser light 122 is conducted from the semiconductor layer 115 side, and the semiconductor layer 115 is partially melted. Thus, the semiconductor layer 115A with improved planarity and decreased crystal defects is formed as shown in FIG. 4B.

Figure 4C:
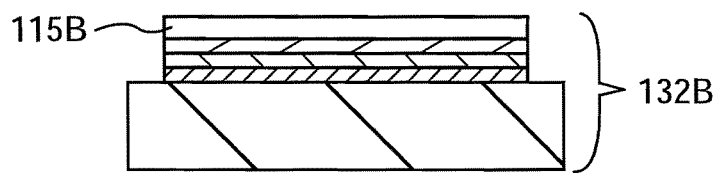

After formation of an SOI substrate 132A including the semiconductor layer 115A by irradiation with the laser light 122, a thinning step of the semiconductor layer in which the semiconductor layer 115A is thinned is performed. FIG. 4C is a cross-sectional view showing the thinning step of the semiconductor layer. This thinning step can be performed similarly to the thinning step of FIG. 2C, and the semiconductor layer 115A is etched to form the semiconductor layer 115B having a smaller thickness than the semiconductor layer 115A. In this thinning step, the thickness of the semiconductor layer 115B is controlled to be preferably equal to or less than 100 nm and equal to or greater than 5 nm, and more preferably equal to or less than 50 nm and equal to or greater than 5 nm.

Through the steps of FIGS. 3A to 4C, an SOI substrate 132B in which the semiconductor layer 115B is bonded can be formed.

The SOI substrate 132B in which the plural semiconductor layers 115B are bonded to one base substrate 101 can be manufactured. For example, the process described in FIGS. 3B to 3E is repeated plural times, and plural semiconductor substrates 111 in each of which the bonding layer 114, the insulating layer 116, and the ion introduction layer 113 are formed are prepared. Next, the bonding step of FIG. 3F is repeated plural times, and the plural semiconductor substrates 111 are fixed to the one base substrate 101. Then, the heating step of FIG. 3G is performed to separate the semiconductor substrates 111, so that the SOI substrate 132 in which plural semiconductor layers 115 are fixed to the base substrate 101 is manufactured. Then, through the steps of FIGS. 4A to 4C, the SOI substrate 132B in which plural semiconductor layers 115B are bonded to the base substrate 101 can be manufactured.

As described above, in this embodiment mode, the planarization step of the semiconductor layer by irradiation with laser light and the subsequent thinning step of the semiconductor layer are combined, so that the semiconductor layer 115B whose thickness is equal to or less than 100 nm, whose planarity is improved, and whose crystal defects are decreased can be formed. Therefore, even when the base substrate 101 is a glass substrate and an ion doping apparatus is used for formation of the ion introduction layer 113, the SOI substrate 132B in which the semiconductor layer 115B having the above-described characteristics is bonded can be manufactured.

Manufacturing a transistor with the SOI substrate 132B makes it possible to thin the channel formation region, thin the gate insulating layer, and reduce the level density at the localized interface between the semiconductor layer 115B and the gate insulating layer. In addition, by thinning the semiconductor layer 115B, a fully depleted transistor can be manufactured using the single-crystalline semiconductor layer over the glass substrate. Accordingly, a transistor having high performance and high reliability which can, for example, operate at high speed and have a low subthreshold value, high electron field-effect mobility, and low power consumption can be manufactured over a base substrate.

(Embodiment Mode 3)

FIGS. 5A to 6C are cross-sectional views showing an example of a manufacturing method of an SOI substrate. With reference to FIGS. 5A to 6C, the example of the manufacturing method of an SOI substrate will be described.

As the description with FIG. 1A, the base substrate 101 to be a base substrate of an SOI substrate is prepared, and the insulating layer 102 is formed over the base substrate. In this embodiment also, the insulating layer 102 is a film with a two-layer structure including the silicon nitride oxide film 103 and the silicon oxynitride film 104. Next, as shown in FIG. 5A, the bonding layer 105 is formed over the insulating layer 102. This bonding layer 105 can be formed similarly to the bonding layer 114 formed over the semiconductor substrate 111.

Figure 5B:
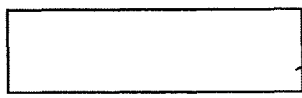
FIGS. 5A to 5G are cross-sectional views of a manufacturing method of an SOI substrate.
Figure 5A:
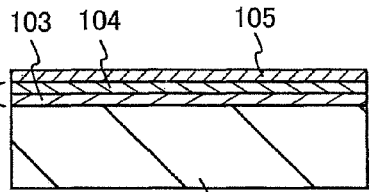
Figure 5C:
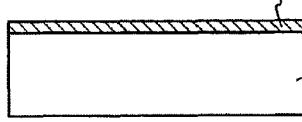
Figure 5D:
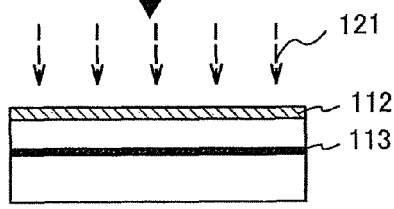
Figure 5E:
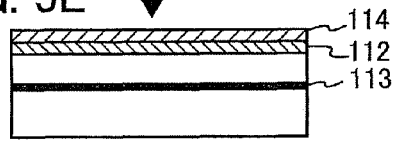

Next, FIGS. 5B to 5D are cross-sectional views showing the same steps as FIGS. 1B to 1D. As described in Embodiment Mode 1, the protective film 112 is formed over the semiconductor substrate 111, and the ion introduction layer 113 is formed in the semiconductor substrate 111. After formation of the ion introduction layer 113, the protective film 112 is removed. Note that after removing the protective film 112, the bonding layer 114 can also be formed similarly to FIG. 1E. Alternatively, the bonding layer 114 can be formed over the protective film 112 in the state where the protective film 112 remains as shown in FIG. 5E.

Figure 5F:
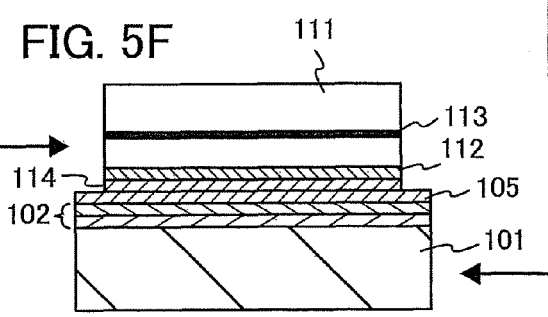

FIG. 5F is a cross-sectional view of a bonding step, which shows the state where the base substrate 101 and the semiconductor substrate 111 are bonded. This bonding step can be performed similarly to the bonding step described with reference to FIG. 1F, and the semiconductor substrate 111 and the bonding layer 105 are bonded to each other by making the semiconductor substrate 111 and the bonding layer 105 in close contact with each other.

In the case where the protective film 112 is removed, before bonding the semiconductor substrate 111 and the bonding layer 105, the surface of the semiconductor substrate 111 can be subjected to oxygen plasma treatment or ozone treatment to provide a hydrophilic property to the surface of the semiconductor substrate 111. After bonding the semiconductor substrate 111 and the bonding layer 105, heat treatment or pressure treatment described in Embodiment Mode 1 can be performed to improve bonding force.

Figure 5G:
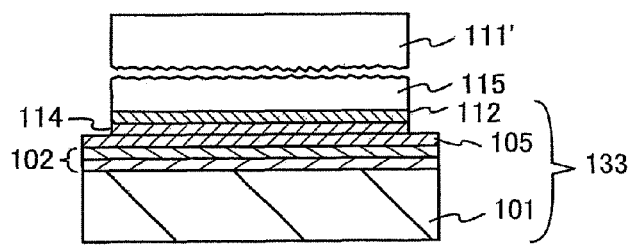

FIG. 5G shows a separation step where the semiconductor layer 115 is separated from the semiconductor substrate 111. The separation step of this embodiment mode can be performed similarly to the separation step described with reference to FIG. 1G. After bonding the semiconductor substrate 111 and the bonding layer 105, the semiconductor substrate 111 is heated at a temperature equal to or higher than 400° C. and equal to or lower than 700° C. The upper limit of the heat temperature is set so as not to exceed a strain point of the base substrate 101.

An SOI substrate 133 in which the semiconductor layer 115 is provided over the base substrate 101 is manufactured in the separation step shown in FIG. 5G. This SOI substrate 133 is a substrate with a multilayer structure, in which the insulating layer 102, the bonding layer 105, the bonding layer 114, the protective film 112, and the semiconductor layer 115 are stacked in this order, and is also a substrate in which the bonding layer 114 and the bonding layer 105 are bonded.

Figure 6A:
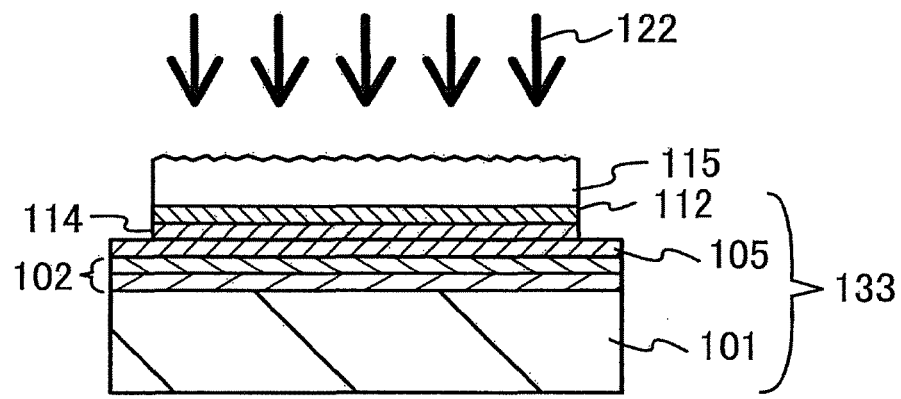
FIGS. 6A to 6C are cross-sectional views of a manufacturing method of an SOI substrate and show steps which follow FIG. 5G.
Figure 6B:
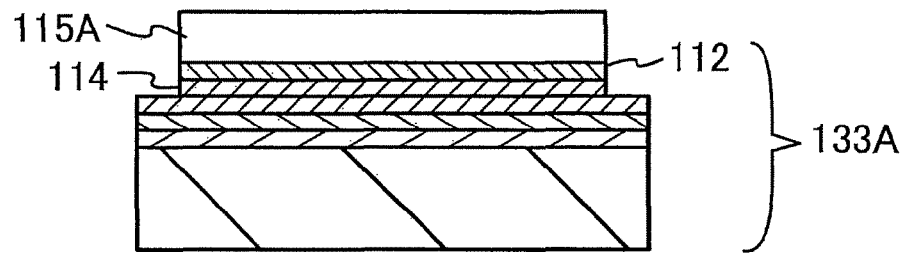

Further, in this embodiment mode as well, a planarization step in which the SOI substrate 133 is irradiated with the laser light 122 is performed as shown in FIG. 6A. This planarization step can be performed similarly to the irradiation step with the laser light 122 in FIG. 2A. As shown in FIG. 6A, irradiation with the laser light 122 is conducted from the semiconductor layer 115 side, and the semiconductor layer 115 is partially melted. Thus, the semiconductor layer 115A with improved planarity and decreased crystal defects is formed as shown in FIG. 6B.

Figure 6C:
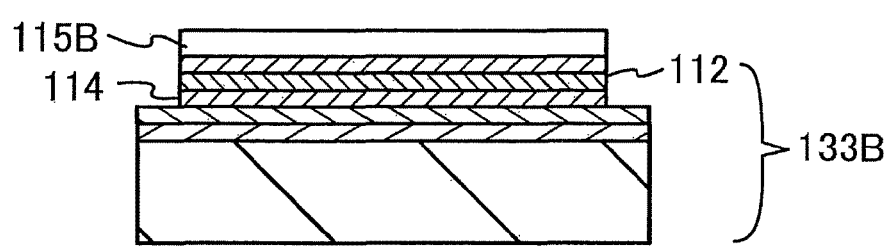

After formation of an SOI substrate 133A including the semiconductor layer 115A, a thinning step of the semiconductor layer in which the semiconductor layer 115A is thinned is performed. FIG. 6C is a cross-sectional view showing the thinning step of the semiconductor layer. This thinning step can be performed similarly to the thinning step of FIG. 2C, and the semiconductor layer 115A is etched to form the semiconductor layer 115B having a smaller thickness than the semiconductor layer 115A. In this thinning step, the thickness of the semiconductor layer 115B is controlled to be preferably equal to or less than 100 nm and equal to or greater than 5 nm, and more preferably equal to or less than 50 nm and equal to or greater than 5 nm.

Through the steps of FIGS. 5A to 6C, an SOI substrate 133B in which the semiconductor layer 115B is bonded can be formed.

The SOI substrate 133B in which the plural semiconductor layers 115B are bonded to one base substrate 101 can be manufactured. For example, the process described with reference to FIGS. 5B to 5E is repeated plural times, and plural semiconductor substrates 111 in each of which the ion introduction layer 113 is formed are prepared. Next, the bonding step of FIG. 5F is repeated plural times, and the plural semiconductor substrates 111 are fixed to the one base substrate 101. Then, the heating step of FIG. 5G is performed to separate the semiconductor substrates 111, so that the SOI substrate 133 in which plural semiconductor layers 115 are fixed to the base substrate 101 is manufactured. Then, through the steps of FIGS. 6A to 6C, the SOI substrate 133B in which plural semiconductor layers 115B are bonded can be manufactured.

As described above, in this embodiment mode, the planarization step of the semiconductor layer by irradiation with laser light and the subsequent thinning step of the semiconductor layer are combined, so that the semiconductor layer 115B whose thickness is equal to or less than 100 nm, whose projections and depressions are reduced, and whose crystal defects are decreased can be formed. That is, even when a glass substrate is employed as the base substrate 101 and an ion doping apparatus is used for formation of the ion introduction layer 113, the SOI substrate 133B in which the semiconductor layer 115B having the above-described characteristics is formed can be manufactured.

Manufacturing a transistor with the SOI substrate 133B makes it possible to thin the channel formation region, thin the gate insulating layer, and reduce the level density at the localized interface between the semiconductor layer 115B and the gate insulating layer. In addition, by making the semiconductor layer 115B thin, a fully depleted transistor can be manufactured using the single-crystalline semiconductor layer over the glass substrate. Accordingly, a transistor having high performance and high reliability which can, for example, operate at high speed and have a low subthreshold value, high electron field-effect mobility, and low power consumption can be manufactured over a base substrate.

(Embodiment Mode 4)

In Embodiment Modes 1 to 3, before the irradiation of the semiconductor layer 115 with the laser light 122, a thinning step in which the semiconductor layer 115 is thinned by etching treatment can be performed. In the case of using an ion doping apparatus for formation of the ion introduction layer 113, it is difficult to control the thickness of the semiconductor layer 115 to be equal to or less than 100 nm. On the other hand, when the semiconductor layer 115 is too thick, the energy of the laser light 122 needs to be high. Accordingly, the applicable energy range for the laser light 122 becomes narrower, and it becomes difficult to planarize the semiconductor layer 115 and recover crystallinity of the semiconductor layer 115 by irradiation with the laser light 122 in high yield.

In the case where the thickness of the semiconductor layer 115 exceeds 200 nm, it is preferable that the thickness of the semiconductor layer 115 be decreased to equal to or less than 200 nm and then irradiated with the laser light 122. The thickness of the semiconductor layer 115 is preferably set at equal to or less than 150 nm and equal to or greater than 60 nm.

After thinning the semiconductor layer 115, irradiation with the laser light 122 is conducted, and then the semiconductor layer 115 is further thinned to a predetermined thickness. Note that in the case where the semiconductor layer 115 can be controlled to have a predetermined thickness by thinning before irradiation with the laser light 122, the thinning step after the irradiation with the laser light 122 can be omitted.

(Embodiment Mode 5)

By each of the methods for manufacturing an SOI substrate described with reference to FIGS. 1A to 6C, various kinds of glass substrates such as a non-alkaline glass substrate can be applied for the base substrate 101. Accordingly, by using a glass substrate as the base substrate 101, an SOI substrate with a large size in which one side is more than one meter can be manufactured. When a plurality of semiconductor elements are formed on such a large-sized substrate which is supplied for manufacturing a semiconductor, a liquid crystal display device and an electroluminescent display device can be manufactured. In addition to such display devices, various kinds of semiconductor devices such as a solar battery, a photo IC, and a semiconductor memory device can be manufactured using an SOI substrate.

Hereinafter, a manufacturing method of thin film transistors (TFTs) will be described with reference to FIGS. 7A to 8B as a manufacturing method of a semiconductor device. By combining a plurality of thin film transistors, various semiconductor devices are formed.

Figure 7A:
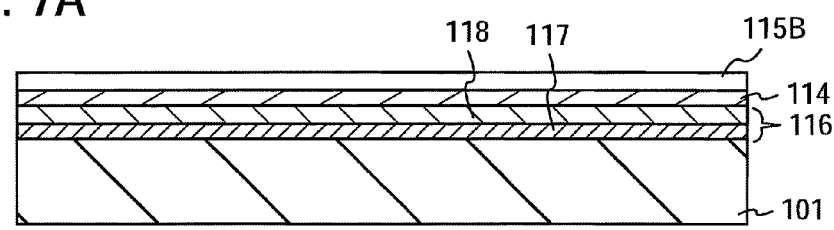
FIGS. 7A to 7D are cross-sectional views of a manufacturing method of a semiconductor device using an SOI substrate.

FIG. 7A is a cross-sectional view of an SOI substrate. In this embodiment mode, the SOI substrate 132B manufactured by the manufacturing method of Embodiment Mode 2 is used. Note that an SOI substrate having another structure can also be used.

To control threshold voltages of TFTs, it is preferable to add a p-type impurity element such as boron, aluminum, or gallium or an n-type impurity element such as phosphorus or arsenic. A region to which the impurity element is added and the kind of the impurity element to be added are selected depending on which of an n-channel TFT and a p-channel TFT is formed. For example, a p-type impurity element is added to a formation region of an n-channel TFT, and an n-type impurity element is added to a formation region of a p-channel TFT. In adding ions of the impurity elements, the dose may be, approximately, equal to or higher than $1 \times 10^{12}$/cm$^2$ and equal to or lower than $1 \times 10^{14}$/cm$^2$.

Figure 7B:
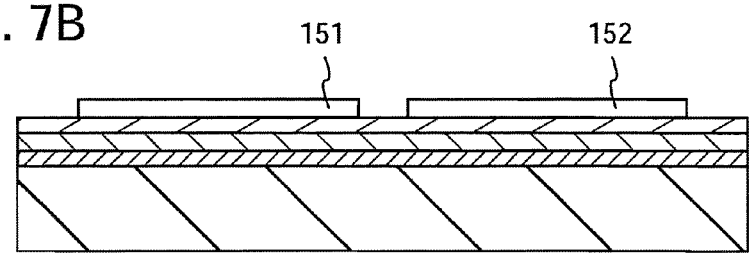

Next, the semiconductor layer of the SOI substrate is separated into island shapes by etching, so that semiconductor layers 151 and 152 are formed as shown in FIG. 7B. The semiconductor layer 151 composes an n-channel TFT, and the semiconductor layer 152 composes a p-channel TFT.

Figure 7C:
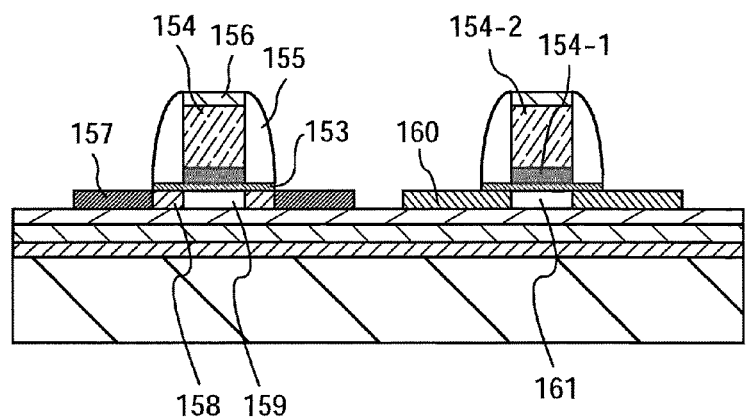

Then, as shown in FIG. 7C, a gate insulating layer 153, a gate electrode 154, sidewall insulating layers 155, and a silicon nitride layer 156 are formed over each of the semiconductor layers 151 and 152. The silicon nitride layer 156 is used as a hard mask in shaping the gate electrode 154 by etching. Here, the gate electrode 154 has a two-layer structure including a first conductive layer 154-1 and a second conductive layer 154-2.

Before formation of the sidewall insulating layers 155, impurity elements are added to the semiconductor layers 151 and 152 using the gate electrodes 154 as masks. In this adding step of the impurity elements, in order to form n-type low-concentration impurity regions 158, an n-type impurity element is added to the semiconductor layer 151 at a low concentration. The addition of the n-type impurity element is preferably conducted so that the low-concentration impurity regions 158 serve as LDD regions. In order to form p-type high-concentration impurity regions 160, a p-type impurity element is added to the semiconductor layer 152 at a high concentration. In this step, in addition to the high-concentration impurity regions 160, a channel formation region 161 is formed in a region which is overlapped with the gate electrode 154 in the semiconductor layer 152. The high-concentration impurity regions 160 serve as a source region and a drain region. After formation of the sidewall insulating layers 155, an n-type impurity element is added to only the semiconductor layer 151 using the gate electrode 154 and the sidewall insulating layers 155 as masks, so that n-type high-concentration impurity regions 157 are formed in the semiconductor layer 151. In this step, in the semiconductor layer 151, the n-type low-concentration impurity regions 158 are formed in regions which are overlapped with the sidewall insulating layers 155, and a channel formation region 159 is formed in a region which is overlapped with the gate electrode 154. The n-type high-concentration impurity regions 157 serve as a source region and a drain region. After adding the impurity elements, heat treatment is conducted to activate the impurity elements which are added to the semiconductor layers 151 and 152.

Figure 7D:
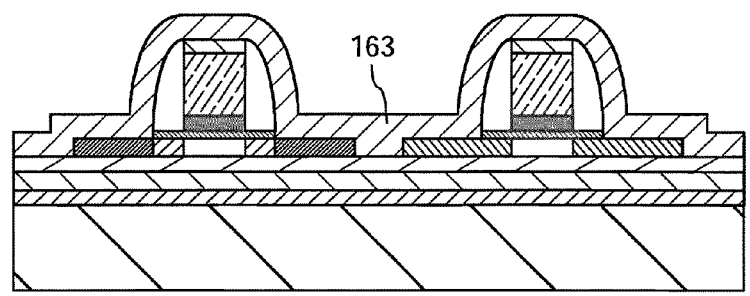

Next, as shown in FIG. 7D, an insulating layer 163 containing hydrogen is formed. After formation of the insulating layer 163, heat treatment is conducted at a temperature equal to or higher than 350° C. and equal to or lower than 450° C., so that hydrogen contained in the insulating layer 163 is diffused into the semiconductor layers 151 and 152. The insulating layer 163 can be formed by stacking silicon nitride or silicon nitride oxide by a plasma CVD method at a process temperature of equal to or lower than 350° C. By supplying hydrogen to the semiconductor layers 151 and 152, defects which may function as trapping centers in the semiconductor layers 151 and 152 or at an interface between the semiconductor layers 151 and 152 and the gate insulating layer 153 can be efficiently compensated.

Figure 8A:
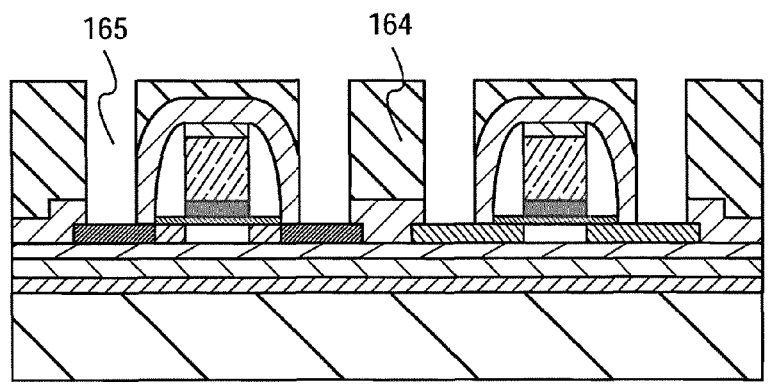
FIGS. 8A and 8B are cross-sectional views of a manufacturing method of a semiconductor device using an SOI substrate and show steps which follow FIG. 7D.

Then, an interlayer insulating layer 164 is formed as shown in FIG. 8A. The interlayer insulating layer 164 is formed by forming a boron phosphorus silicon glass (BPSG) film or applying an organic resin typified by polyimide. Contact holes 165 are formed in the interlayer insulating layer 164.

Figure 8B:
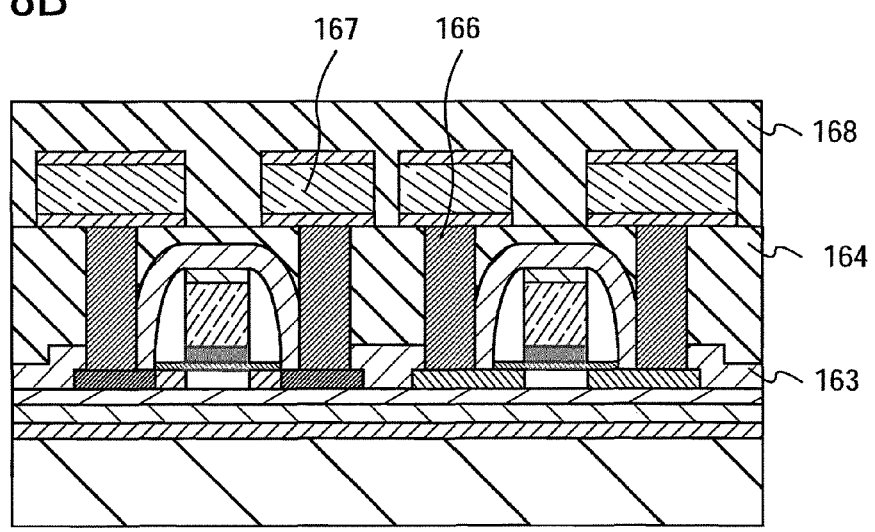

FIG. 8B shows a step of forming a wiring. Contact plugs 166 are formed in the contact holes 165. The contact plugs 166 are formed so as to fill the contact holes 165 with tungsten silicide by a chemical vapor deposition using a $WF_6$ gas and a $SiH_4$ gas. Alternatively, tungsten may be formed by hydrogen reduction of $WF_6$ to fill the contact holes 165. Then, a wiring 167 is formed over the contact plugs 166. In the case where the wiring 167 has a three-layer structure, a conductive film including aluminum or an aluminum alloy is formed, and metal films of molybdenum, chromium, titanium, or the like are formed as an upper barrier metal layer and a lower barrier metal layer of the conductive film. An interlayer insulating film 168 is formed over the wiring 167. If necessary, the interlayer insulating film 168 may be provided, and another wiring layer may be further formed thereover to form a multilayer wiring structure. In that case, damascene process can be employed.

In this manner, thin film transistors can be manufactured using an SOI substrate. The semiconductor layer of the SOI substrate has almost no crystal defects and is a single-crystalline semiconductor layer with reduced the level density at the localized interface between the semiconductor layers 151 and 152 gate insulating layer 153. The semiconductor layer has a planarized surface and is thinned to a thickness of equal to or less than 50 nm. Accordingly, thin film transistors with excellent characteristics such as low driving voltage, high electron field-effect mobility, and a low subthreshold value can be formed over the base substrate 101. Further, plural transistors with high performance and no characteristic variation between the transistors can be formed over the same substrate. In other words, by using any of the SOI substrates described in Embodiment Modes 1 to 3, nonuniformity of the important characteristic value as transistor characteristics such as threshold voltage or mobility can be reduced and high performance such as high electron field-effect mobility can be obtained.

A semiconductor device with high added value can be manufactured by forming various semiconductor elements such as TFTs using the SOI substrates manufactured by the methods shown in Embodiment Modes 1 to 3. Hereinafter, a specific mode of a semiconductor device will be described with reference to the drawings.

Figure 9:
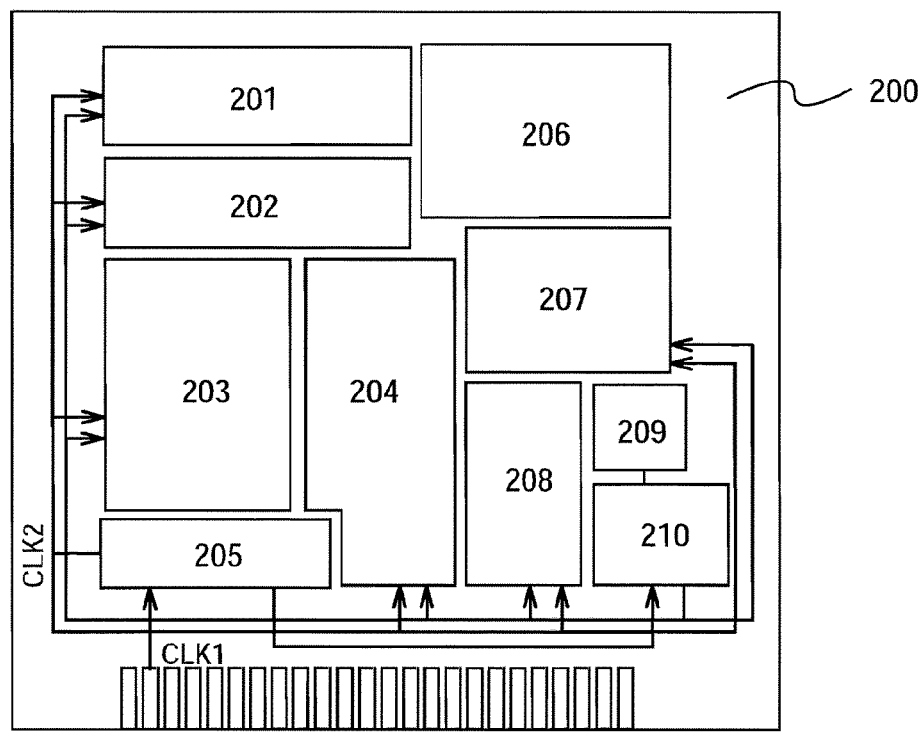
FIG. 9 is a block diagram of a configuration of a microprocessor that is obtained using an SOI substrate.

First, as an example of the semiconductor device, a microprocessor will be described. FIG. 9 is a block diagram showing a structural example of a microprocessor 200.

The microprocessor 200 includes an arithmetic logic unit (also referred to as an ALU) 201, an ALU controller 202, an instruction decoder 203, an interrupt controller 204, a timing controller 205, a register 206, a register controller 207, a bus interface (Bus I/F) 208, a read-only memory 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction.

Specifically, the ALU controller 202 generates signals for controlling operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207.

For example, the timing controller 205 is provided with an internal clock generator for generating an internal clock signal CLK2 based on a reference clock signal CLK1, and supplies the clock signal CLK2 to the various above-mentioned circuits. Note that the microprocessor 200 shown in FIG. 9 is only an example in which the configuration is simplified, and an actual microprocessor may have various configurations depending on the uses.

The microprocessor 200 can achieve not only an increase in processing speed but also a reduction in power consumption because an integrated circuit is formed using a single-crystalline semiconductor layer with uniform crystal orientation which is bonded over a substrate having an insulating surface or an insulating substrate.

Figure 10:
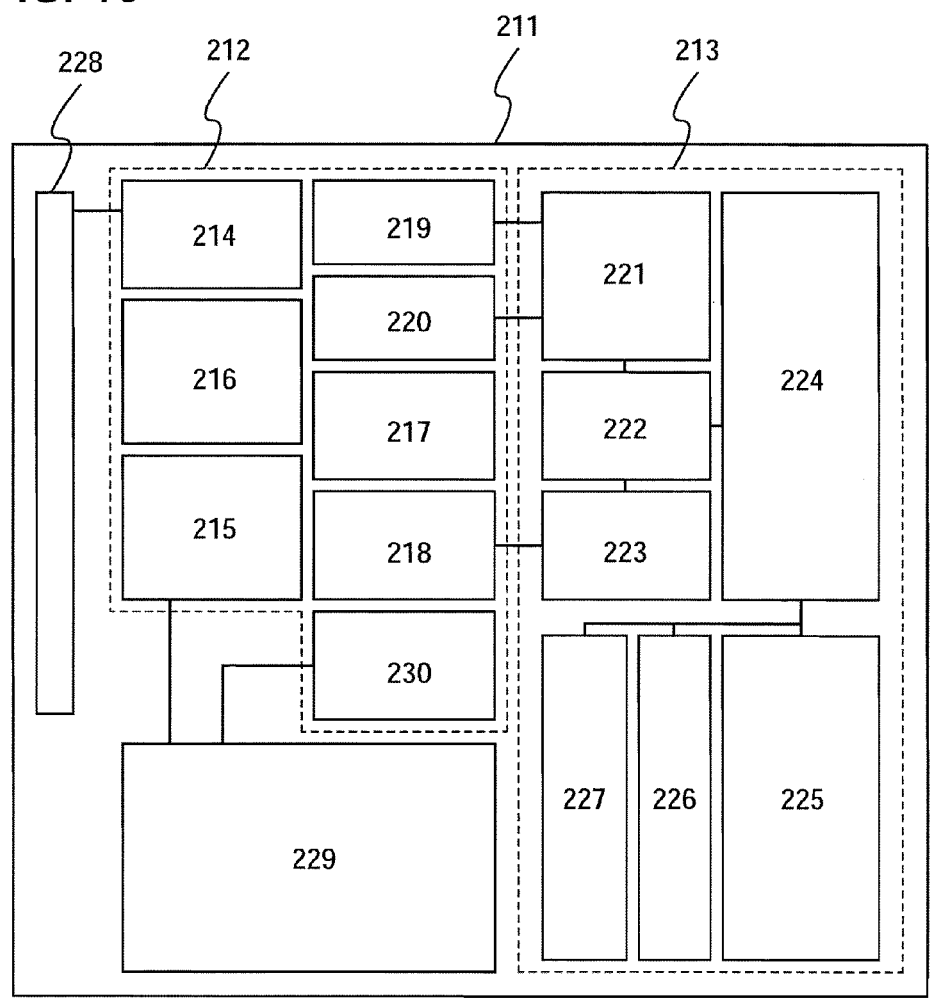
FIG. 10 is a block diagram of a configuration of an RFCPU that is obtained using an SOT substrate.

Next, an example of a semiconductor device having an arithmetic function that can transmit and receive data without contact is described. FIG. 10 is a block diagram showing a structural example of a semiconductor device. The semiconductor device shown in FIG. 10 can be regarded as a computer (hereinafter also referred to as an "RFCPU") which operates to transmit and receive signals to and from an external device by wireless communication.

As shown in FIG. 10, an RFCPU 211 includes an analog circuit portion 212 and a digital circuit portion 213. The RFCPU 211 includes, as the analog circuit portion 212, a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 includes an RF interface 221, a control register 222, a clock controller 223, a CPU interface 224, a central processing unit 225, a random access memory 226, and a read only memory 227.

The operation of the RFCPU 211 is as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable that the capacitor portion 229 is mounted as a different component on a substrate having an insulating surface in which the RFCPU 211 is included.

The reset circuit 217 generates a signal for resetting and initializing the digital circuit portion 213. For example, the reset circuit 217 generates, as a reset signal, a signal that rises with delay after increase in the power supply voltage. The oscillator circuit 218 changes the frequency and duty ratio of a clock signal in response to a control signal generated by the constant voltage circuit 216. The demodulator circuit 219 is a circuit which demodulates a received signal, and the modulator circuit 220 is a circuit which modulates data that is to be transmitted.

For example, the demodulator circuit 219 is formed using a low-pass filter and binarizes a received signal of an amplitude shift keying (ASK) system based on the fluctuation of the received signal. The modulation circuit 220 transmits transmission data by changing the amplitude of a transmission signal of an amplitude shift keying (ASK) system. The modulation circuit 220 changes the resonance point of the resonance circuit 214, thereby changing the amplitude of a communication signal.

The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read only memory 227, writing of data to the random access memory 226, an arithmetic instruction to the central processing unit 225, and the like.

The central processing unit 225 accesses the read only memory 227, the random access memory 226, and the control register 222 via the CPU interface 224. The CPU interface 224 has a function of generating an access signal for any of the read only memory 227, the random access memory 226, and the control register 222 based on an address which is requested by the central processing unit 225.

As an arithmetic method of the central processing unit 225, a method may be employed in which the read only memory 227 stores an operating system (OS) and a program is read and executed at the time of starting operation. Alternatively, a circuit dedicated to arithmetic is formed as an arithmetic circuit, and arithmetic processing is conducted using hardware. In a method in which both hardware and software are used, part of processing can be conducted by a circuit dedicated to arithmetic, and the other part of the arithmetic processing can be conducted by the central processing unit 225 using a program.

The RFCPU 211 described above can achieve not only an increase in processing speed but also a reduction in power consumption because an integrated circuit is formed using a semiconductor layer with uniform crystal orientation which is bonded over a substrate having an insulating surface or an insulating substrate. Accordingly, even when the capacitor portion 229 which supplies electric power is miniaturized, long-term operation is ensured.

Next, a display device as a semiconductor device will be described with reference to FIGS. 11 to 13B.

Figure 11:
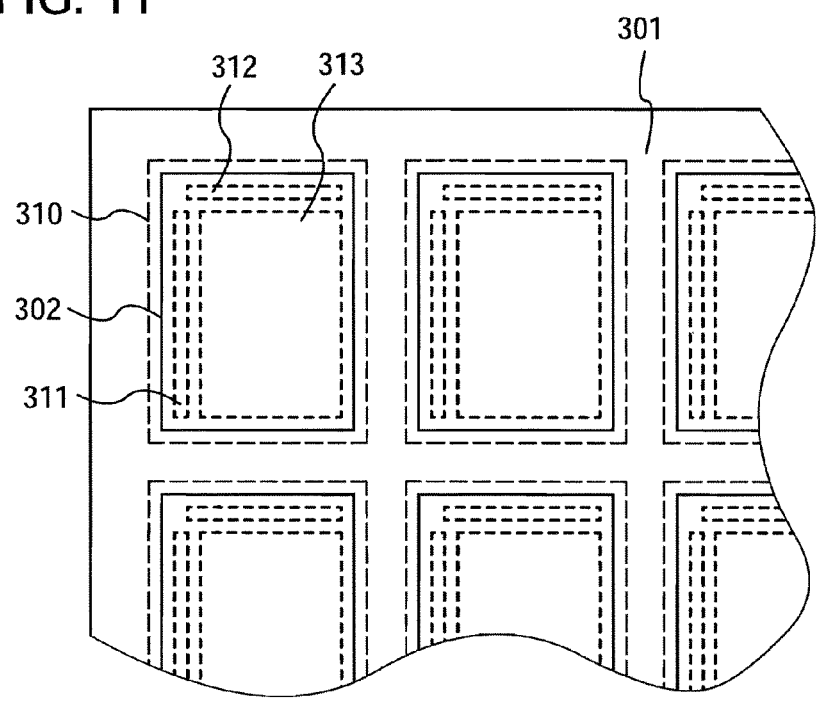
FIG. 11 is a front view of an SOI substrate using mother glass as a base substrate.

A large-sized glass substrate called mother glass over which a display panel is manufactured can be used as a base substrate of an SOI substrate. FIG. 11 is a front view of an SOI substrate in which mother glass is used as the base substrate 101.

Semiconductor layers 302 which are separated from a plurality of semiconductor substrates are bonded to a mother glass 301. In order to divide the mother glass 301 to produce a plurality of display panels, the semiconductor layers 302 are preferably bonded in formation regions 310 of the display panels. Each of the display panels includes a scanning line driver circuit, a signal line driver circuit, and a pixel portion. Therefore, the semiconductor layers 302 are bonded to the regions where the above-described driver circuits are formed (a scanning line driver circuit formation region 311, a signal line driver circuit formation region 312, and a pixel formation region 313) in the formation regions 310 of the display panels.

Figure 12A:
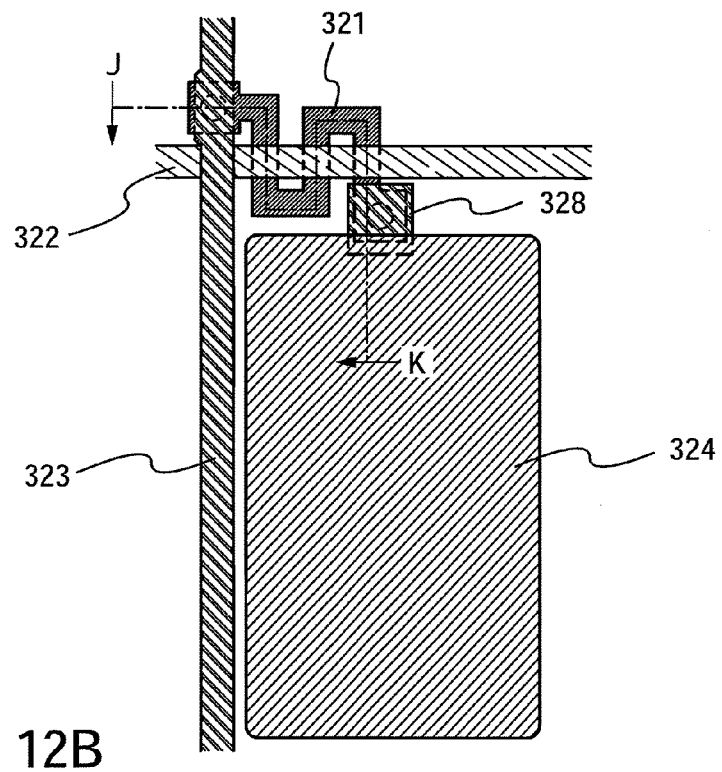
FIG. 12A is a plane view of a pixel of a liquid crystal display device and FIG. 12B is a cross-sectional view taken along a line J-K in FIG. 12A.
Figure 12B:
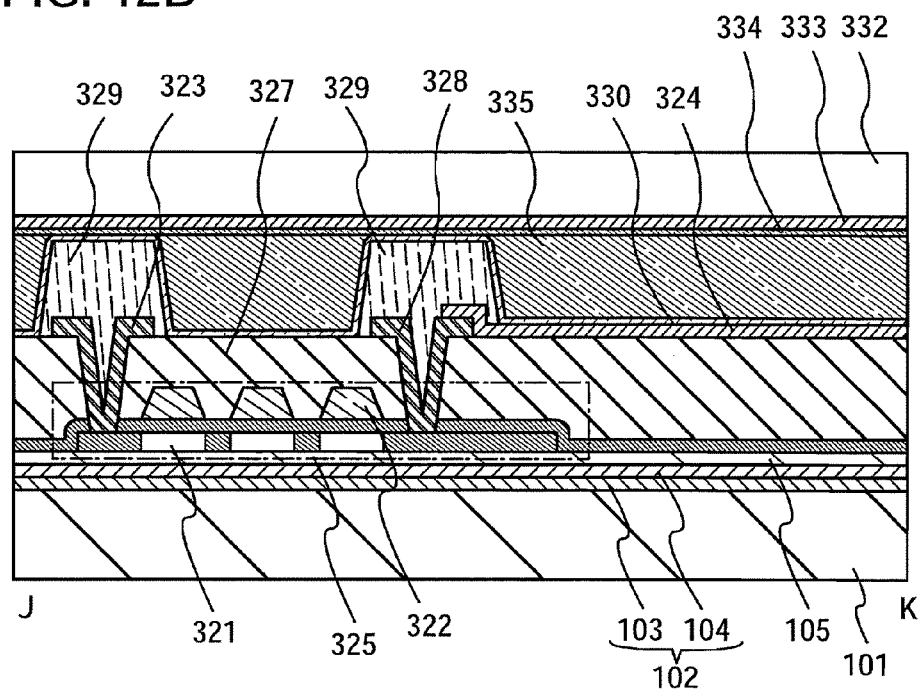

FIGS. 12A and 12B are drawings for showing a liquid crystal display device manufactured using the SOI substrate shown in FIG. 11. FIG. 12A is a plane view of a pixel of the liquid crystal display device, and FIG. 12B is a cross-sectional view taken along a line J-K in FIG. 12A.

In FIG. 12A, a semiconductor layer 321 is a layer formed from the semiconductor layer 302 which is bonded to the SOI substrate and included in a TFT of the pixel. Here, the SOI substrate manufactured by the method of Embodiment Mode 3 is used as the SOI substrate. This SOI substrate is a substrate in which the insulating layer 102, the bonding layer 105, and the semiconductor layer 115B are stacked over the base substrate 101 (see FIG. 6C). The base substrate 101 is a divided part of the mother glass 301. The semiconductor layer 115B corresponds to the semiconductor layer 302. As shown in FIG. 12A, the pixel includes the semiconductor layer 321, a scanning line 322 which intersects with the semiconductor layer 321, a signal line 323 which intersects with the scanning line 322, a pixel electrode 324, and an electrode 328 which electrically connects the pixel electrode 324 and the semiconductor layer 321 to each other.

As shown in FIG. 12B, a TFT 325 of the pixel is formed on the bonding layer 105. A gate electrode of the TFT 325 is included in the scanning line 322, and a source electrode or a drain electrode of the TFT 325 is included in the signal line 323. Over an interlayer insulating film 327, the signal line 323, the pixel electrode 324, and the electrode 328 are provided. Further, over the interlayer insulating film 327, columnar spacers 329 are formed. An orientation film 330 is formed to cover the signal line 323, the pixel electrode 324, the electrode 328, and the columnar spacers 329. A counter substrate 332 is provided with a counter electrode 333 and an orientation film 334 which covers the counter electrode 333. The columnar spacers 329 are formed to keep gaps between the base substrate 101 and the counter substrate 332. A liquid crystal layer 335 is formed in spaces formed by the columnar spacers 329. At portions where the semiconductor layer 321 is connected to the signal line 323 and the electrode 328, steps are generated in the interlayer insulating film 327 by formation of the contact holes. The steps disorder orientation of liquid crystal of the liquid crystal layer 335. Therefore, the columnar spacers 329 are formed at these step portions to prevent disorder of liquid crystal orientation.

Figure 13A:
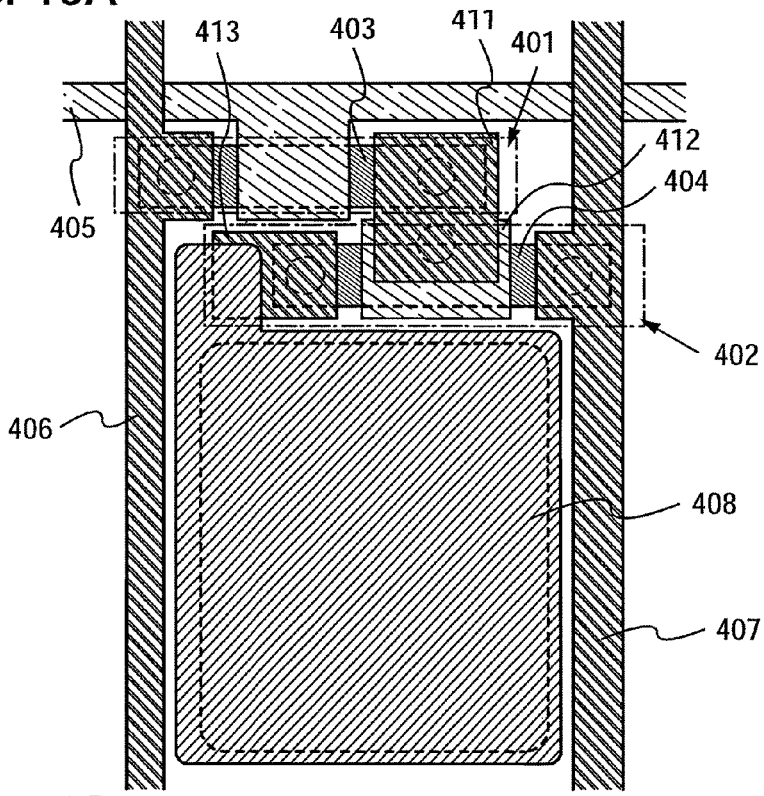
FIG. 13A and FIG. 13B are a plane view and a cross-sectional view of a pixel of an electroluminescent display device, respectively.
Figure 13B:
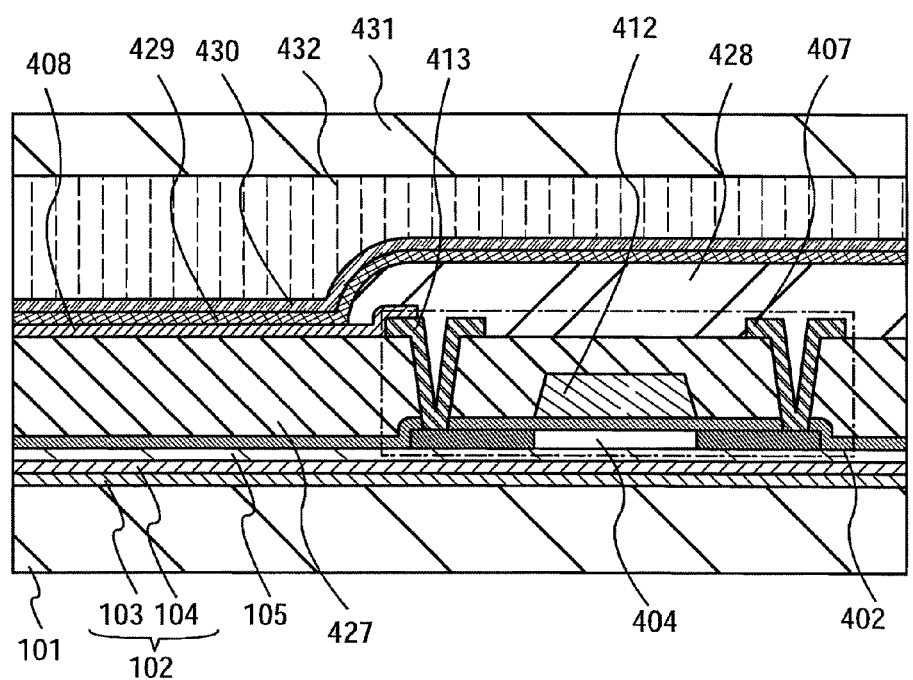

Next, an electroluminescent display device (hereinafter also referred to as an EL display device) will be described. FIGS. 13A and 13B are drawings showing an EL display device manufactured using the SOI substrate shown in FIG. 11. FIG. 13A is a plane view of a pixel of the EL display device, and FIG. 13B is a cross-sectional view of the pixel.

As shown in FIG. 13A, in the pixel, a selection transistor 401 and a display control transistor 402 are formed with TFTs. FIG. 13B is a cross-sectional view showing a main section including the display control transistor 402.

The semiconductor layer 403 of the selection transistor 401 and the semiconductor layer 404 of the display control transistor 402 are layers formed by processing the semiconductor layer 302 of the SOI substrate of FIG. 11. The pixel includes a scanning line 405, a signal line 406, a current supply line 407, and a pixel electrode 408. In each pixel of the EL display device, a light emitting element with a structure where a layer 429 containing an electroluminescent material (hereinafter referred to as an EL layer 429) is interposed between a pair of electrodes is provided. One electrode of the light emitting element is the pixel electrode 408.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

As the SOI substrate, the SOI substrate manufactured by the method of Embodiment Mode 3 is used. This SOI substrate is a substrate in which the insulating layer 102, the bonding layer 105, and the semiconductor layer 115B are stacked over the base substrate 101 (see FIG. 6C). The base substrate 101 is a divided part of the mother glass 301.

As shown in FIG. 13B, an interlayer insulating film 427 is formed to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. The EL layer 429 is formed over the pixel electrode 408, and a counter electrode 430 is formed over the EL layer 429. An EL element is formed by the pixel electrode 408, the EL layer 429, and the counter electrode 430. A counter substrate 431 is provided as a reinforcing plate, and the counter substrate 431 is fixed to the base substrate 101 with a resin layer 432. The pixel shown in FIGS. 13A and 13B is arranged in a matrix in the pixel portion of an EL display device.

The gray scale of the EL display device can be controlled by a current driving method in which luminance of a light-emitting element is controlled by current or a voltage driving method in which luminance of a light-emitting element is controlled by voltage. In the case where there is a large difference in the characteristic value between transistors of pixels, it is difficult to employ the current driving method; in order to employ the current driving method in such a case, a correction circuit which corrects characteristic variation is needed. By using the SOI substrate of the present invention, characteristic variation of the selection transistor 401 and the display control transistor 402 between pixels is negligible; therefore, the current driving method can be employed.

As shown in FIGS. 12A to 13B, an SOI substrate can be manufactured using a mother glass for manufacturing a display device, and a display device can be manufactured using the SOI substrate. Further, since a microprocessor as shown in FIGS. 9 and 10 can also be formed on this SOI substrate, a display device can be equipped with a computer function. Furthermore, a display device capable of inputting and outputting data without contact can be manufactured.

That is, by using the SOI substrate of the present invention, various electric appliances can be manufactured. The electric appliances include cameras such as video cameras and digital cameras, navigation systems, audio reproducing devices (such as car audios or audio components), computers, game machines, portable information terminals (such as mobile computers, cellular phones, portable game machines, or electronic books), and image reproducing devices provided with a recording medium (specifically, devices that can reproduce image data recorded in a recording medium such as a digital versatile disk (DVD) and are equipped with a display device capable of displaying the image).

Figure 14A:
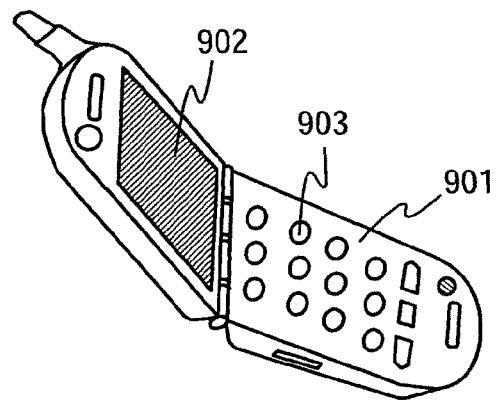
FIGS. 14A, 14B, and 14C are external views of a cellular phone, a digital player, and an electronic book, respectively.
Figure 14B:
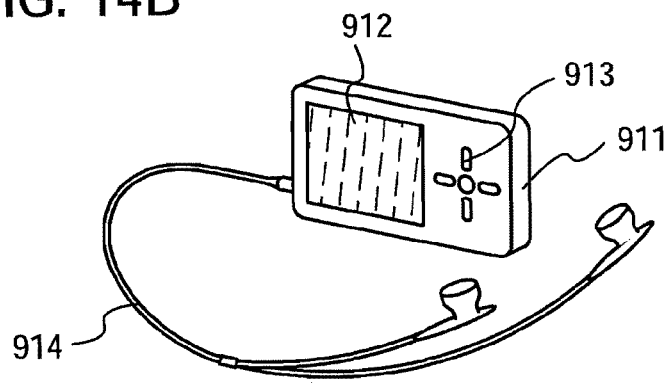
Figure 14C:
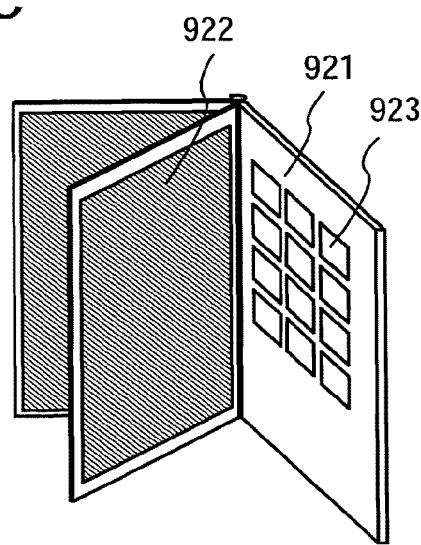

With reference to FIG. 14A to 14C, specific modes of the electric appliances are described. FIG. 14A is an external view showing an example of a cellular phone 901. This cellular phone 901 includes a display portion 902, operation switches 903, and the like. When the liquid crystal display device shown in FIGS. 12A and 12B or the EL display device shown in FIGS. 13A and 13B is applied to the display portion 902, the display portion 902 can have little display unevenness and excellent image quality. A semiconductor device formed using an SOI substrate of the present invention can also be applied to a microprocessor, a memory, or the like included in the cellular phone 901.

FIG. 14B is an external view showing a structural example of a digital player 911. The digital player 911 includes a display portion 912, an operation portion 913, an earphone 914, and the like. Instead of the earphone 914, a headphone or a wireless earphone can be used. By applying the liquid crystal display device shown in FIGS. 12A and 12B or the EL display device shown in FIGS. 13A and 13B to the display portion 912, a high-definition image and a lot of character information can be displayed even when the screen size is approximately from 0.3 inches to 2 inches. A semiconductor device formed using an SOI substrate of the present invention can be applied to a memory portion which stores music information or a microprocessor which are included in the digital player 911.

Further, FIG. 14C is an external view of an electronic book 921. This electronic book 921 includes a display portion 922 and operation switches 923. A structure in which information can be transmitted and received wirelessly can be formed by equipping the electronic book 921 with a modem or the RFCPU shown in FIG. 10. By employing the liquid crystal display device shown in FIGS. 12A and 12B or the EL display device shown in FIGS. 13A and 13B for the display portion 922, an image with high image quality can be displayed. In the electronic book 921, a semiconductor device formed using an SOI substrate of the present invention can be applied to a memory portion which stores information or a microprocessor which allows the electronic book 921 to operate.

[Embodiment 1]

Hereinafter, an embodiment of the present invention will be described in more detail. However, the present invention is not limited by this embodiment, and it is obvious that the present invention is specified by the scope of claims. In Embodiment 1, the surface roughness and crystallographic properties of a semiconductor layer of an SOI substrate before laser light irradiation and after laser light irradiation will be described.

A manufacturing method of an SOI substrate of this embodiment will be described with reference to FIGS. 15A to 15I. The manufacturing method shown in FIGS. 15A to 15I corresponds to the manufacturing method described in Embodiment Mode 2.

Figure 15A:
Figure 15A:
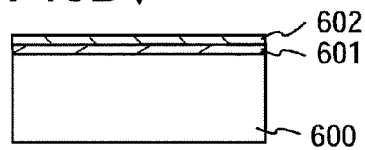
Figure 15A:
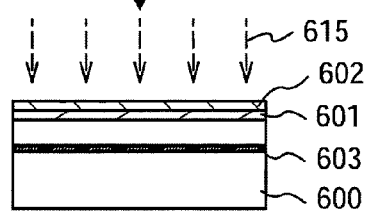
Figure 15A:
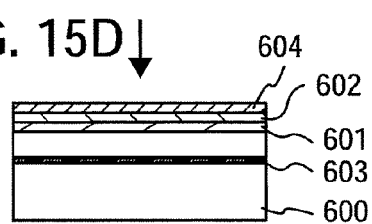
Figure 15A:
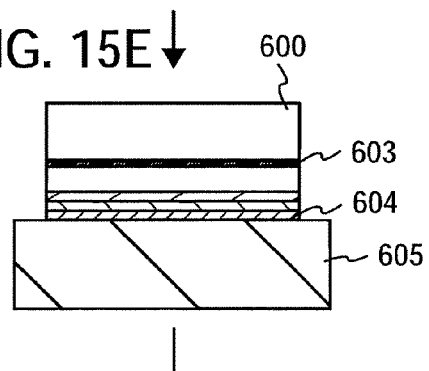

A single-crystalline silicon substrate 600 was prepared as a semiconductor substrate (see FIG. 15A). The single-crystalline silicon substrate 600 was a p-type silicon substrate of 5 inches in diameter, and the plane orientation thereof was (100). Hereinafter, the single-crystalline silicon substrate 600 is referred to as a "c-Si substrate 600."

The c-Si substrate 600 was washed with pure water and dried. Then, a silicon oxynitride film 601 was formed over the c-Si substrate 600 with a parallel plate type plasma CVD apparatus, and a silicon nitride oxide film 602 was formed over the silicon oxynitride film 601 (see FIG. 15B).

The silicon oxynitride film 601 and the silicon nitride oxide film 602 were continuously formed with the parallel plate type plasma CVD apparatus without exposing the c-Si substrate 600 to the air. At that time, film formation conditions were as follows. Here, before forming the silicon oxynitride film 601, a step of removing an oxide film of the c-Si substrate 600 by washing the c-Si substrate 600 with a hydrofluoric acid for 60 seconds was performed.

<Silicon Oxynitride Film 601>

| | |
|---|---|
| Thickness | 50 nm |
| Kind of gas (flow rate) | |
| $SiH_4$ | (4 sccm) |
| $N_2O$ | (800 sccm) |
| Substrate temperature | 400° C. |
| Pressure | 40 Pa |
| RF frequency | 27 MHz |
| RF power | 50 W |
| Distance between electrodes | 15 mm |
| Electrode area | 615.75 cm$^2$ |

<Silicon Nitride Oxide Film 602>

| | |
|---|---|
| Thickness | 50 nm |
| Kind of gas (flow rate) | |
| $SiH_4$ | (10 sccm) |
| $NH_3$ | (100 sccm) |
| $N_2O$ | (20 sccm) |
| $H_2$ | (400 sccm) |
| Substrate temperature | 300° C. |
| Pressure | 40 Pa |
| RF frequency | 27 MHz |
| RF power | 50 W |
| Distance between electrodes | 30 mm |
| Electrode area | 615.75 cm$^2$ |

As shown in FIG. 15C, hydrogen ions 615 were applied to the c-Si substrate 600 with an ion doping apparatus to form an ion introduction layer 603. As a source gas, 100% hydrogen gas was used, and without mass separation of ionized hydrogen, the ionized hydrogen was accelerated by electric field so as to be introduced into the c-Si substrate 600. Detailed conditions were as follows.

| | |
|---|---|
| Source gas | $H_2$ |
| RF power | 150 W |
| Accelerating voltage | 40 kV |
| Dose | 1.75 × 10$^{16}$ ions/cm$^2$ |

In the ion doping apparatus, three kinds of ion species that are $H^+$, $H_2^+$, and $H_3^+$ are generated from the hydrogen gas, and the c-Si substrate 600 is doped with all of the ion species. The proportion of $H_3^+$ in the ion species generated from the hydrogen gas is about 80%.

After forming the ion introduction layer 603, the c-Si substrate 600 was washed with pure water, and a silicon oxide film 604 having a thickness of 50 nm was formed over the silicon nitride oxide film 602 with a plasma CVD apparatus (see FIG. 15D). As a source gas for the silicon oxide film 604, TEOS and oxygen were used. Film formation conditions of the silicon oxide film 604 were as follows.

<Silicon Oxide Film 604>

| | |
|---|---|
| Thickness | 50 nm |
| Kind of gas (flow rate) | |
| TEOS | (15 sccm) |
| $O_2$ | (750 sccm) |
| Substrate temperature | 300° C. |
| Pressure | 100 Pa |
| RF frequency | 27 MHz |
| RF power | 300 W |
| Distance between electrodes | 14 mm |
| Electrode area | 615.75 cm$^2$ |

A glass substrate 605 was prepared. As the glass substrate 605, an aluminosilicate glass substrate (product name: AN100) manufactured by Asahi Glass Co., Ltd. was used. The glass substrate 605 and the c-Si substrate 600 over which the silicon oxide film 604 is formed were washed. As washing treatment, ultrasonic cleaning in pure water was conducted, and then treatment with pure water containing ozone was conducted.

Next, as shown in FIG. 15E, by making the glass substrate 605 and the c-Si substrate 600 in close contact with each other, the glass substrate 605 and the silicon oxide film 604 were bonded. By this step, the glass substrate 605 and the c-Si substrate 600 are bonded to each other. This step was performed at a room temperature without heat treatment.

Figure 15F:
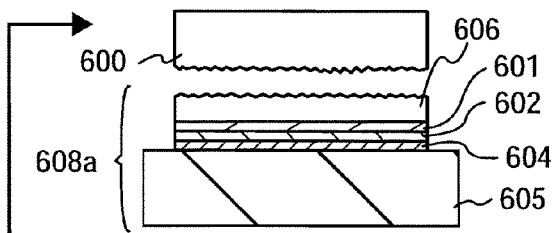
Figure 15F:
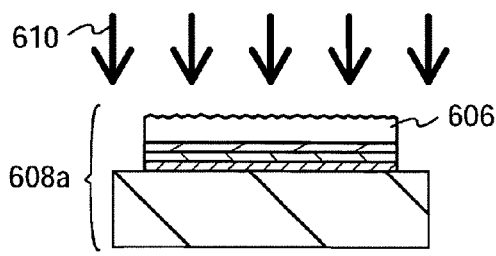
Figure 15F:
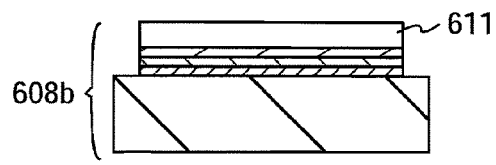
Figure 15F:
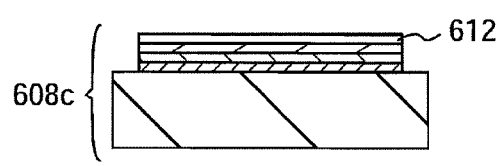

Next, heat treatment was conducted in a diffusion furnace, and the c-Si substrate 600 was separated at the ion introduction layer 603 as shown in FIG. 15F. First, heating was conducted at 600° C. for 20 minutes. Then, the heat temperature was increased to 650° C. and heating was conducted for 6.5 minutes. By this series of heat treatments, a crack was generated at the ion introduction layer 603 in the c-Si substrate 600, so that the c-Si substrate 600 was separated. By heating the c-Si substrate 600 at equal to or higher than 600° C. in this step, crystallinity of a separated silicon layer 606 becomes close to that of a single crystal.

After the heat treatments, the glass substrate 605 and a c-Si substrate 600' were taken out from the diffusion furnace. Since the glass substrate 605 and the c-Si substrate 600 are in the sate of being separated from each other by the heat treatments, an SOI substrate 608a in which the silicon layer 606 separated from the c-Si substrate 600 is fixed to the glass substrate 605 is formed when the c-Si substrate 600' is removed as shown in FIG. 15F. Note that the c-Si substrate 600' corresponds to the c-Si substrate 600 from which the silicon layer 606 is separated.

The SOI substrate 608a has a structure in which the silicon oxide film 604, the silicon nitride oxide film 602, the silicon oxynitride film 601, and the silicon layer 606 are stacked in this order over the glass substrate 605. In this embodiment, the thickness of the silicon layer 606 was approximately 120 nm.

Next, as shown in FIG. 15G the silicon layer 606 of the SOI substrate 608a was irradiated with laser light 610, thereby forming an SOI substrate 608b which includes a silicon layer 611. The silicon layer 611 shown in FIG. 15H corresponds to the silicon layer 606 after irradiation with the laser light 610.

Then, the silicon layer 611 was etched to a thickness of equal to or less than 100 nm; accordingly, an SOI substrate of the present invention was manufactured. Through the above-described process, an SOI substrate 608c shown in FIG. 15I is formed. A silicon layer 612 of the SOI substrate 608c corresponds to the thinned silicon layer 611. Note that in this embodiment, the steps of FIGS. 15A to 15H were conducted and then surface roughness and crystallinity of the silicon layer 606 before laser light irradiation and the silicon layer 611 after irradiation were measured.

The specification of the laser used for irradiation with the laser light 610 of FIG. 15G is as follows.

<Specification of Laser>

| XeCl excimer laser | |
| --- | --- |
| Wavelength | 308 nm |
| Pulse width | 25 nanoseconds (nsec) |
| Repetition rate | 30 Hz |

The laser light 610 was a linear beam whose cross section is linear and which was formed by an optical system including a cylindrical lens or the like. The c-Si substrate 600 was moved relative to the laser light 610 while irradiation with the laser light 610 was conducted. At this time, the scanning speed of the laser light 610 was set at 1.0 mm/sec, and the same region was irradiated with 12 shots of the laser light 610.

Further, the atmosphere of the laser light 610 was set to be an air atmosphere or a nitrogen atmosphere. In this embodiment, the nitrogen atmosphere was formed in such a manner that while irradiation with the laser light 610 is conducted in an air atmosphere, a nitrogen gas is blown to the irradiation surface.

The effect of irradiation with the laser light 610 on planarity and recovery of the crystallinity of the silicon layer 611 was investigated changing the energy density of the laser light 610 in the range of equal to or higher than about 350 mJ/cm$^2$ and equal to or lower than about 750 mJ/cm$^2$. Specific values of the energy density are listed below.

347 mJ/cm$^2$
387 mJ/cm$^2$
431 mJ/cm$^2$
477 mJ/cm$^2$
525 mJ/cm$^2$
572 mJ/cm$^2$
619 mJ/cm$^2$
664 mJ/cm$^2$
706 mJ/cm$^2$
743 mJ/cm$^2$

The planarity of the surface of the silicon layer 611 and the crystallinity of the silicon layer 611 were analyzed by observation with an optical microscope, an atomic force microscope (AFM), and a scanning electron microscope (SEM), by observation of an electron back scatter diffraction pattern (EBSP), and by Raman spectroscopy.

The effect on planarization can be evaluated by images observed with a dynamic force mode (DFM) AFM (hereinafter referred to as AFM images), the measurement values showing surface roughnesses obtained from the AFM images, brightness change of dark field images observed with an optical microscope, images observed with a SEM (hereinafter referred to as SEM images), and Raman intensities.

The effect on crystallinity improvement can be evaluated with Raman shifts, full widths at half maximum (FWHM) of Raman spectra, and EBSP images.

First, the effect on planarization by laser light irradiation is described, and then, the effect on crystallinity improvement is described.

Figure 16:
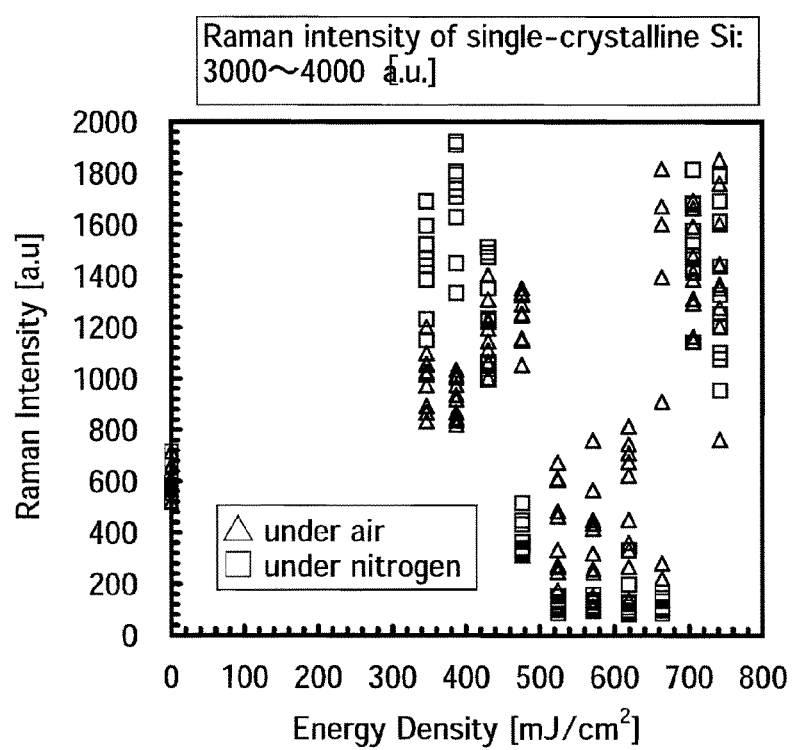
FIG. 16 is a graph plotting Raman scattering intensities of silicon layers against energy density of laser light.

FIG. 16 is a graph showing Raman intensities of the silicon layer 606 before laser light irradiation and the silicon layer 611 after irradiation and showing change of the Raman intensity with respect to the energy density of the laser light 610. Reduction in Raman intensity from the value before laser light irradiation (the value when the energy density is 0 mJ/cm$^2$) means improvement in planarity. From the graph of FIG. 16, it was found that by adjusting the energy density, planarity of a silicon layer can be improved by laser light irradiation in both an air atmosphere and a nitrogen atmosphere.

Figure 17:
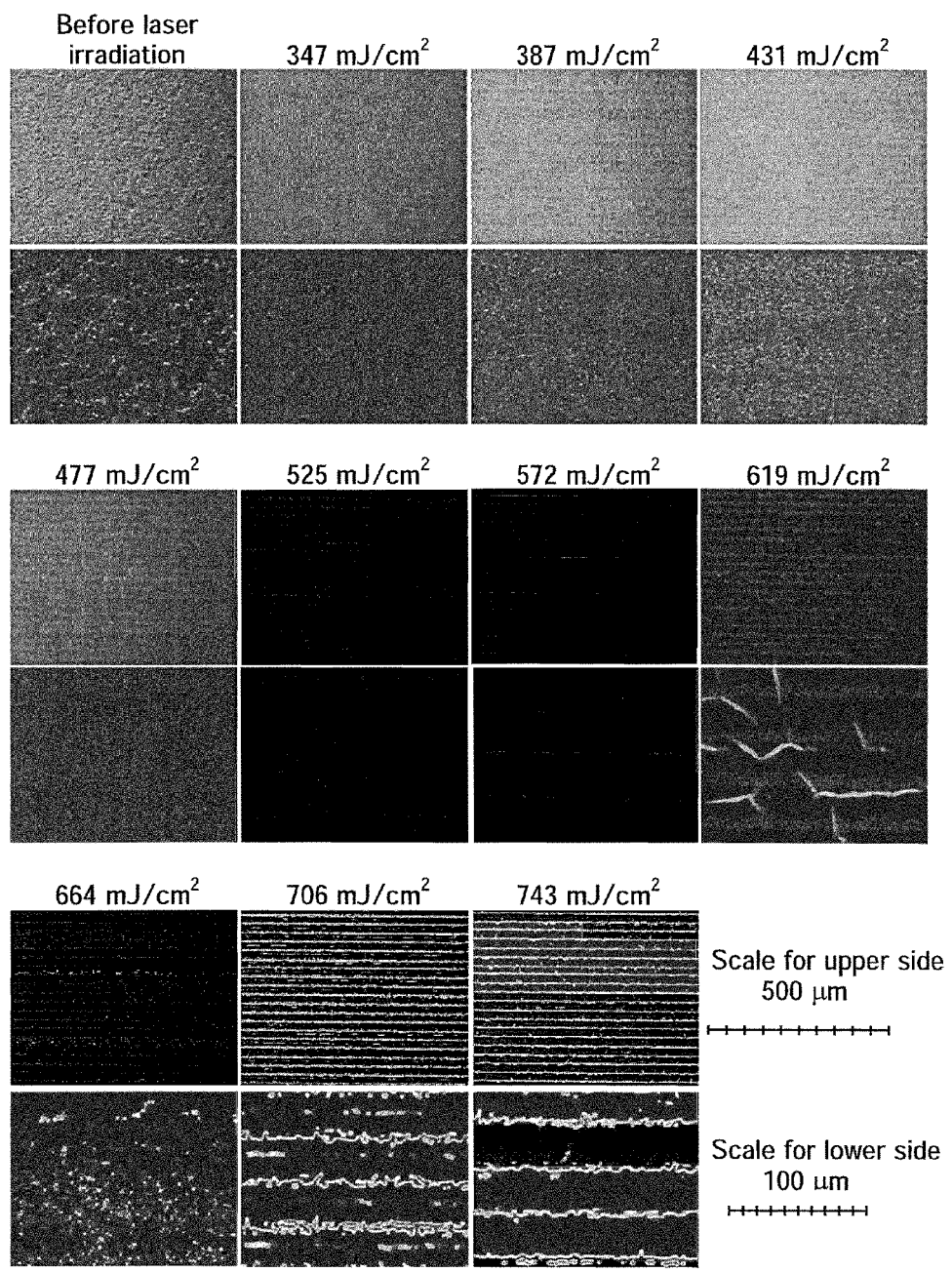
FIG. 17 shows dark field images of silicon layers irradiated with laser light in an air atmosphere, taken with an optical microscope.
Figure 18:
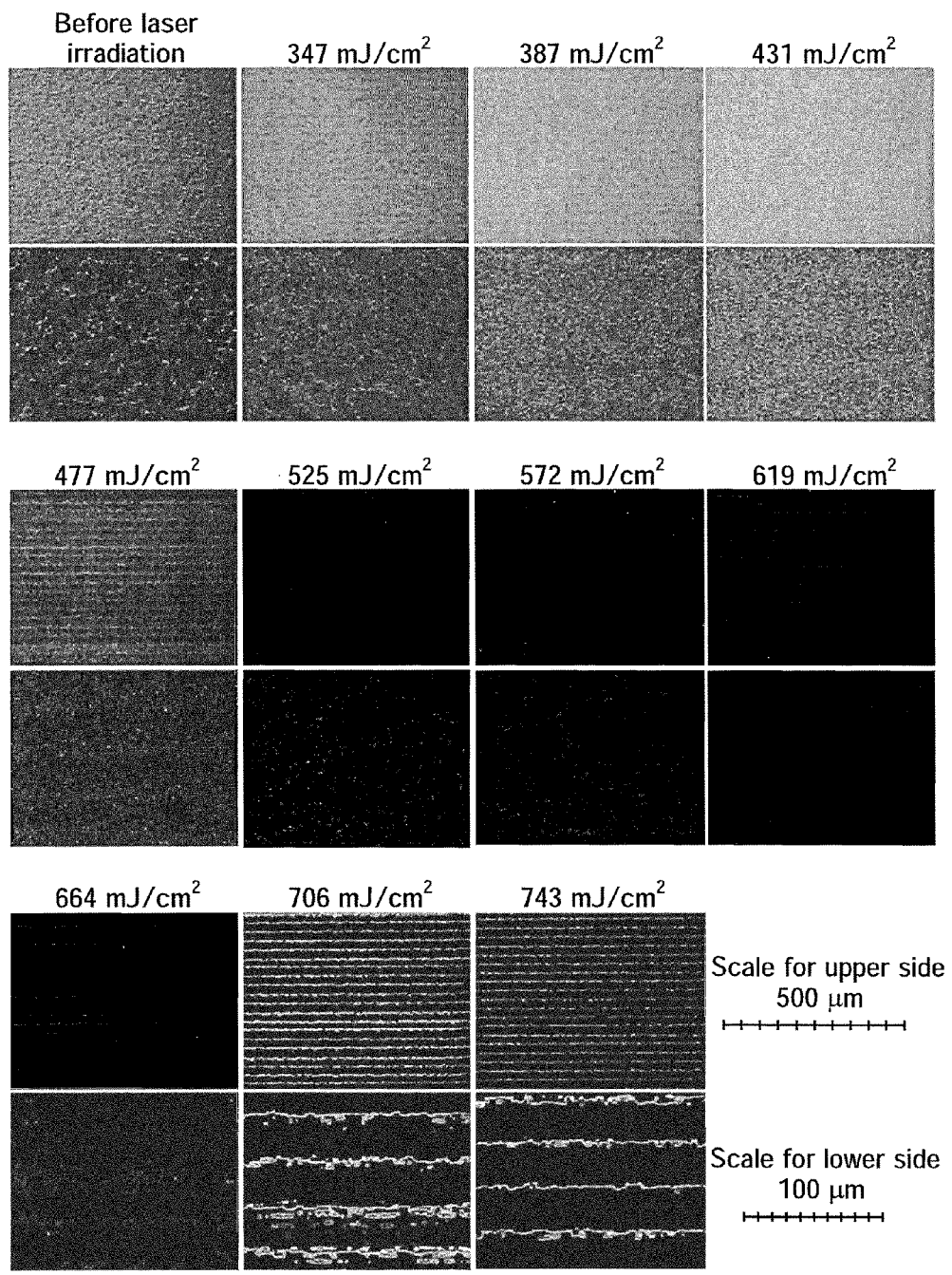
FIG. 18 shows dark field images of silicon layers irradiated with laser light in a nitrogen atmosphere, taken with an optical microscope.

FIG. 17 shows dark field images of the silicon layer 611 irradiated with the laser light in an air atmosphere, which are observed with an optical microscope. FIG. 18 shows dark field images of the silicon layer 611 irradiated with the laser light in a nitrogen atmosphere, which are observed with an optical microscope. FIG. 17 and FIG. 18 also show dark field images of the silicon layer 606 before laser light irradiation. Observation of dark field images is a method in which a sample is irradiated with light from an oblique direction and light scattered or diffracted by the sample is observed. In the case where the surface of a sample is planar, scattering and diffraction of irradiation light is not caused; accordingly, the observed image has low brightness and is black (dark). In FIGS. 17 and 18, since the dark field images of the silicon layer 606 before laser light irradiation are not black, it was found that planarity of the surface of the silicon layer 606 is low. Further, from the dark field images of FIG. 17 and FIG. 18, it was found that by adjusting the energy density, the planarity of the silicon layer 606 can be improved by laser light irradiation in both an air atmosphere and a nitrogen atmosphere.

FIGS. 19A to 19C are SEM images. FIG. 19A is a SEM image of the silicon layer 606 before laser light irradiation. FIG. 19B is a SEM image of the silicon layer 611 which is processed in an air atmosphere. FIG. 19C is a SEM image of the silicon layer 611 which is processed in a nitrogen atmosphere.

In this embodiment, an excimer laser was used as the laser. It is known that at a surface of a polycrystalline silicon film formed by crystallizing an amorphous silicon film with an excimer laser, a ridge (a projection and a depression) with a height close to the thickness of the polycrystalline silicon film is formed. However, from the SEM images of FIGS. 19B and 19C, it was found that the formation of such a large ridge is negligible at the silicon layer 611. In other words, it was found that a beam of a pulsed laser such as an excimer laser is effective for planarization of the silicon layer 606.

Figure 20A:
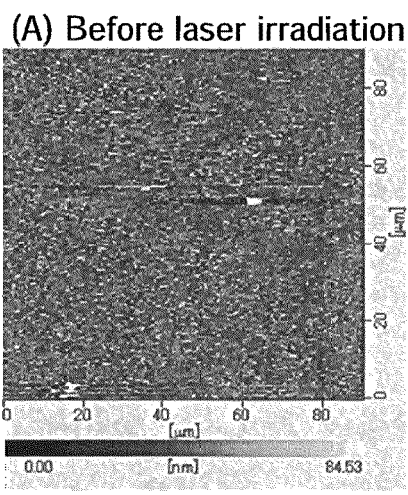
FIGS. 20A to 20E are images of silicon layers observed with an atomic force microscope (AFM)
Figure 20B:
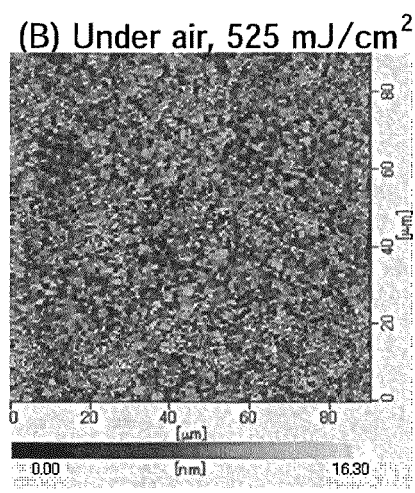
Figure 20C:
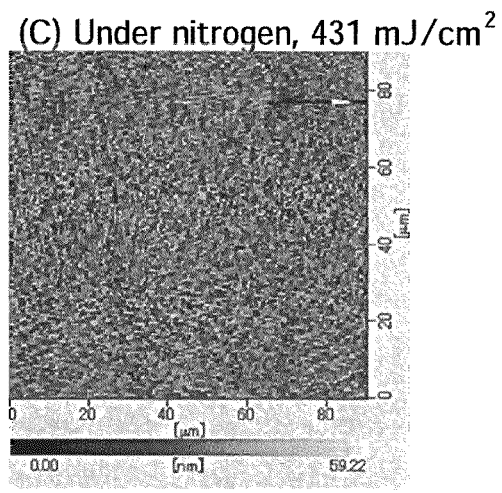
Figure 20D:
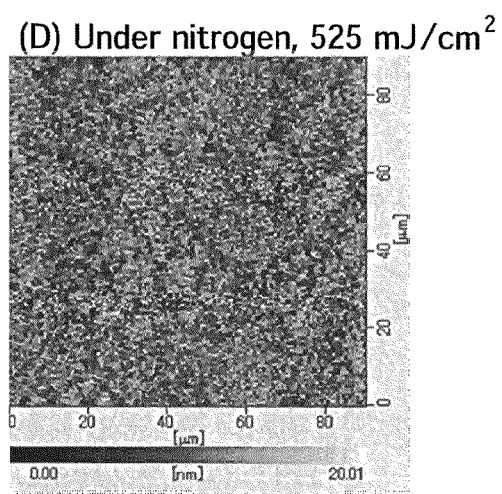
Figure 20E:
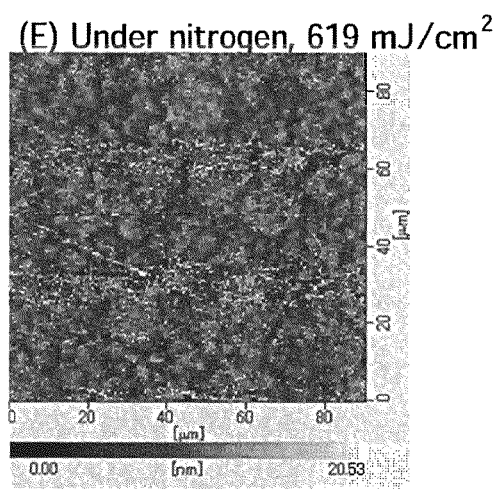
Figure 21A:
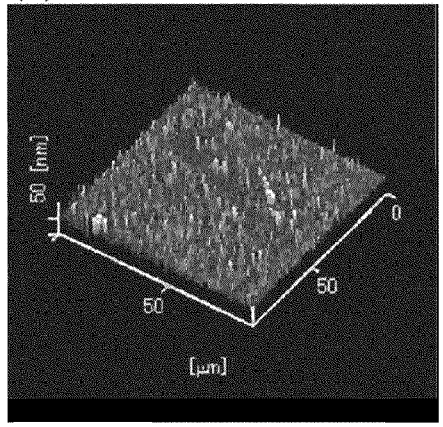
FIGS. 21A to 21E are images of silicon layers observed with an AFM.
Figure 21C:
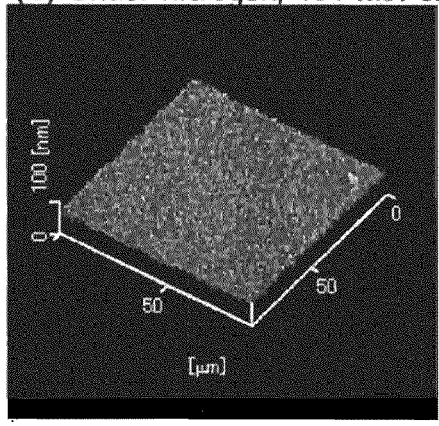
Figure 21B:
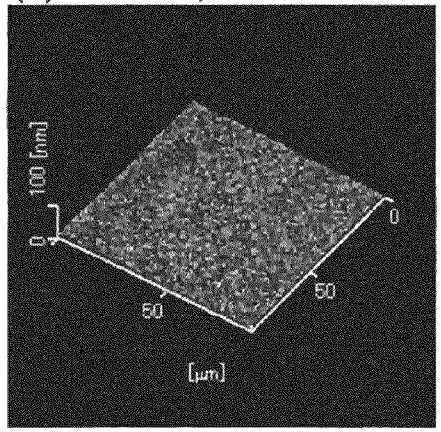
Figure 21D:
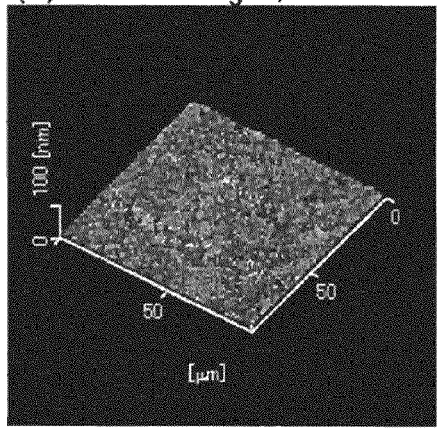
Figure 21E:
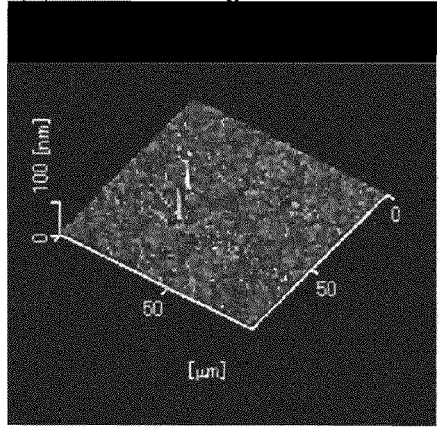

FIGS. 20A to 20E show AFM images observed with an AFM. FIG. 20A is an AFM image of the silicon layer 606 before laser light irradiation. FIGS. 20B to 20E are AFM images of the silicon layer 611 after laser light irradiation, and the irradiation atmosphere and the energy density of laser light were varied in FIGS. 20B to 20E. FIGS. 21A to 21E correspond to bird's eye views of FIGS. 20A to 20E.

Table 1 shows surface roughnesses calculated by the AFM images of FIGS. 20A to 20E. In Table 1, Ra denotes mean surface roughness, RMS denotes the root mean square of surface roughness, and P-V denotes the value of the largest difference in height between peak and valley.

TABLE 1

Surface roughnesses of the silicon layers.

| Silicon layer | Atmosphere | Energy density[b] [mJ/cm$^2$] | Ra [nm] | RMS [nm] | P-V [nm] |
|---|---|---|---|---|---|
| 606[a] | — | — | 7.2 | 11.5 | 349.2 |
| 611 | nitrogen | 431 | 5.4 | 7.0 | 202.8 |
| 611 | air | 525 | 1.9 | 2.5 | 33.7 |
| 611 | nitrogen | 525 | 2.3 | 3.0 | 38.1 |
| 611 | nitrogen | 619 | 1.9 | 2.8 | 145.7 |

[a]Before laser light irradiation.
[b]Energy density of the laser light.

The Ra of the silicon layer 606 before laser light irradiation is equal to or more than 7 nm and the RMS thereof is equal to or more than 11 nm; these values are close to the values of a polycrystalline silicon film formed by crystallizing amorphous silicon having a thickness of about 60 nm with an excimer laser. The present inventors have already found that, when using such a polycrystalline silicon film, the thickness of an applicable gate insulating layer is larger than the polycrystalline silicon film. Therefore, even when the silicon layer 606 which is not subjected to laser irradiation processing is thinned, it is difficult to form a gate insulating layer having a thickness of equal to or less than 10 nm on the surface of the silicon layer 606. Accordingly, it is difficult to manufacture a transistor with high performance, which utilizes characteristics of thinned single-crystalline silicon.

On the other hand, the Ra of the silicon layer 611 irradiated with the laser light is decreased to about 2 nm, and the RMS thereof is decreased to about 2.5 nm to 3 nm. Therefore, by thinning the silicon layer 611 having such planarity, a transistor with high performance, which utilizes characteristics of a thinned single-crystalline silicon layer can be manufactured.

Hereinafter, crystallinity improvement by laser light irradiation will be described.

Figure 22:
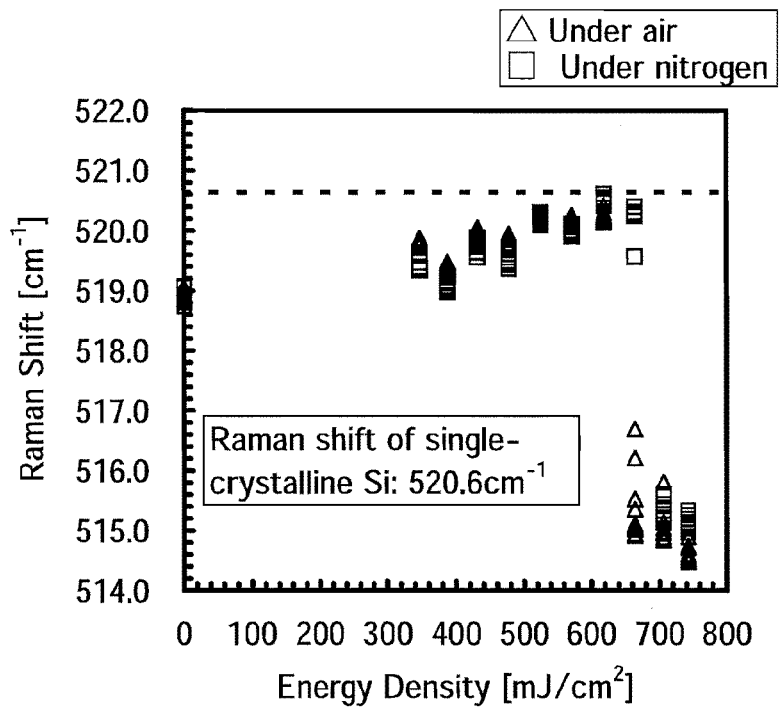
FIG. 22 is a graph plotting of Raman shifts of silicon layers against energy density of laser light.

FIG. 22 is a graph showing Raman shifts of the silicon layer 606 before laser light irradiation and the silicon layer 611 after irradiation and showing variation of Raman shifts with respect to the energy density of the laser light. As the wavenumber of the Raman shift of the silicon layer is closer to 520.6 cm$^{-1}$ that is the wavenumber of the Raman shift of single-crystalline silicon, the silicon layer has a higher crystallinity. From the graph of FIG. 22, it was found that by adjusting the energy density, crystallinity of the silicon layer 611 can be improved by laser light irradiation in an air atmosphere and a nitrogen atmosphere.

Figure 23:
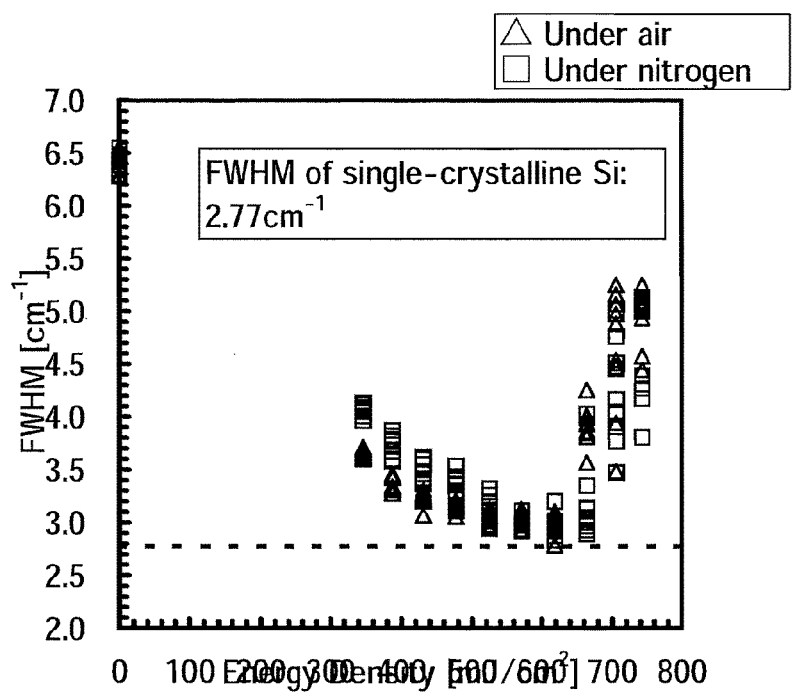
FIG. 23 is a graph plotting full widths at half maximum of Raman spectra of silicon layers against energy density of laser light.

FIG. 23 is a graph showing full widths at half maximum of Raman spectra of the silicon layer 606 before laser light irradiation and the silicon layer 611 after irradiation and showing variation of the FWHMs with respect to the energy density of the laser light 610. As the wavenumber of the FWHM of the silicon layer is closer to 2.77 cm$^{-1}$ that is the wavenumber of the FWHM of single-crystalline silicon, the silicon layer has a higher crystallinity. From the graph of FIG. 23, it was found that by adjusting the energy density, crystallinity of the silicon layer 611 can be improved by laser light irradiation in an air atmosphere and a nitrogen atmosphere.

FIGS. 24A to 24C are inverse pole figure (IPF) maps obtained from the measurement data of the EBSP of the silicon layer surface. FIG. 24D is a color code map showing the relationship between colors of the IPF maps and crystal orientation, in which the orientation of each crystal is color-coded. FIGS. 24A, 24B, and 24C are IPF maps of the silicon layer 606 before laser light irradiation, the silicon layer 611 after laser light irradiation in an air atmosphere, and the silicon layer 611 after laser light irradiation in a nitrogen atmosphere, respectively.

According to the IPF maps of FIGS. 24A to 24C, when the energy density is in a range of equal to or higher than 380 mJ/cm$^2$ and equal to or lower than 620 mJ/cm$^2$, the plane orientation of the silicon layer is not disordered from before laser light irradiation to after laser light irradiation; the plane orientation of the surface of the silicon layer 611 is (100) which is the same as the plane orientation of the single-crystalline silicon substrate 600; and crystal grain boundaries do not exist. This can be understood by the fact that most part of the IPF maps is expressed by the color which exhibits (100) direction in the color code map of FIG. 24D (red color in the color code map). Since the crystal orientation of the silicon layer 611 is disordered at an energy density of 743mJ/cm$^2$ in both an air atmosphere and a nitrogen atmosphere, it is considered that the silicon layer 611 be microcrystallized. The orientation ratios of the silicon layers 606 and 611 are illustrated in monochrome shade in FIGS. 46A to 46C-4 which are prepared from the IPF maps shown in FIGS. 24A to 24C. As shown in these figures, when the energy density is in a range of equal to or higher than 380 mJ/cm$^2$ and equal to or lower than 620 mJ/cm$^2$, the orientation direction of the silicon layer after the laser light irradiation is the same as that before the laser light irradiation with respect to all orientations, and the orientation ratio is negligibly changed. These results mean that the orientation of the silicon layer is not disordered by the laser light irradiation; the plane orientation is {100} which is the same as that of the single-crystalline silicon substrate 600 employed and is maintained; and crystal grain boundaries do not exist. On the other hand, in the cases of the energy density of 743 mJ/cm$^2$ under both nitrogen and air atmospheres, a change is observed in shade of the IPF maps (orientation ratio) when the IPF map after the laser light irradiation is compared with that before the laser light irradiation, which reveals that the crystal orientation of the silicon layer 611 is disordered. Additionally, since the value of CI (Confidence Index) at the measurement is low, it is considered that the silicon layer 611 is microcrystallized by the laser light irradiation with a high energy density.

Further, many dots which are areas with a low CI value are distributed in the IPF map of the silicon layer 606. The area with a low CI value in the IPF map of the silicon layer 611 is smaller than that of the silicon layer 606. Note that the CI value is an index value showing reliability and accuracy of data with which crystal orientation is determined. The CI value is decreased by the presence of crystal boundary, crystal defects, and the like. In other words, it can be concluded that when the area with a low CI value is smaller, the crystallinity is higher.

From Table 1 and FIGS. 16 to 24D, it was found that planarity of a silicon layer which is separated from a single-crystalline silicon substrate can be improved and crystallinity thereof can be recovered by laser light irradiation in an air atmosphere and a nitrogen atmosphere. In this embodiment, it was found that the energy density of the laser light with which the improvement in planarity and recovery of crystallinity can be realized is equal to or higher than 500 mJ/cm$^2$ and equal to or lower than 600 mJ/cm$^2$ in the case of the air atmosphere and is equal to or higher than 400 mJ/cm$^2$ and equal to or lower than 600 mJ/cm$^2$ in the case of the nitrogen atmosphere, and that the applicable range of energy density is wider in the case of the nitrogen atmosphere than the case of the air atmosphere.

[Embodiment 2]

In this embodiment, the surface roughness and crystallographic properties of a semiconductor layer of an SOI substrate before laser light irradiation and after laser light irradiation will be described. First, a manufacturing method of an SOI substrate of this embodiment mode will be described with reference to FIGS. 25A to 25I. The manufacturing method shown in FIGS. 25A to 25I corresponds to the manufacturing method described in Embodiment Mode 4.

Figure 25A:
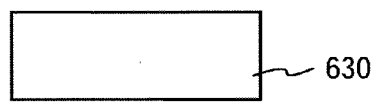
Figure 25A:
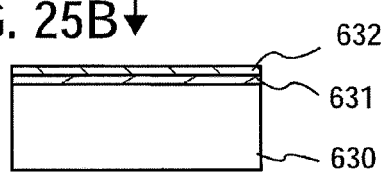
Figure 25A:
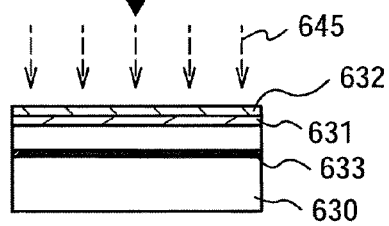
Figure 25A:
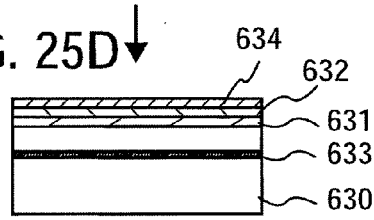
Figure 25A:
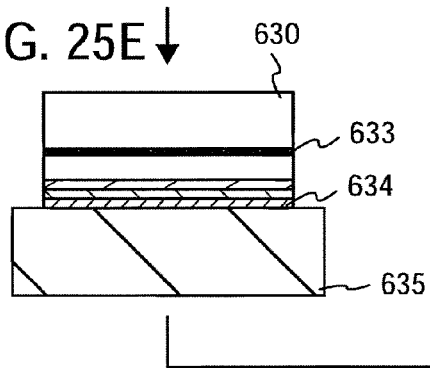

A single-crystalline silicon substrate 630 was prepared as a semiconductor substrate (see FIG. 25A). The single-crystalline silicon substrate 630 was a p-type silicon substrate of 5 inches in diameter, and the plane orientation thereof was (100). Hereinafter, the single-crystalline silicon substrate 630 is referred to as a "c-Si substrate 630."

The c-Si substrate 630 was washed with pure water and dried. Then, a silicon oxynitride film 631 was formed over the c-Si substrate 630 with a parallel plate type plasma CVD apparatus, and a silicon nitride oxide film 632 was formed over the silicon oxynitride film 631 (see FIG. 25B).

The silicon oxynitride film 631 and the silicon nitride oxide film 632 were continuously formed with the parallel plate type plasma CVD apparatus without exposing the c-Si substrate 630 to the air. At that time, film formation conditions were as follows. Here, before forming the silicon oxynitride film 631, a step of removing an oxide film of the c-Si substrate 630 by washing the c-Si substrate 630 with a hydrofluoric acid for 60 seconds was performed.

<Silicon Oxynitride Film 631>

| Thickness | 50 nm |
| --- | --- |
| Kind of gas (flow rate) | |
| $SiH_4$ | (4 sccm) |
| $N_2O$ | (800 sccm) |
| Substrate temperature | 400° C. |
| Pressure | 40 Pa |
| RF frequency | 27 MHz |
| RF power | 50 W |
| Distance between electrodes | 15 mm |
| Electrode area | 615.75 cm² |

<Silicon Nitride Oxide Film 632>

| Thickness | 50 nm |
| --- | --- |
| Kind of gas (flow rate) | |
| $SiH_4$ | (10 sccm) |
| $NH_3$ | (100 sccm) |
| $N_2O$ | (20 sccm) |
| $H_2$ | (400 sccm) |
| Substrate temperature | 300° C. |
| Pressure | 40 Pa |
| RF frequency | 27 MHz |
| RF power | 50 W |
| Distance between electrodes | 30 mm |
| Electrode area | 615.75 cm² |

As shown in FIG. 25C, hydrogen ions 645 were applied to the c-Si substrate 630 with an ion doping apparatus, so that an ion introduction layer 633 is formed. As a source gas, 100% hydrogen gas was used. Without mass separation, ionized hydrogen included in a plasma was accelerated by electric field so as to be introduced into the c-Si substrate 630. Detailed conditions were as follows.

| Source gas | $H_2$ |
| --- | --- |
| RF power | 150 W |
| Accelerating voltage | 40 kV |
| Dose | $1.75 \times 10^{16}$ ions/cm² |

Three kinds of ion species that are $H^+$, $H_2^+$, and $H_3^+$ are generated from the hydrogen gas in the ion doping apparatus, and the c-Si substrate 630 is doped with all of the ion species. The proportion of $H_3^+$ in the ion species generated from the hydrogen gas is about 80%.

After forming the ion introduction layer 633, the c-Si substrate 630 was washed with pure water, and a silicon oxide film 634 having a thickness of 50 nm was formed over the silicon nitride oxide film 632 with a plasma CVD apparatus (see FIG. 25D). As a source gas for the silicon oxide film 634, TEOS and oxygen were used. Film formation conditions of the silicon oxide film 634 were as follows.

<Silicon Oxide Film 634>

| Thickness | 50 nm |
| --- | --- |
| Kind of gas (flow rate) | |
| TEOS | (15 sccm) |
| $O_2$ | (750 sccm) |
| Substrate temperature | 300° C. |
| Pressure | 100 Pa |
| RF frequency | 27 MHz |
| RF power | 300 W |
| Distance between electrodes | 14 mm |
| Electrode area | 615.75 cm² |

A glass substrate 635 was prepared. As the glass substrate 635, an aluminosilicate glass substrate (product name: AN100) manufactured by Asahi Glass Co., Ltd. was used. The glass substrate 635 and the c-Si substrate 630 over which the silicon oxide film 634 is formed was washed. As washing treatment, ultrasonic cleaning in pure water was conducted, and then treatment with pure water containing ozone was conducted.

Next, as shown in FIG. 25E, by making the glass substrate 635 and the c-Si substrate 630 in close contact with each other, the glass substrate 635 and the silicon oxide film 634 are bonded. By this step, the glass substrate 635 and the c-Si substrate 630 are bonded to each other. This step was performed at a room temperature without heat treatment.

Figure 25F:
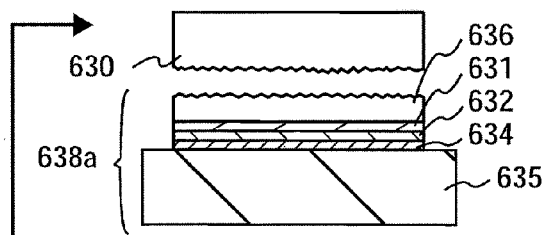
Figure 25F:
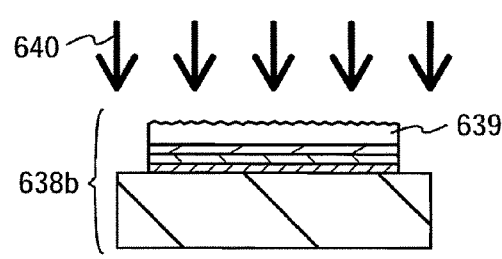
Figure 25F:
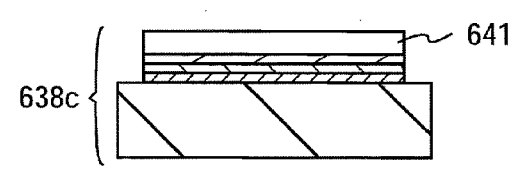
Figure 25F:
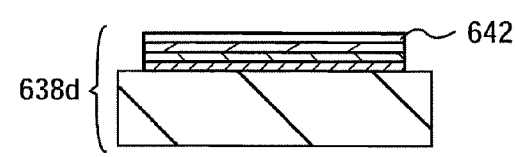

Next, heat treatment is conducted in a diffusion furnace, and the c-Si substrate 630 is separated at the ion introduction layer 633 as shown in FIG. 25F. First, heat treatment was conducted at 600° C. for 20 minutes. Then, the heat temperature was increased to 650° C. and heat treatment was conducted for 6.5 minutes. By this series of heat treatments, a crack is generated at the ion introduction layer 633 in the c-Si substrate 630, so that the c-Si substrate 630 is separated. By heating the c-Si substrate 630 at equal to or higher than 600° C. in this step, a crystal structure of a separated silicon layer 636 can become close to that of a single crystal.

After the heat treatments, the glass substrate 635 and a c-Si substrate 630' were taken out from the diffusion furnace. The glass substrate 635 and the c-Si substrate 630 are in the state of being separated from each other by the heat treatments. An SOI substrate 638a in which the silicon layer 636 separated from the c-Si substrate 630 is fixed to the glass substrate 635 is formed when the c-Si substrate 630' is removed as shown in FIG. 25F. Note that the c-Si substrate 630' corresponds to the c-Si substrate 630 from which the silicon layer 636 is separated.

The SOI substrate 638a has a multilayer structure in which the silicon oxide film 634, the silicon nitride oxide film 632, the silicon oxynitride film 631, and the silicon layer 636 are stacked in this order over the glass substrate 635. In this embodiment, the thickness of the silicon layer 636 was approximately 120 nm.

Next, the silicon layer 636 was thinned by dry etching to form a silicon layer 639. As an etching gas, a mixed gas of $SF_6$ and $O_2$ was used. By this etching, the thickness of the silicon layer 636 was thinned to be from 120 nm to 100 nm. The SOI substrate 638b of FIG. 25G is a substrate including the thinned silicon layer 639.

Next, as shown in FIG. 25G the silicon layer 639 of the SOI substrate 638b was irradiated with laser light 640, thereby forming an SOI substrate 638c which includes a silicon layer 641. The silicon layer 641 shown in FIG. 25H corresponds to the silicon layer 639 after irradiation with the laser light 640. Then, the silicon layer 641 was etched to have a smaller thickness. Through the above-described process, an SOI substrate 638d shown in FIG. 25I was formed. A silicon layer 642 of the SOI substrate 638d corresponds to the thinned silicon layer 641. Note that in this embodiment, the steps of FIGS. 25A to 25H were conducted and then surface roughness and crystallinity of the silicon layer 639 before laser light irradiation and the silicon layer 641 after irradiation were measured.

The specification of the laser used for irradiation with the laser light 640 of FIG. 25G was as follows.

<Specification of Laser>

| XeCl excimer laser | |
| --- | --- |
| Wavelength | 308 nm |
| Pulse width | 25 nanoseconds (nsec) |
| Repetition rate | 30 Hz |

The laser light 640 was a linear beam whose beam spot was linear and which was formed by an optical system including a cylindrical lens or the like. The c-Si substrate 630 was moved relative to the laser light 640 while irradiation with the laser light 640 was conducted. At this time, the scanning speed of the laser light 640 was set at 1.0 mm/sec, and the same region was irradiated with 12 shots of the laser light 640.

Further, the atmosphere of the laser light 640 was set to be an air atmosphere or a nitrogen atmosphere. In this embodiment, the nitrogen atmosphere was formed in such a manner that while irradiation with the laser light 640 is conducted in an air atmosphere, a nitrogen gas is blown to the irradiation surface.

The effect of the irradiation with the laser light 640 on planarization and improvement in crystallinity of the silicon layer 641 was investigated changing the energy density of the laser light 640 in the range of equal to or higher than about 360 mJ/cm$^2$ and equal to or lower than about 750 mJ/cm$^2$. Specific values of the energy density are listed below.

362 mJ/cm$^2$
404 mJ/cm$^2$
448 mJ/cm$^2$
495 mJ/cm$^2$
542 mJ/cm$^2$
590 mJ/cm$^2$
636 mJ/cm$^2$
680 mJ/cm$^2$
720 mJ/cm$^2$
754 mJ/cm$^2$

First, the effect on planarization by laser light irradiation is described, and then, the effect on crystallinity improvement is described.

Figure 26:
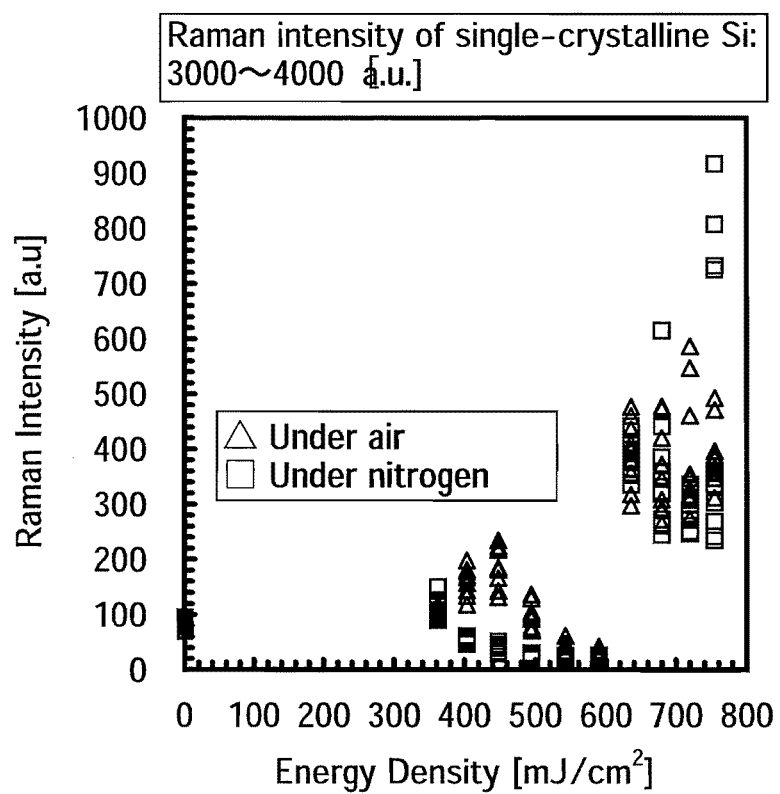
FIG. 26 shows variation in Raman scattering intensities of silicon layers with respect to the energy density of laser light.

FIG. 26 is a graph showing Raman intensities of the silicon layer 639 before laser light irradiation and the silicon layer 641 after irradiation and showing change of the Raman intensity with respect to the energy density of the laser light. From the graph of FIG. 26, it was found that by adjusting the energy density, planarity can be improved by laser light irradiation in both an air atmosphere and a nitrogen atmosphere.

Figure 27:
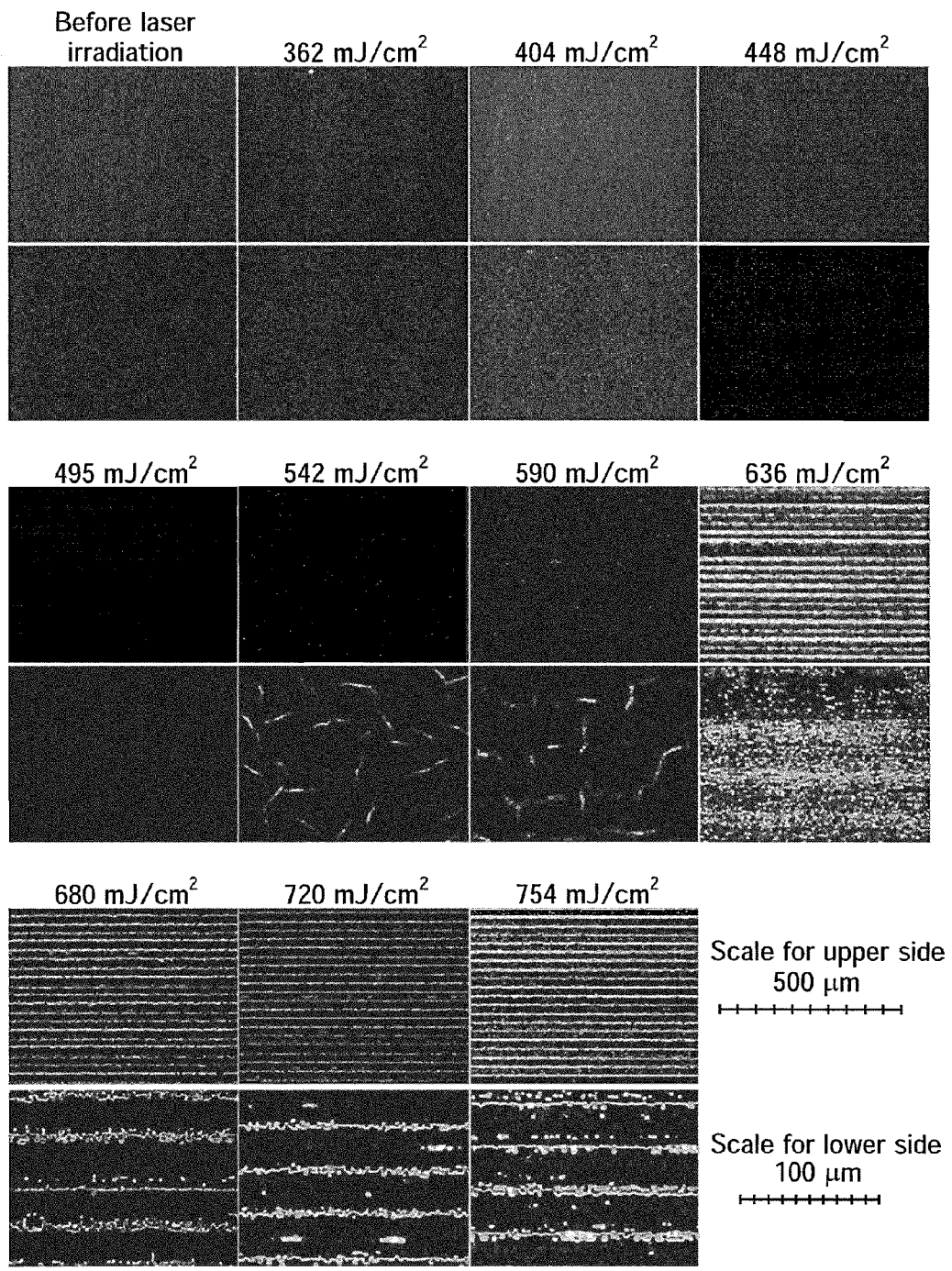
FIG. 27 shows dark field images of silicon layers irradiated with laser light in an air atmosphere, taken with an optical microscope.
Figure 28:
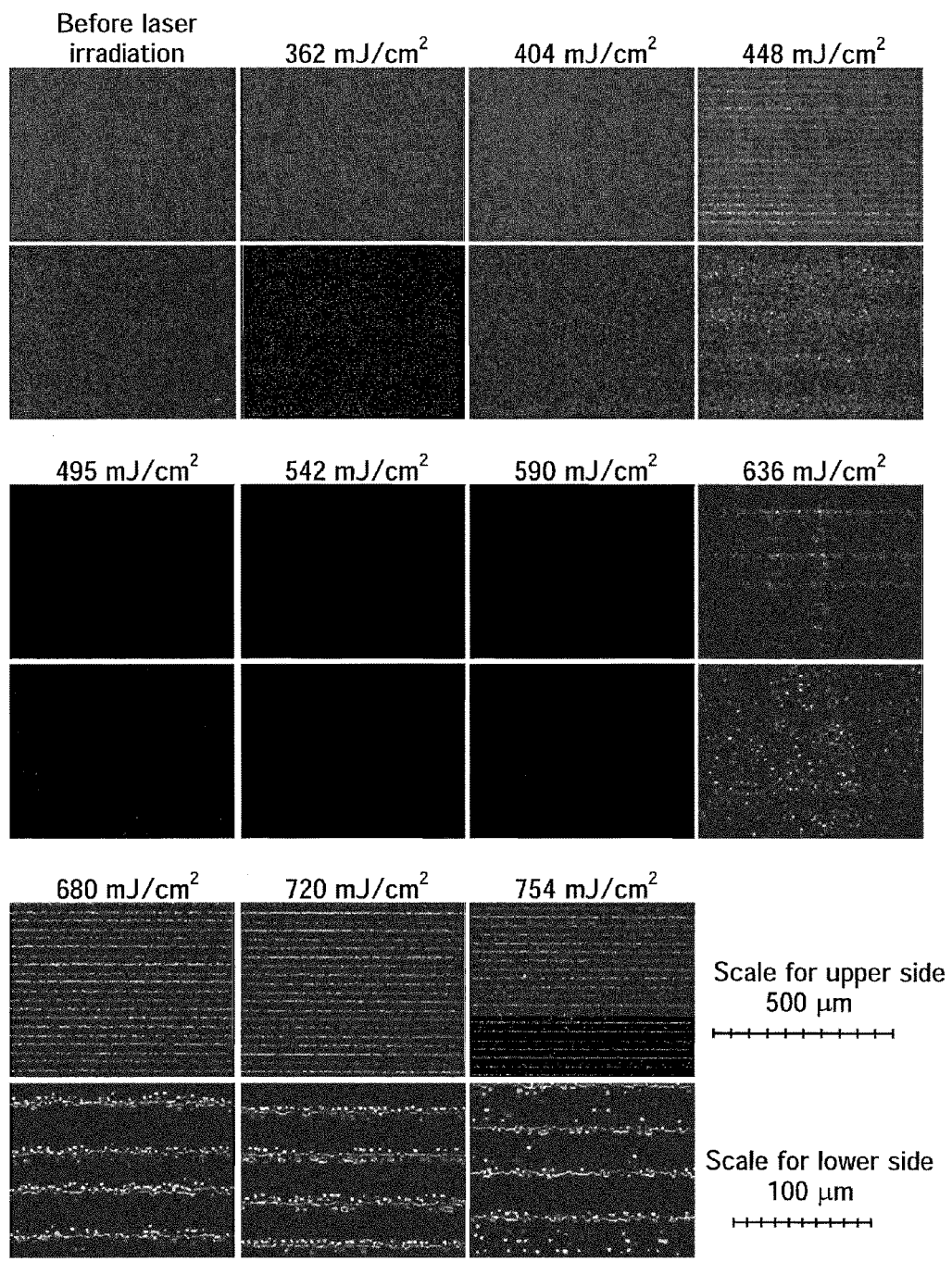
FIG. 28 shows dark field images of silicon layers irradiated with laser light in a nitrogen atmosphere, taken with an optical microscope.

FIG. 27 shows dark field images of the silicon layer 641 irradiated with the laser light in an air atmosphere, which were observed with an optical microscope. FIG. 28 shows dark field images of the silicon layer 641 irradiated with the laser light in a nitrogen atmosphere, which were observed with an optical microscope. FIG. 27 and FIG. 28 also show dark field images of the silicon layer 639 before laser light irradiation. From the dark field images of FIG. 27 and FIG. 28, it was found that by adjusting the energy density, planarity can be improved by laser light irradiation in both an air atmosphere and a nitrogen atmosphere.

FIGS. 29A to 29C are SEM images of the silicon layers. FIG. 29A is a SEM image of the silicon layer 639 before laser light irradiation. FIG. 29B is a SEM image of the silicon layer 641 which was processed in an air atmosphere. FIG. 29C is a SEM image of the silicon layer 641 which was processed in a nitrogen atmosphere.

When the energy density is 448 mJ/cm$^2$, a large ridge was formed at a surface of the silicon layer 641 as shown in FIG. 29B. However, by adjusting the energy density, formation of a large ridge at the surface of the silicon layer 641 can be prevented in both cases of the air atmosphere and the nitrogen atmosphere. In other words, it was found that a beam of a pulsed laser such as an excimer laser is effective for planarization of the silicon layer 639.

Figure 30A:
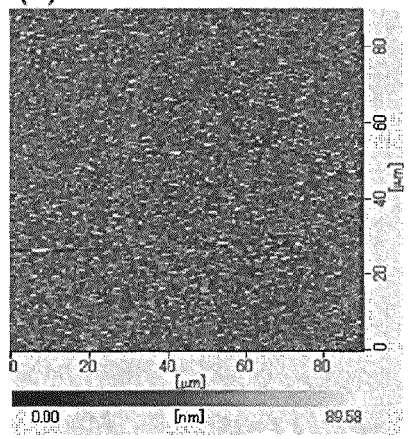
FIGS. 30A to 30E are images of silicon layers observed with an AFM.
Figure 30B:
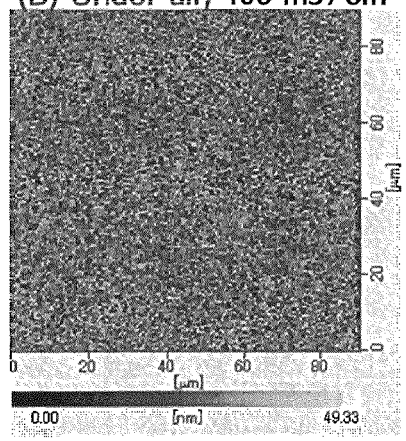
Figure 30C:
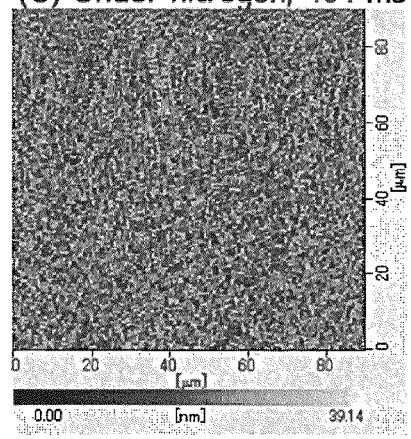
Figure 30D:
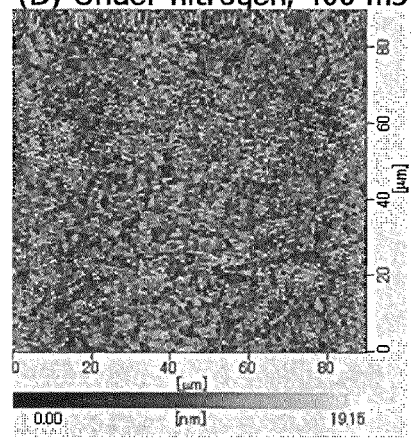
Figure 30E:
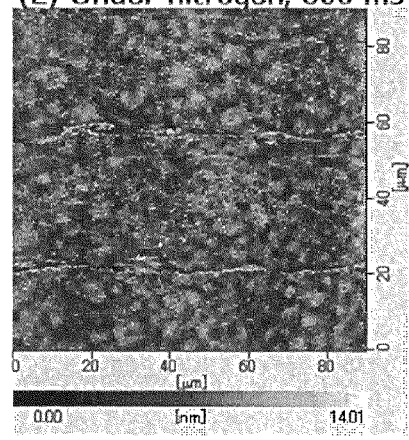
Figure 31A:
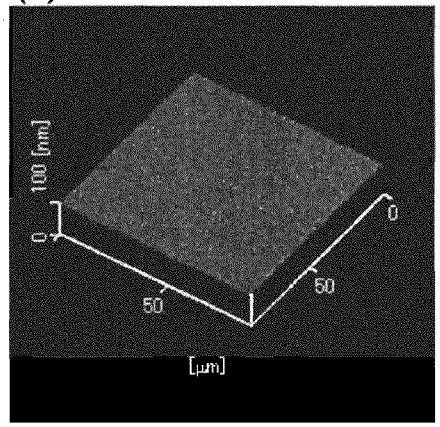
FIGS. 31A to 31E are images of silicon layers observed with an AFM.
Figure 31B:
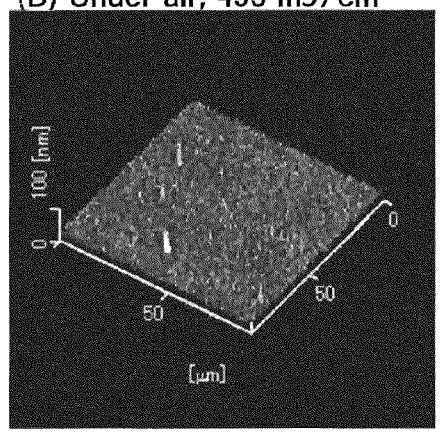
Figure 31C:
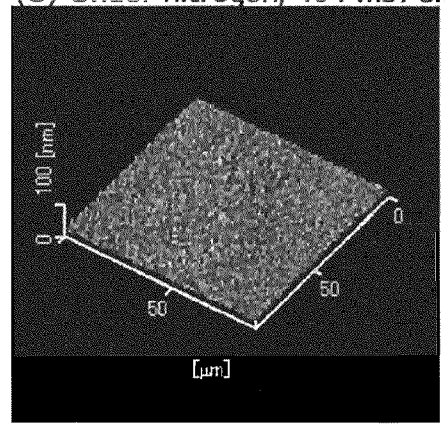
Figure 31D:
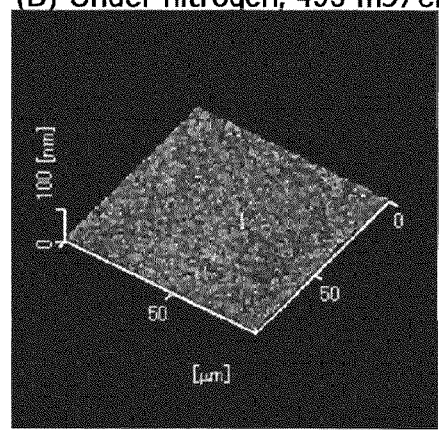
Figure 31E:
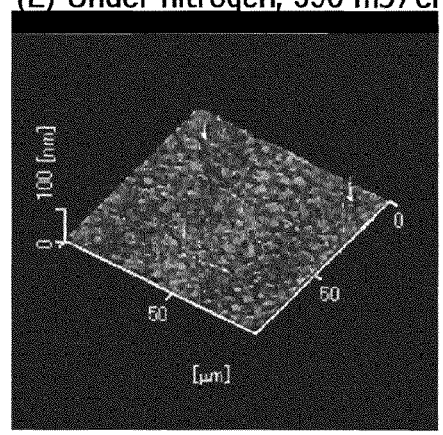

FIGS. 30A to 30E show AFM images observed with an atomic force microscope. FIG. 30A is an AFM image of the silicon layer 639 before laser light irradiation. FIGS. 30B to 30E are AFM images of the silicon layer 641 after laser light irradiation, and the irradiation atmosphere and the energy density of laser light are varied in FIGS. 30B to 30E. FIGS. 31A to 31E correspond to bird's eye views of FIGS. 30A to 30E.

Table 2 shows surface roughnesses calculated based on the AFM images of FIGS. 30A to 30E. In Table 2, Ra denotes surface roughness, RMS denotes the root mean square of surface roughness, and P-V denotes the value of the largest difference in height between peak and valley.

TABLE 2

Surface roughnesses of the silicon layers.

| Silicon layer | Atmosphere | Energy density[b] [mJ/cm$^2$] | Ra [nm] | RMS [nm] | P-V [nm] |
| --- | --- | --- | --- | --- | --- |
| 639[a] | — | — | 6.7 | 10.4 | 336.0 |
| 611 | nitrogen | 404 | 4.9 | 6.1 | 63.4 |
| 611 | air | 495 | 5.6 | 7.2 | 169.6 |
| 611 | nitrogen | 495 | 2.2 | 2.8 | 67.5 |
| 611 | nitrogen | 590 | 1.3 | 1.7 | 92.4 |

[a]Before laser light irradiation.
[b]Energy density of the laser light.

The Ra of the silicon layer 639 before laser light irradiation was equal to or more than 6 nm and the RMS thereof is equal to or more than 10 nm. However, the Ra of the silicon layer 641 irradiated with the laser light was decreased to about 1 nm to 2 nm, and the RMS thereof was decreased to about 2 nm to 3 nm. Therefore, by thinning the silicon layer 641 having such planarity, a transistor with high performance, which utilizes characteristics of a thinned single-crystalline silicon layer can be manufactured.

Here, the silicon layer 639 corresponds to the silicon layer formed by thinning the silicon layer 606 of Embodiment 1. In other words, the silicon layer 606 corresponds to the silicon layer 639 before thinning. The surface roughnesses of the silicon layers 606 and 639 shown in Table 1 and Table 2 show that there is no significant improvement in planarity between before and after thinning. From this observation, it can be understood that thinning a silicon layer after laser light irradiation is very effective for forming a thin silicon layer with high surface planarity.

Hereinafter, crystallinity improvement by laser light irradiation will be considered.

Figure 32:
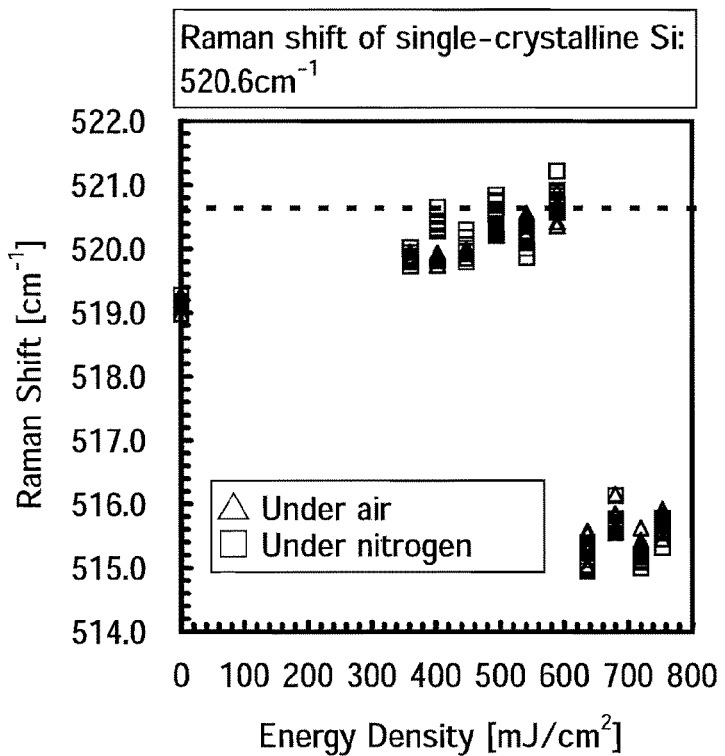
FIG. 32 is a graph plotting Raman shifts of silicon layers against energy density of laser light.

FIG. 32 is a graph showing Raman shifts of the silicon layer 639 before laser light irradiation and the silicon layer 641 after irradiation and showing variation of Raman shifts with respect to the energy density of the laser light. As the wavenumber of the Raman shift of the silicon layer is closer to 520.6 cm$^{-1}$ that is the wavenumber of the Raman shift of single-crystalline silicon, the silicon layer has a higher crystallinity. From the graph of FIG. 32, it was found that by adjusting the energy density, crystallinity of the silicon layer 641 can be improved by laser light irradiation in an air atmosphere and a nitrogen atmosphere.

Figure 33:
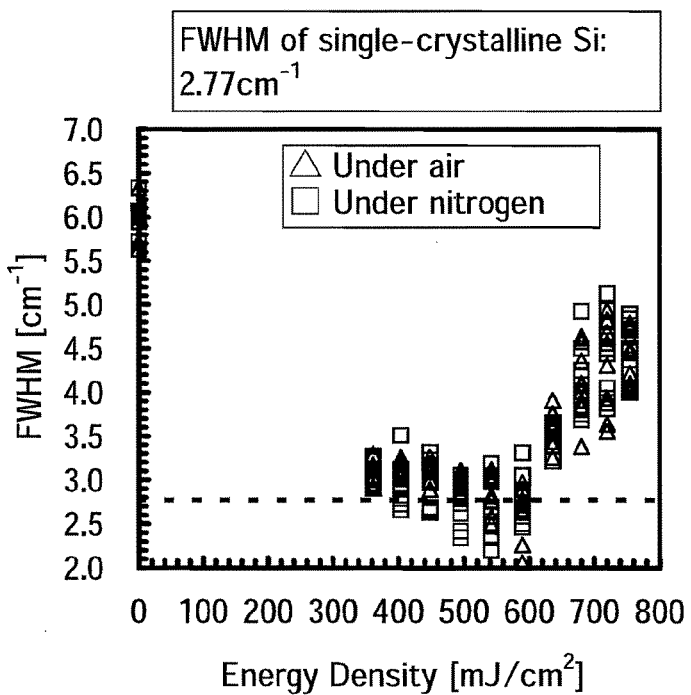
FIG. 33 is a graph plotting FWHM of Raman spectra of silicon layers against energy density of laser light.

FIG. 33 is a graph showing full widths at half maximum of Raman spectra of the silicon layer 639 before laser light irradiation and the silicon layer 641 after irradiation and showing variation of the FWHMs with respect to the energy density of the laser light 640. As the wavenumber of the FWHM of the silicon layer is closer to 2.77 cm$^{-1}$ that is the wavenumber of the FWHM of single-crystalline silicon, the silicon layer has a higher crystallinity. From the graph of FIG. 33, it was found that by adjusting the energy density, crystallinity can be improved by laser light irradiation in an air atmosphere and a nitrogen atmosphere.

FIGS. 34A to 34C are IPF maps obtained from the measurement results of the EBSP of the silicon layer surface. FIG. 34D is the same color code map as FIG. 24D. FIGS. 34A, 34B, and 34C are IPF maps of the silicon layer 639 before laser light irradiation, the silicon layer 641 after laser light irradiation in an air atmosphere, and the silicon layer 641 after laser light irradiation in a nitrogen atmosphere, respectively.

According to the IPF maps of FIGS. 34A to 34C, when the energy density is in a range of equal to or higher than 350 mJ/cm$^2$ and equal to or lower than 690 mJ/cm$^2$, the plane orientation of the silicon layer is not disordered from before laser light irradiation to after laser light irradiation; the plane orientation of the surface of the silicon layer 641 is (100) which is the same as the plane orientation of the single-crystalline silicon substrate 600; and crystal grain boundaries do not exist. This can be understood by the fact that most part of the IPF maps is expressed by the color which exhibits (100) direction in the color code map of FIG. 34D (red color in the color code map). Further, many dots which are areas with a low CI value are distributed in the IPF map of the silicon layer 639. The area with a low CI value in the IPF map of the silicon layer 641 is smaller than that of the silicon layer 639.

Since the crystal orientation of the silicon layer 641 is disordered at an energy density of 680 mJ/cm$^2$ in both an air atmosphere and a nitrogen atmosphere, it is considered that the silicon layer 641 be microcrystallized. The orientation ratios of the silicon layers 639 and 641 are illustrated in monochrome shade in FIGS. 47A to 47C-3 which are prepared from the IPF maps shown in FIGS. 34A to 34C. As shown in these figures, when the energy density is in a range of equal to or higher than 380mJ/cm$^2$ and equal to or lower than 620 mJ/cm$^2$, the orientation direction of the silicon layer after the laser light irradiation is the same as that before the laser light irradiation with respect to all orientations, and the orientation ratio is negligibly changed. These results mean that the orientation of the silicon layer 641 is not disordered by the laser light irradiation; the plane orientation is {100} which is the same as that of the single-crystalline silicon substrate 600 employed and is maintained; and crystal grain boundaries do not exist. On the other hand, in the cases of the energy density of 743mJ/cm$^2$ under both nitrogen and air atmospheres, a change is observed in shade of the IPF maps (orientation ratio) when the IPF map after the laser light irradiation is compared with that before the laser light irradiation, which reveals that the crystal orientation of the silicon layer 641 is disordered. Additionally, since the value of CI (Confidence Index) at the measurement is low, it is considered that the silicon layer 641 is microcrystallized by the laser light irradiation with a high energy density.

From Table 2 and FIGS. 26 to 34D, it was found that planarity of a silicon layer which is separated from a single-crystalline silicon substrate can be improved and crystallinity thereof can be recovered by laser light irradiation in an air atmosphere and a nitrogen atmosphere. In this embodiment, it was found that the energy density of the laser light with which the improvement in planarity and recovery of crystallinity can be realized is equal to or higher than 500 mJ/cm$^2$ and equal to or lower than 600 mJ/cm$^2$ in the case of the air atmosphere and is equal to or higher than 400 mJ/cm$^2$ and equal to or lower than 600 mJ/cm$^2$ in the case of the nitrogen atmosphere, and that the applicable range of energy density is wider in the case of the nitrogen atmosphere than the case of the air atmosphere. Further, according to this embodiment, it was found that thinning a silicon layer after laser light irradiation is very effective for forming a thin silicon layer with high surface planarity and high crystallinity.

[Embodiment 3]

Embodiment 3 will describe electric characteristics of a transistor manufactured using an SOI substrate. In this embodiment, the fact that the presence or absence of laser light irradiation processing influences electric characteristics of a transistor will be described.

First, a manufacturing method of transistors of this embodiment will be described with reference to FIGS. 35A to 35D.

Figure 35A:
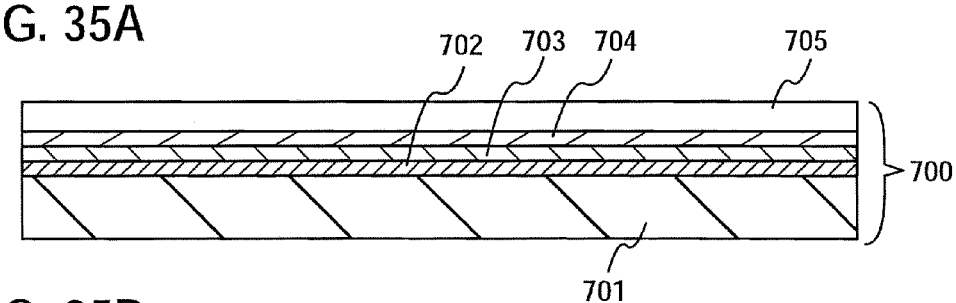
FIGS. 35A to 35D are cross-sectional views of a manufacturing method of transistors using an SOI substrate.

FIG. 35A is a cross-sectional view of an SOI substrate 700. In this embodiment, the SOI substrate manufactured by the method of Embodiment 2 was used as the SOI substrate 700. A glass substrate 701, a silicon oxide film 702, a silicon nitride oxide film 703, and a silicon oxynitride film 704 correspond to the glass substrate 635, the silicon oxide film 634, the silicon nitride oxide film 632, and the silicon oxynitride film 631 of the SOI substrate of Embodiment 2, respectively. In FIG. 35A, the layer denoted by 705 is a silicon layer.

In this embodiment, four kinds of SOI substrates were prepared as the SOT substrate 700. One of them is a substrate corresponding to the SOI substrate 638a, which is an SOI substrate to which both the thinning step before laser irradiation processing and the laser light irradiation step were not conducted. This substrate is hereinafter referred to as an "SOI substrate 700-1." The second is an SOI substrate to which the thinning step was conducted but the later laser light irradiation step was not conducted. This substrate is hereinafter referred to as an "SOI substrate 700-2." The third is a substrate corresponding to the SOI substrate 638b, which is an SOI substrate to which the thinning step was not conducted, however, the laser light irradiation step is conducted. This substrate is hereinafter referred to as an "SOI substrate 700-3." The fourth is an SOI substrate to which both the thinning step and the laser light irradiation step were conducted. This substrate is hereinafter referred to as an "SOI substrate 700-4." Here, the SOI substrates 700-1 and 700-3 to which the thinning step was not conducted each have a silicon layer with a thickness of approximately 120 nm, and the SOI substrates 700-2 and 700-4 to which the thinning step is conducted each have a silicon layer with a thickness of approximately 100 nm. Table 3 summarizes the manufacturing processes of the four kinds of SOI substrates.

TABLE 3

Manufacturing processes of the SOI substrates 700-1 to 700-4[a]

| SOI substrate | Thinning process | Laser light irradiation process | thickness of silicon layer |
| --- | --- | --- | --- |
| 700-1 | N[a] | N | 120 nm |
| 700-2 | Y[b] | N | 100 nm |
| 700-3 | N | Y | 120 nm |
| 700-4 | Y | Y | 100 nm |

[a]N: Not conducted.
Y: Conducted.

Note that the laser irradiation step for the SOI substrate 700-3 and the SOI substrate 700-4 was conducted in an air atmosphere and a nitrogen atmosphere. The energy density for the laser light irradiation was 500 mJ/cm$^2$ in the case of an air atmosphere, and was 400 mJ/cm$^2$, 500 mJ/cm$^2$, and 600 mJ/cm$^2$ in the case of a nitrogen atmosphere.

Figure 35B:
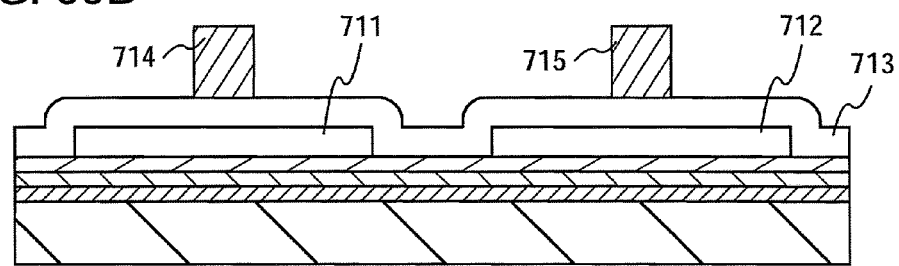
Figure 35C:
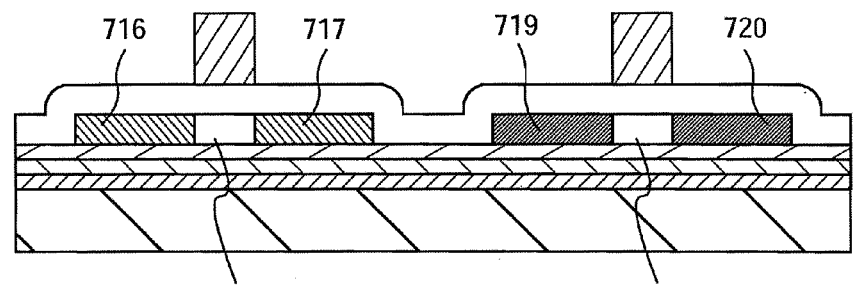

The silicon layer 705 of the SOI substrate 700 was etched into a predetermined shape to form a silicon layer 711 and a silicon layer 712 (see FIG. 35B). The silicon layer 711 is to form a p-channel transistor, and the silicon layer 712 is to form an n-channel transistor. In this embodiment, channel doping for adjusting threshold voltage of transistors was not conducted to the silicon layer 711 and the silicon layer 712.

Next, a silicon oxynitride film 713 was formed with a thickness of 115 nm with a parallel plate type plasma CVD apparatus. The silicon oxynitride film 713 is to form a gate insulating layer. As a source gas for forming the silicon oxynitride film 713, SiH$_4$ and N$_2$O were used.

Then, a gate electrode 714 and a gate electrode 715 were formed over the silicon layer 711 and the silicon layer 712 respectively, with the silicon oxynitride film 713 interposed therebetween. The gate electrodes 714 and 715 were each stacked films including a tantalum nitride film with a thickness of 30 nm and a tungsten film with a thickness of 370 nm. The tantalum nitride film and the tungsten film were formed with a sputtering apparatus. Then, the stacked films including these films were etched into a desired shape with a dry etching apparatus to form the gate electrodes 714 and 715.

Next, a region to be the n-channel transistor was masked with a resist. Then, phosphorus was added to the silicon layer 711 with a doping apparatus. In the phosphorus adding step, a 5% PH$_3$ gas diluted with H$_2$ was used as a source gas of ions, the dose was set at $3.0\times10^{15}$ ions/cm$^2$, and the accelerating voltage was set at 80 kV. In this step, the gate electrode 714 serves as a mask, so that a source region 716, a drain region 717, and a channel formation region 718 are formed in the silicon layer 711 in a self-alignment manner (see FIG. 35C).

Next, after removal of the resist, a region to be the p-channel transistor was masked with another resist. Then, boron was added to the silicon layer 712 with a doping apparatus. In the boron adding step, a 15% B$_2$H$_6$ gas diluted with H$_2$ was used as a source gas of ions, the dose was set at $1.6\times10^{16}$ ions/cm$^2$, and the accelerating voltage was set at 80 kV. In this step, the gate electrode 715 serves as a mask, so that a source region 719, a drain region 720, and a channel formation region 721 are formed in the silicon layer 712 in a self-alignment manner (see FIG. 35C).

Figure 35D:
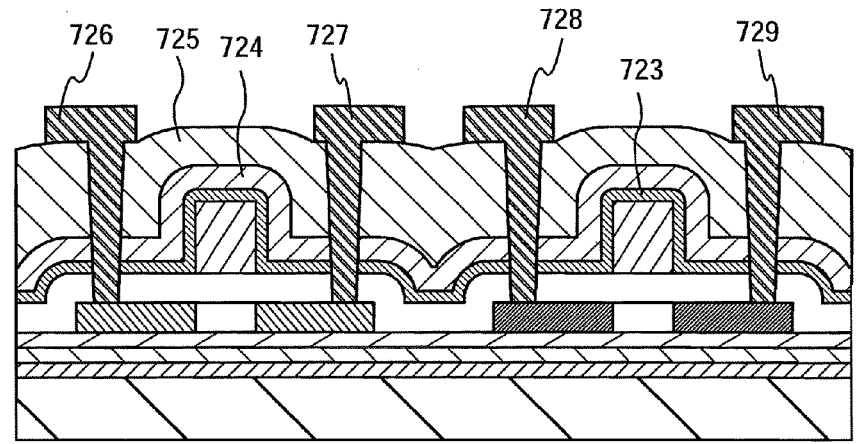

After removing the resist, a silicon oxynitride film 723 having a thickness of 50 nm was formed with a plasma CVD apparatus using SiH$_4$ and N$_2$O as a source gas (FIG. 35D). Then, in order to activate phosphorus added to the silicon layer 711 and boron added to the silicon layer 712, heat treatment was conducted at 550° C. for 4 hours. Further, a silicon nitride oxide film 724 having a thickness of 100 nm and a silicon oxynitride film 725 having a thickness of 600 nm were continuously formed with a plasma CVD apparatus. As a source gas for the silicon nitride oxide film 724, SiH$_4$, NH$_3$, N$_2$O, and H$_2$ were used. As a source gas for the silicon oxynitride film 725, SiH$_4$ and N$_2$O were used.

Next, contact holes for gate electrodes, source electrodes, and drain electrodes were formed. First, a mask of a resist was formed. Using this mask, wet etching treatment with the use of hydrofluoric acid was conducted to the silicon oxynitride film 725. Further, using the same mask, dry etching treatment with the use of a mixed gas of CHF$_3$ and He was conducted to the stacked films formed of the silicon oxynitride film 713, the silicon oxynitride film 723, and the silicon nitride oxide film 724. Through the above-described process, the contact holes which reach the gate electrodes 714 and 715 and the regions 716, 717, 719, and 720 were formed.

Next, stacked films of a titanium film having a thickness of 100 nm, a pure aluminum film with a thickness of 300 nm, and a titanium film with a thickness of 100 nm were formed over the silicon oxynitride film 725 with a sputtering apparatus. Then, the stacked structure was etched by dry etching treatment, so that a source electrode 726 and a drain electrode 727 of the p-channel transistor and a source electrode 728 and a drain electrode 729 of the n-channel transistor were formed. Electrodes which connect to the gate electrode 714 and the gate electrode 715 are also formed. Through the above-described process, the p-channel transistor and the n-channel transistor manufactured using the SOT substrate 700 were completed.

In this embodiment, drain current $I_D$-gate voltage $V_G$ characteristics (hereinafter referred to as $I_D$-$V_G$ characteristics) of the p-channel transistor and the n-channel transistor were measured. The measured transistors of both p-channel type and the n-channel type have a channel length of 10 μm and a channel width of 8 μm.

The measurement of the $I_D$-$V_G$ characteristics showed that the p-channel transistors and the n-channel transistors manufactured using the SOI substrates 700-3 and 700-4 to which the laser irradiation step was conducted operate as transistors. On the contrary, it was found that the p-channel transistors and the n-channel transistors manufactured using the SOI substrates 700-1 and 700-2 to which the laser irradiation step was not conducted do not operate as transistors. FIGS. 36A to 36C and FIGS. 37A to 37C show measurement results of the $I_D$-$V_G$ characteristics of each transistor. The graph on the left side in each drawing shows the results of the p-channel transistor, and the graph on the right side shows the results of the n-channel transistor.

Figure 36A:
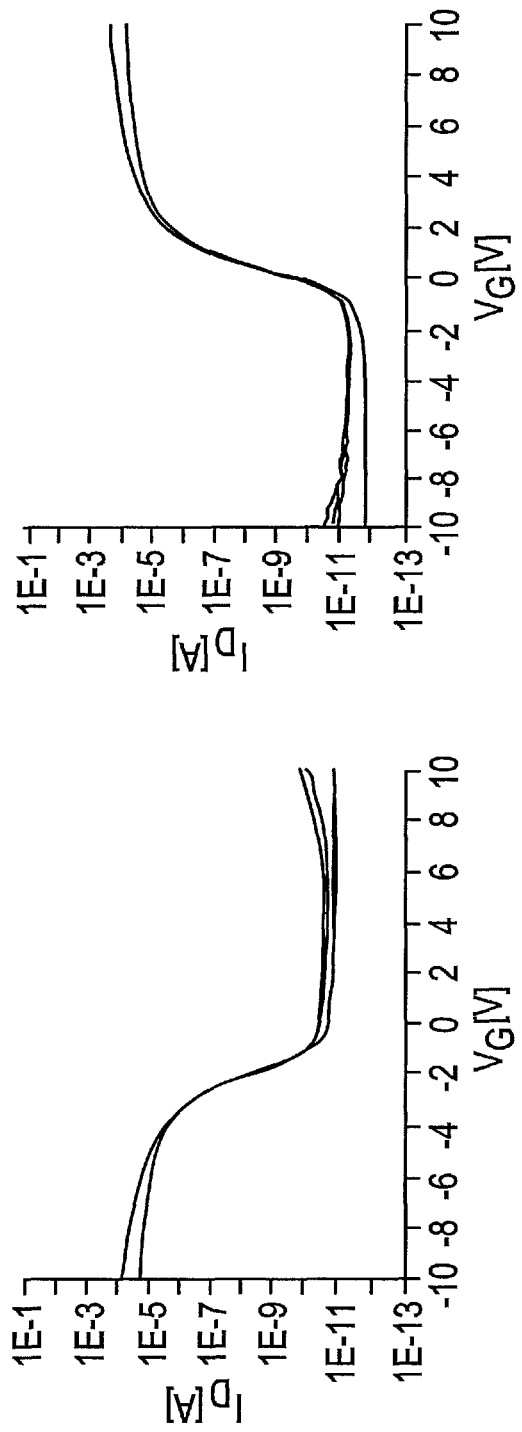

FIGS. 36A and 36B show data of the SOI substrate 700-3, and FIG. 36C shows data of the SOI substrate 700-1. The laser irradiation step for the SOI substrate 700-3 of FIG. 36A was conducted in an air atmosphere, where the energy density of the laser light irradiation was 500 mJ/cm$^2$. In FIG. 36B, the laser irradiation step was conducted in a nitrogen atmosphere, where the energy density of the laser light irradiation was 600 mJ/cm². Note that it was confirmed that in the cases where the energy density of the laser light irradiation is 400 mJ/cm² and 500 mJ/cm², the transistor on the SOI substrate 700-3 to which the laser irradiation processing was conducted in a nitrogen atmosphere also operates similarly to the case where the energy density of the laser light irradiation is 600 mJ/cm².

Figure 37A:
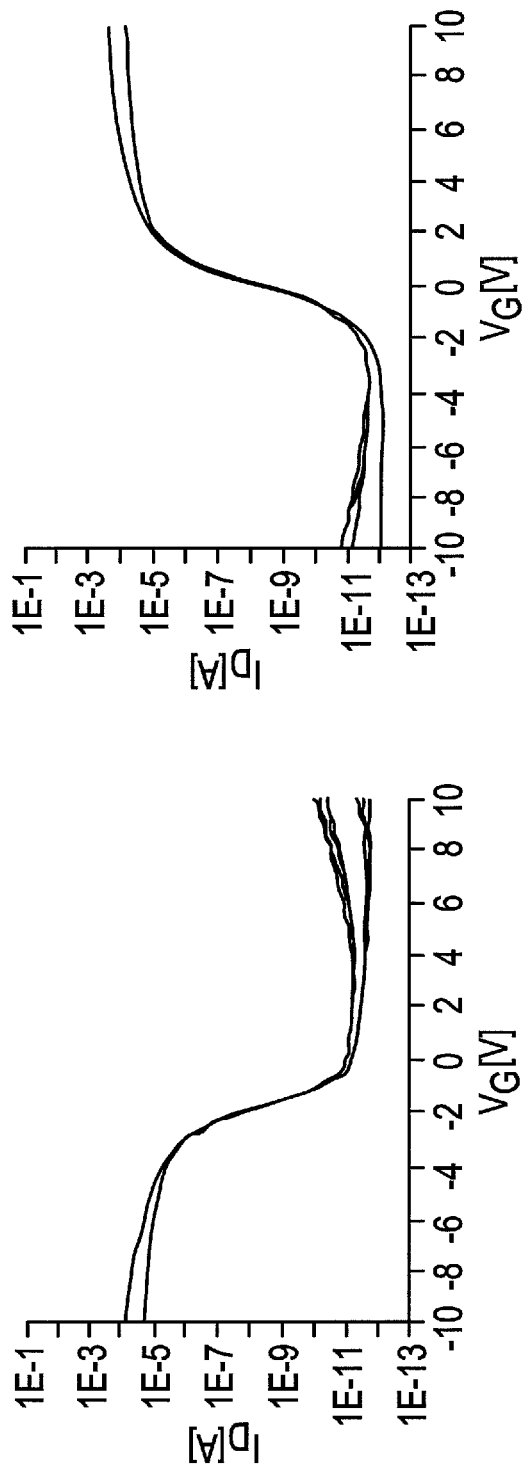
Figure 37B:
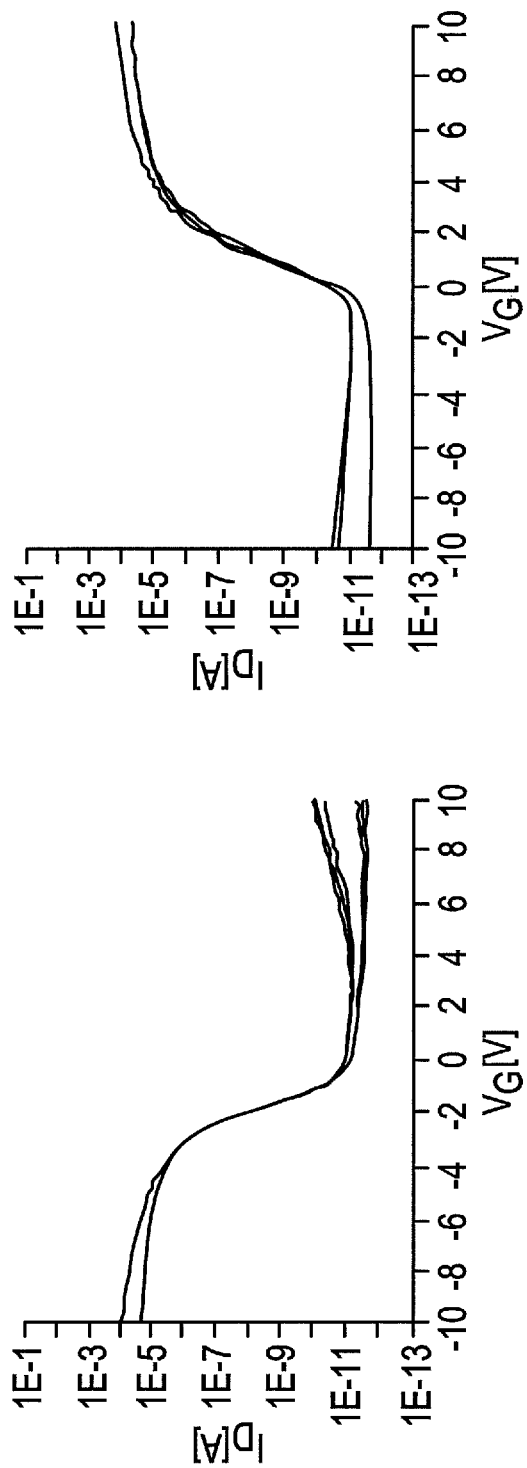

FIGS. 37A and 37B show data of the SOI substrate 700-4, and FIG. 37C shows data of the SOI substrate 700-2. The laser irradiation step for the SOI substrate 700-4 of FIG. 37A was conducted in an air atmosphere, where the energy density of the laser light irradiation was 500 mJ/cm². In FIG. 36B, the laser irradiation step was conducted in a nitrogen atmosphere, where the energy density of the laser light irradiation was 500 mJ/cm². Note that it was confirmed that in the cases where the energy density of the laser light irradiation is 400 mJ/cm² and 600 mJ/cm², the transistor on the SOI substrate 700-4 to which the laser irradiation processing was conducted in a nitrogen atmosphere also operates similarly to the case where the energy density of the laser light irradiation is 500 mJ/cm².

The $I_D$-$V_G$ characteristic graphs of FIGS. 36A to 37C show the fact that the presence or absence of laser light irradiation processing to the silicon layer which is separated from the single-crystalline silicon substrate determines whether the transistor operates or not. Therefore, the laser irradiation processing is an important process for manufacturing operable transistors using a silicon layer bonded to a glass substrate (substrate having a strain point of equal to or lower than 700° C.). By thinning the silicon layer after the laser irradiation processing, performance of the transistor can be improved.

[Embodiment 4]

In Embodiment 4, the mean surface roughness Ra, the root mean square of surface roughness RMS, and the largest difference in height between peak and valley P-V, which are used in this specification as indexes of surface planarity, are described.

The mean surface roughness (Ra) means the mean surface roughness obtained by three-dimensionally expanding a centerline average height Ra that is defined by JISB0601:2001 (ISO4287:1997) so as to be able to apply the Ra to a measurement surface. The Ra is a mean value of the absolute values of the deviation from a reference surface to a specific surface, and is calculated by Formula (1).

$$R_a = \frac{1}{S_0} \int_{Y_1}^{Y_2} \int_{X_1}^{X_2} |F(X, Y) - Z_0| dX dY \quad (1)$$

The measurement surface is a surface which is shown by the all measurement data, and is calculated by Formula (2).

$$Z = F(X, Y) \quad (2)$$

The specific surface is a surface which is an object of roughness measurement, and is a rectangular region within four points represented by the coordinates $(X_1, Y_1)$, $(X_1, Y_2)$, $(X_2, Y_1)$, and $(X_2, Y_2)$. The area of the specific surface is referred to as $S_0$ when the specific surface is flat ideally. Then, $S_0$ is obtained from Formula (3).

$$S_0 = (X_2 - X_1) \cdot (Y_2 - Y_1) \quad (3)$$

The reference surface is a plane surface represented by $Z = Z_0$ when the mean value of the height of the specific surface is referred to as $Z_0$. The reference surface is parallel to the XY plane. $Z_0$ is obtained from Formula (4).

$$Z_0 = \frac{1}{S_0} \int_{Y_1}^{Y_2} \int_{X_1}^{X_2} F(X, Y) dX dY \quad (4)$$

The root mean square of surface roughness (RMS) means the root mean square of the surface roughness obtained by three-dimensionally expanding the RMS of a cross section curve so as to be able to apply the RMS of a cross section curve to the measurement surface, similarly to the mean surface roughness (Ra). The RMS is the square root of the mean value of the square of the deviation from the reference surface to the specific surface, and is obtained from Formula (5).

$$R_{ms} = \sqrt{\frac{1}{S_0} \int_{Y_1}^{Y_2} \int_{X_1}^{X_2} \{F(X, Y) - Z_0\}^2 dX dY} \quad (5)$$

The largest difference in height between peak and valley (P-V) is a difference between the height of the highest peak $Z_{max}$ and the height of the lowest valley $Z_{min}$ in the specific surface, and is obtained from Formula (6).

$$P-V = Z_{max} - Z_{min} \quad (6)$$

In the largest difference in height between peak and valley (P-V), the peak and the valley mean the peak and the valley obtained by three-dimensionally expanding the peak and the valley defined by JISB0601:2001(ISO4287:1997). The peak is the highest place of the peaks in the specific surface. The valley is the lowest place of the valley in the specific surface.

[Embodiment 5]

In Embodiment 5, a method of forming an ion introduction layer is described.

The formation of the ion introduction layer is conducted by irradiation of a semiconductor substrate with accelerated ions, and the ions are derived from hydrogen (H) (hereafter referred to as "hydrogen ion species"). More specifically, a hydrogen gas or a gas which contains hydrogen in its composition is used as a source gas (a source material); a hydrogen plasma is generated by exciting the source gas; and a semiconductor substrate is irradiated with the hydrogen ion species in the hydrogen plasma. In this manner, the ion introduction layer is formed in the semiconductor substrate.

(Ions in Hydrogen Plasma)

In such a hydrogen plasma as described above, hydrogen ion species such as $H^+$, $H_2^+$, and $H_3^+$ are present. Here are listed reaction equations showing reaction processes (formation processes, annihilation processes) of the hydrogen ion species.

$$e + H \rightarrow e + H^+ + e \quad (a1)$$

$$e + H_2 \rightarrow e + H_2^+ + e \quad (a2)$$

$$e + H_2 \rightarrow e + (H_2)^* \rightarrow e + H + H \quad (a3)$$

$$e + H_2^+ \rightarrow e + (H_2^+)^* \rightarrow e + H^+ + H \quad (a4)$$

$$H_2^+ + H_2 \rightarrow H_3^+ + H \quad (a5)$$

$$H_2^+ + H_2 \rightarrow H^+ + H + H_2 \quad (a6)$$

$$e + H_3^+ \rightarrow e + H^+ + H + H \quad (a7)$$

$$e + H_3^+ \rightarrow H_2 + H \quad (a8)$$

$$e + H_3^+ \rightarrow H + H + H \quad (a9)$$

Figure 38:
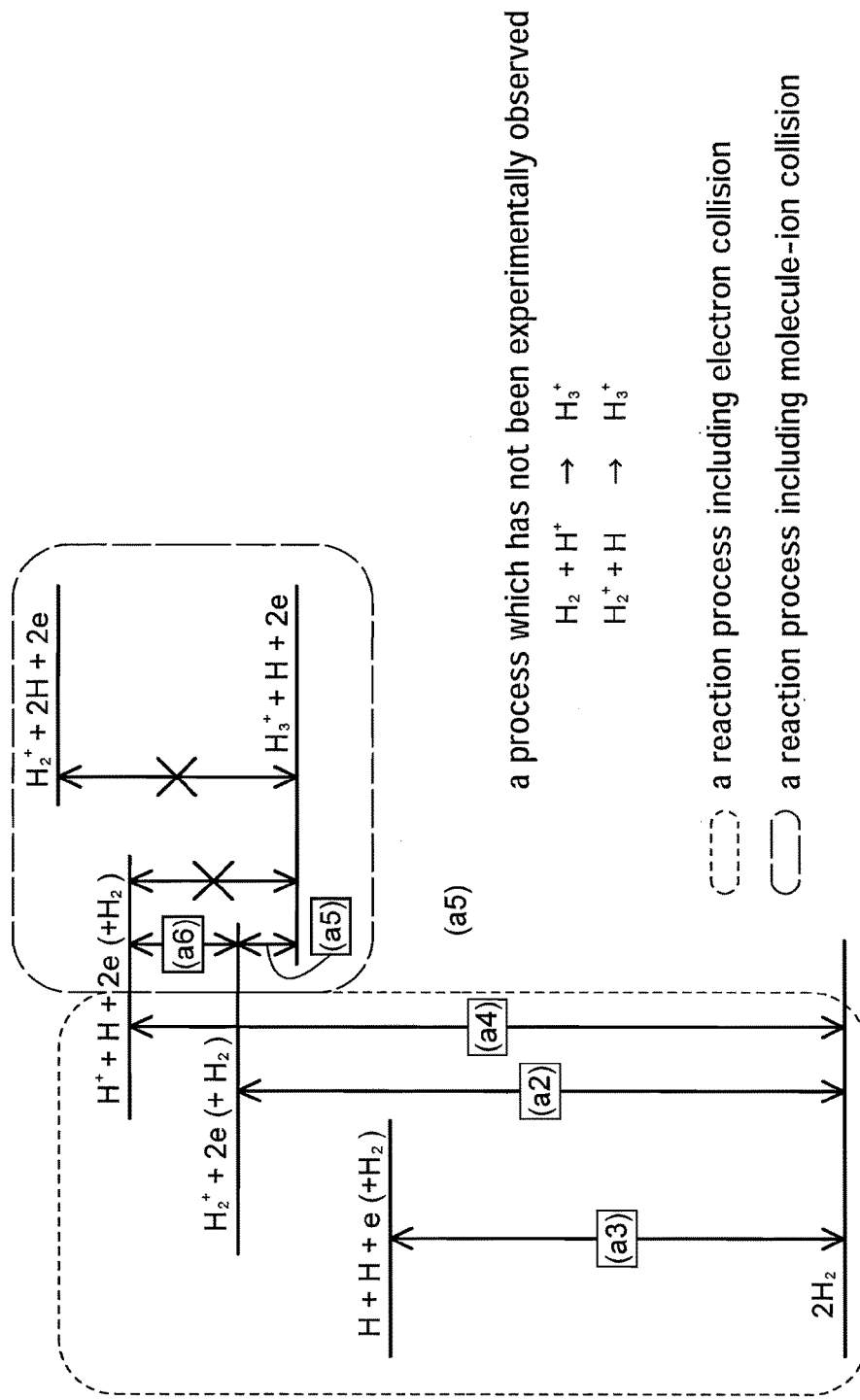
FIG. 38 is an energy diagram of hydrogen ion species.

FIG. 38 is an energy diagram which schematically shows some of the above reactions. Note that the energy diagram shown in FIG. 38 is merely a schematic diagram and does not depict the relationships of energies of the reactions exactly.

[$H_3^+$ Formation Process]

As shown above, $H_3^+$ is mainly produced through the reaction process that is represented by the reaction equation (a5). On the other hand, as a reaction that competes with the reaction equation (a5), there is the reaction process represented by the reaction equation (a6). To increase the amount of $H_3^+$, at the least, it is necessary that the reaction of the reaction equation (a5) occur more dominantly than the reaction of the reaction equation (a6) (note that, because there are also other reactions, (a7), (a8), and (a9), through which the amount of $H_3^+$ is decreased, the amount of $H_3^+$ is not necessarily increased even if the reaction of the reaction equation (a5) occurs more dominantly than the reaction of the reaction equation (a6)). In contrast, when the reaction of the reaction equation (a5) occurs less frequently than the reaction of the reaction equation (a6), the proportion of $H_3^+$ in a plasma is decreased.

The amount of increase in the product on the right-hand side (rightmost side) of each reaction equation given above depends on the concentration of a source material on the left-hand side (leftmost side) of the reaction equation, the rate coefficient of the reaction, and the like. Here, it has been experimentally confirmed that, when the kinetic energy of $H_2^+$ is lower than about 11 eV, the reaction of the reaction equation (a5) is the main reaction (that is, the rate coefficient of the reaction equation (a5) is sufficiently higher than the rate coefficient of the reaction equation (a6)) and that, when the kinetic energy of $H_2^+$ is higher than about 11 eV, the reaction of the reaction equation (a6) is the main reaction.

A force is exerted on a charged particle by an electric field, and the charged particle gains kinetic energy. The kinetic energy corresponds to the amount of decrease in potential energy due to an electric field. For example, the amount of kinetic energy which is gained by a given charged particle before colliding with another particle is equal to the potential energy which is lost by transfer of the charged particle. That is, in a situation where a charged particle can transfer a long distance in an electric field without colliding with another particle, the kinetic energy (or the average thereof) of the charged particle tends to be higher than that in a situation where the charged particle cannot undergo such a long-distance transfer without collision. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy before collision. That is, it can be said that, even in the situation where the mean free path is short, the kinetic energy of a charged particle is high if the potential difference is large.

This situation is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (a6) is the main reaction in the situation where the pressure inside the chamber is low, the amount of $H_3^+$ tends to be decreased, and because the reaction of the reaction equation (a5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high. In the opposite situation, the kinetic energy of $H_2^+$ is low. Namely, because the reaction of the reaction equation (a6) is the main reaction in the situation where the electric field is high, the amount of $H_3^+$ tends to be decreased, and because the reaction of the reaction equation (a5) is the main reaction in a situation where the electric field is low, the amount of $H_3^+$ tends to be increased.

[Differences Depending on Ion Source]

Figure 39:
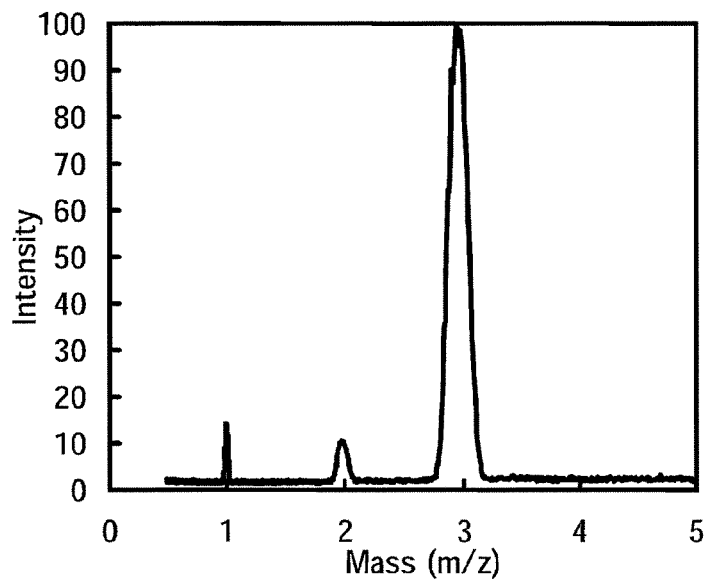
FIG. 39 is a diagram showing the results of ion mass spectrometry.

Here, an example, in which the proportions of ion species (particularly, the proportion of $H_3^+$) are different, is described. FIG. 39 is a graph showing the results of mass spectrometry of ions that are generated from a 100% hydrogen gas (with the pressure of an ion source of $4.7 \times 10^{-2}$ Pa). The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 39, the number of ions with different masses is expressed as a relative proportion where the number of ions with a mass of 3 is defined as 100. It can be seen from FIG. 39 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 40:
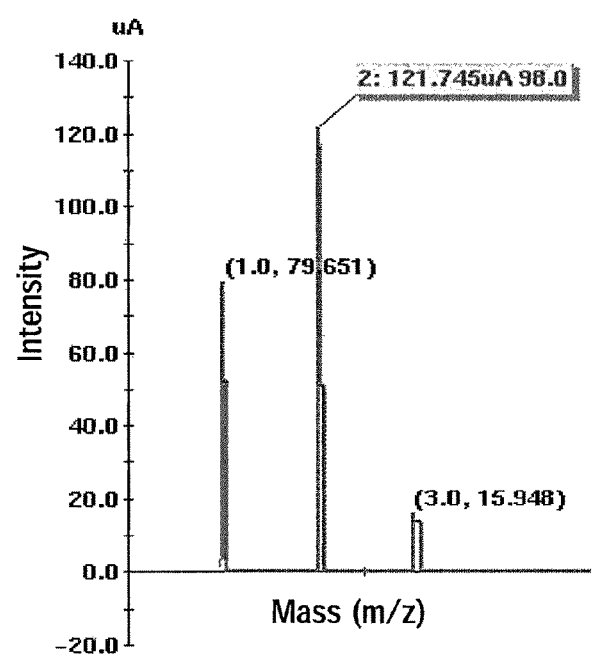
FIG. 40 is a diagram showing the results of ion mass spectrometry.

FIG. 40 is a graph showing the results of mass spectrometry of ions that are generated from $PH_3$ using an ion source different from that for the case of FIG. 39 at the pressure of the ion source of about $3 \times 10^{-3}$ Pa. The results of this mass spectrometry focus on the hydrogen ion species. In addition, the mass spectrometry was performed by measurement of ions that were extracted from the ion source. As in FIG. 39, the horizontal axis of FIG. 40 represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 40 that the ratio between ion species in a plasma, i.e., the ratio between $H^+$, $H_2^+$, and $H_3^+$, is about 37:56:7. Note that, although FIG. 40 shows the data obtained when the source gas is $PH_3$, the ratio between hydrogen ion species is almost the same when a 100% hydrogen gas is used as a source gas, as well.

In the case of the ion source from which the data shown in FIG. 40 is obtained, $H_3^+$, among $H^+$, $H_2^+$, and $H_3^+$, is generated at a proportion of only 7%. On the other hand, in the case of the ion source from which the data shown in FIG. 39 is obtained, the proportion of $H_3^+$ can be up to 50% or higher (about 80% according to data of FIG. 39). This is probably due to the pressure and electric field inside a chamber, which is clearly shown in the discussion on the aforementioned [$H_3^+$ Formation Process].

[$H_3^+$ Irradiation Mechanism]

When a plasma that contains a plurality of ion species as shown in FIG. 39 is generated and a semiconductor substrate is irradiated with the generated ion species without any mass separation being performed, the surface of the semiconductor substrate is irradiated with each of $H^+$, $H_2^+$, and $H_3^+$ ions. In order to discuss the mechanism, from the irradiation with ions to the formation of an ion introduction layer, the following five types of models (Models 1 to 5) are considered.

Model 1, where the ion species used for irradiation is H$^+$, which is still H$^+$ (H) after the irradiation.

Model 2, where the ion species used for irradiation is H$_2^+$, which is still H$_2^+$ (H$_2$) after the irradiation.

Model 3, where the ion species used for irradiation is H$_2^+$, which splits into two H atoms (H$^+$ ions) after the irradiation.

Model 4, where the ion species used for irradiation is H$_3^+$, which is still H$_3^+$ (H$_3$) after the irradiation.

Model 5, where the ion species used for irradiation is H$_3^+$, which splits into three H atoms (H$^+$ ions) after the irradiation.

[Comparison of Simulation Results with Measured Values]

Based on the above Models 1 to 5, the irradiation of an Si substrate with hydrogen ion species was simulated. As simulation software, SRIM (the Stopping and Range of Ions in Matter) was used. The SRIM is simulation software for ion introduction processes by a Monte Carlo method and is an improved version of TRIM (the Transport of Ions in Matter). Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Simulation results are shown below. In the simulation of this embodiment, a calculation based on Model 2 was performed with the H$_2^+$ replaced by H$^+$ that has twice the mass. Furthermore, a calculation based on Model 3 was performed with the H$_2^+$ replaced by H$^+$ that has half the kinetic energy, a calculation based on Model 4 was performed with the H$_3^+$ replaced by H$^+$ that has three times the mass, and a calculation based on Model 5, with the H$_3^+$ replaced by H$^+$ that has one-third the kinetic energy.

Figure 41:
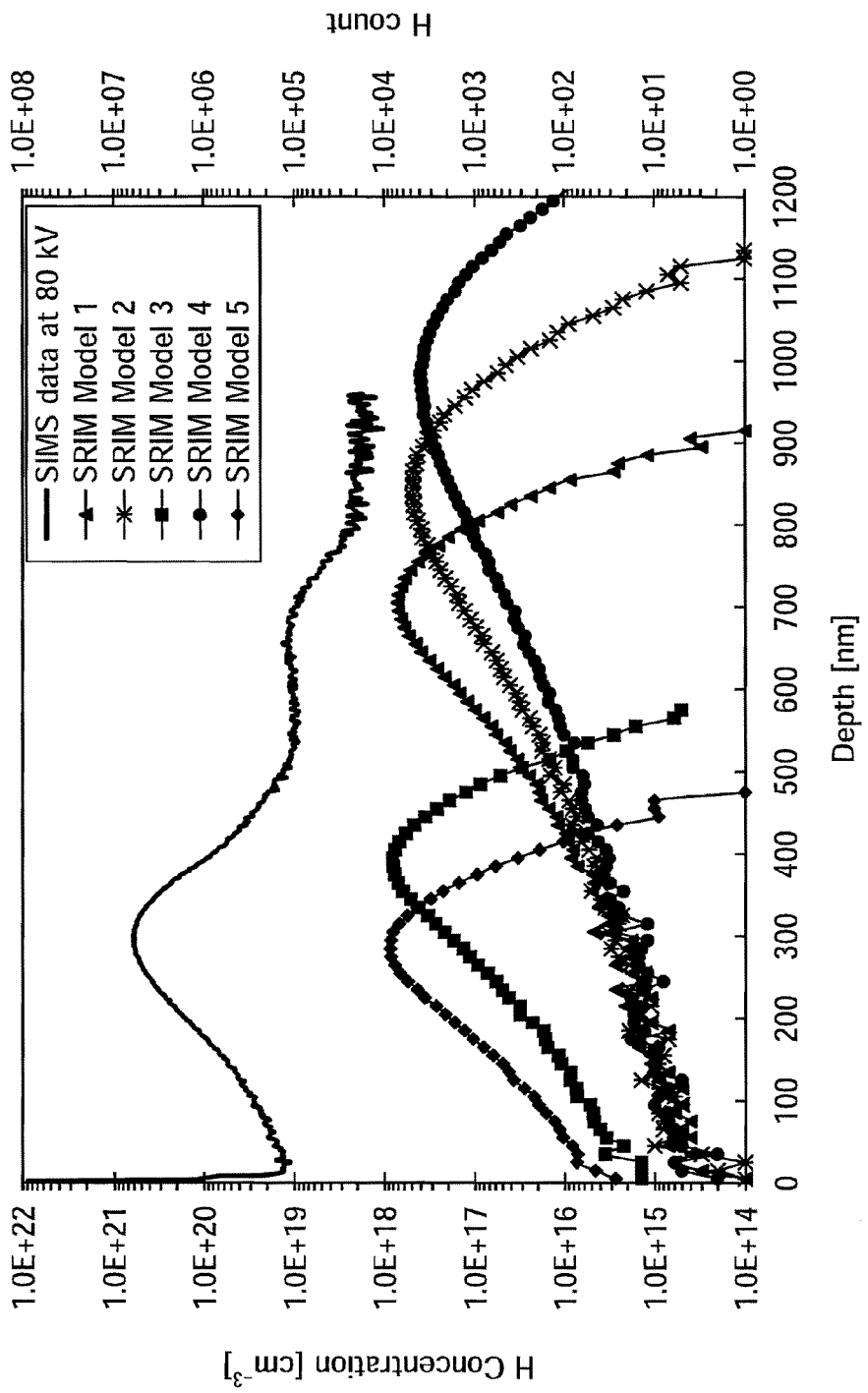
FIG. 41 is a diagram showing the profile (measured values and calculated values) of hydrogen in the depth direction when the accelerating voltage is 80 kV.

The distribution of a hydrogen element (H) in a depth direction was calculated in cases where a Si substrate was irradiated with the hydrogen ion species at accelerating voltage of 80 kV (irradiation with 100,000 atoms for H) using Models 1 to 5. FIG. 41 shows the calculation results. In FIG. 41, measured values of the distribution in the depth direction of a hydrogen element (H) included in the Si substrate are also shown. The measured values are data measured by SIMS (Secondary Ion Mass Spectroscopy) (hereinafter, referred to as SIMS data). The sample measured by SIMS was a Si substrate which was irradiated with hydrogen ion species (H$^+$, H$_2^+$, H$_3$) produced under the conditions for measuring data of FIG. 39, at accelerating voltage of 80 kV.

In FIG. 41, the vertical axis of the graph of the calculated values using the Models 1 to 5 is a right vertical axis showing the number of hydrogen atoms. The vertical axis of the graph of the SIMS data is a left vertical axis showing the hydrogen concentration. The horizontal axis of the graph of the calculated values and the SIMS data represents depth from the surface of the Si substrate.

Comparison of the SIMS data, which is measured values, with the calculation results indicates that Models 2 and 4 obviously do not match the peaks of the SIMS data and a peak corresponding to Model 3 cannot be observed in the SIMS data. This result shows that the contribution of each of Models 2 to 4 is comparatively smaller than those of Models 1 and 5. Considering that the unit of the kinetic energy of ions is kiloelectron volts whereas the H—H bond energy is only about several electron volts, the small contribution of each of Models 2 and 4 is probably because H$_2^+$ and H$_3^+$ mostly split into H$^+$ or H by colliding with Si atoms.

Accordingly, Models 2 to 4 will not be considered hereinafter. Next are described the simulation results obtained when a Si substrate was irradiated with the hydrogen ion species (irradiation with 100,000 atoms for H) at accelerating voltage of 80 kV, 60 kV and 40 kV, using Models 1 and 5.

Figure 42:
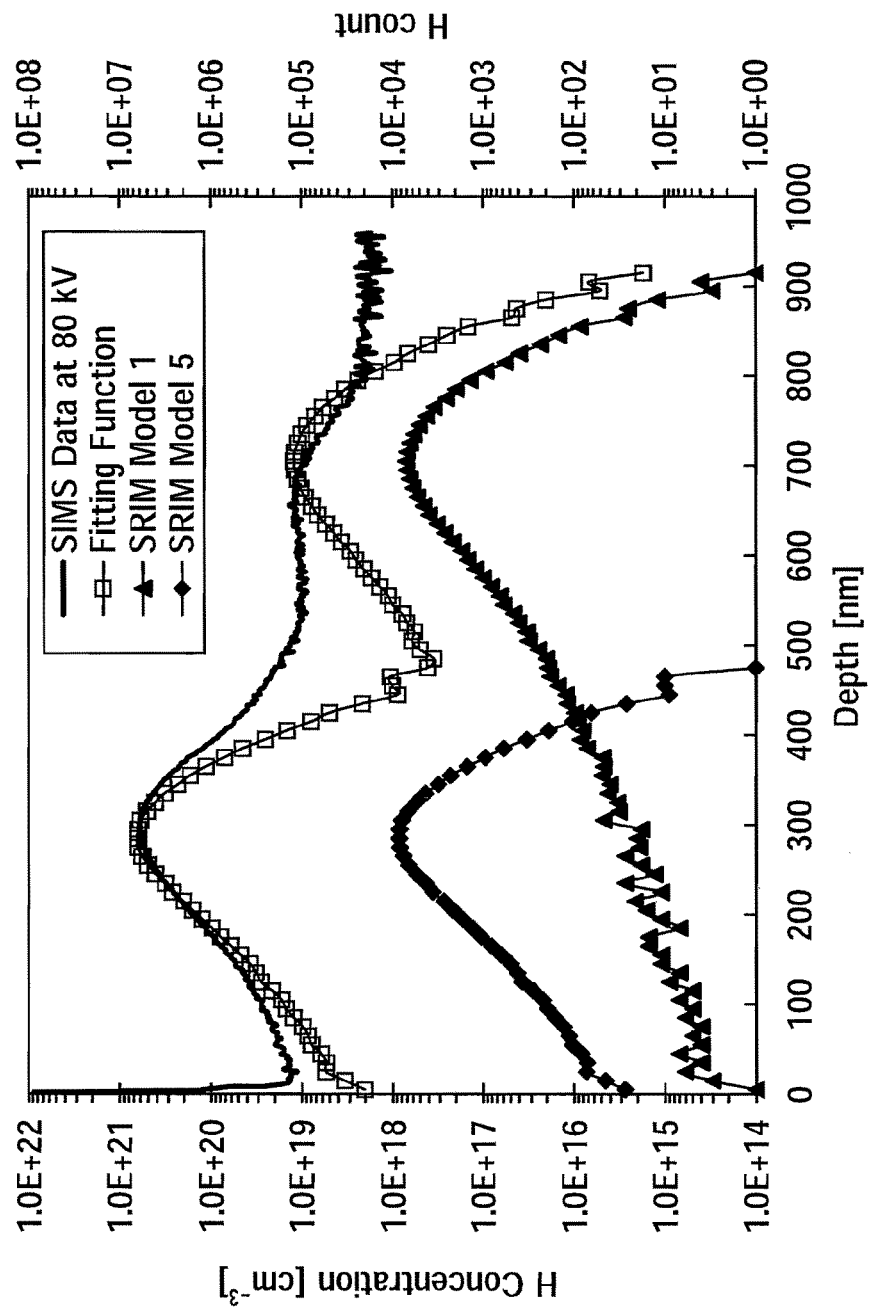
FIG. 42 is a diagram showing the profile (measured values, calculated values, and fitting functions) of hydrogen in the depth direction when the accelerating voltage is 80 kV.
Figure 43:
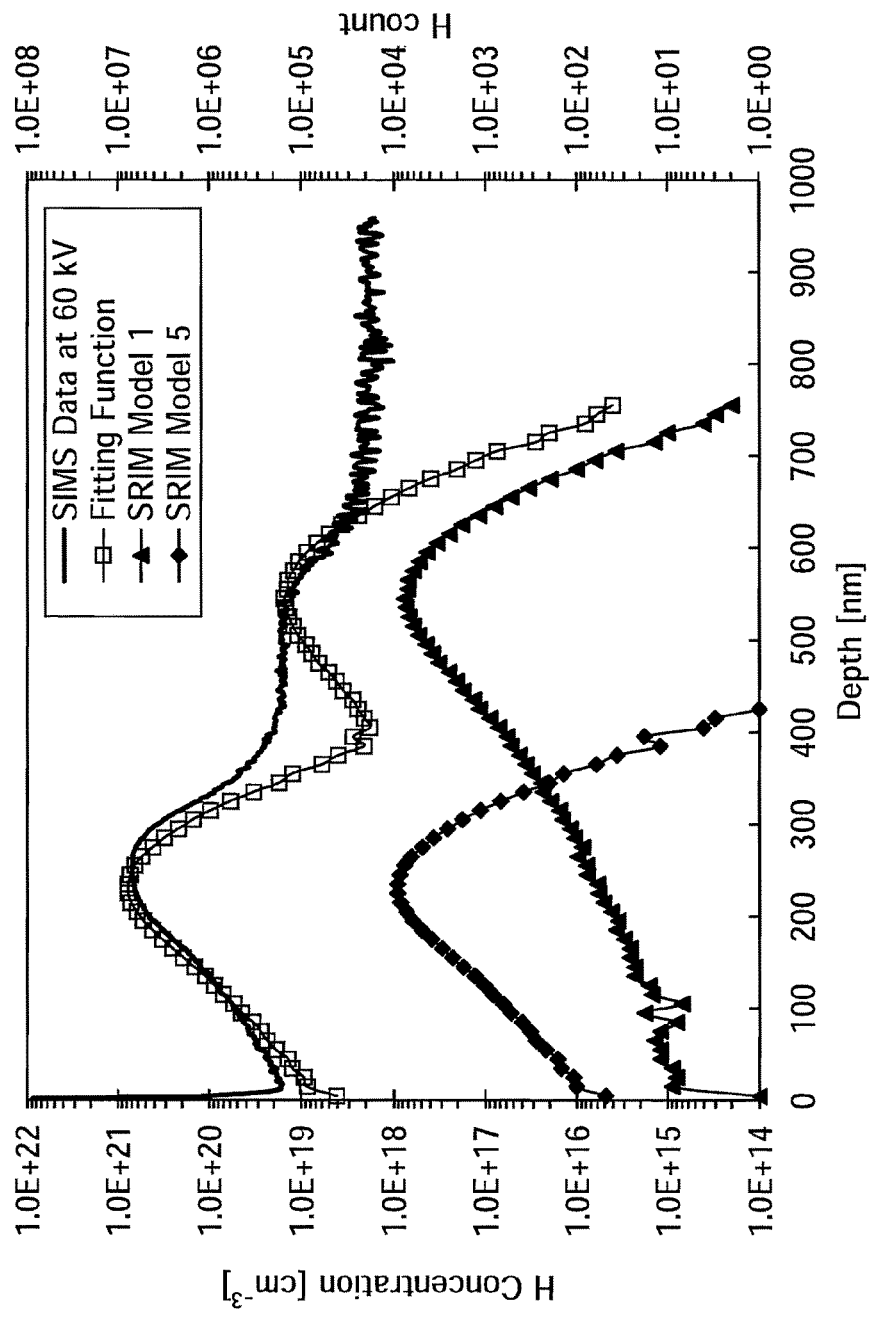
FIG. 43 is a diagram showing the profile (measured values, calculated values, and fitting functions) of hydrogen in the depth direction when the accelerating voltage is 60 kV.
Figure 44:
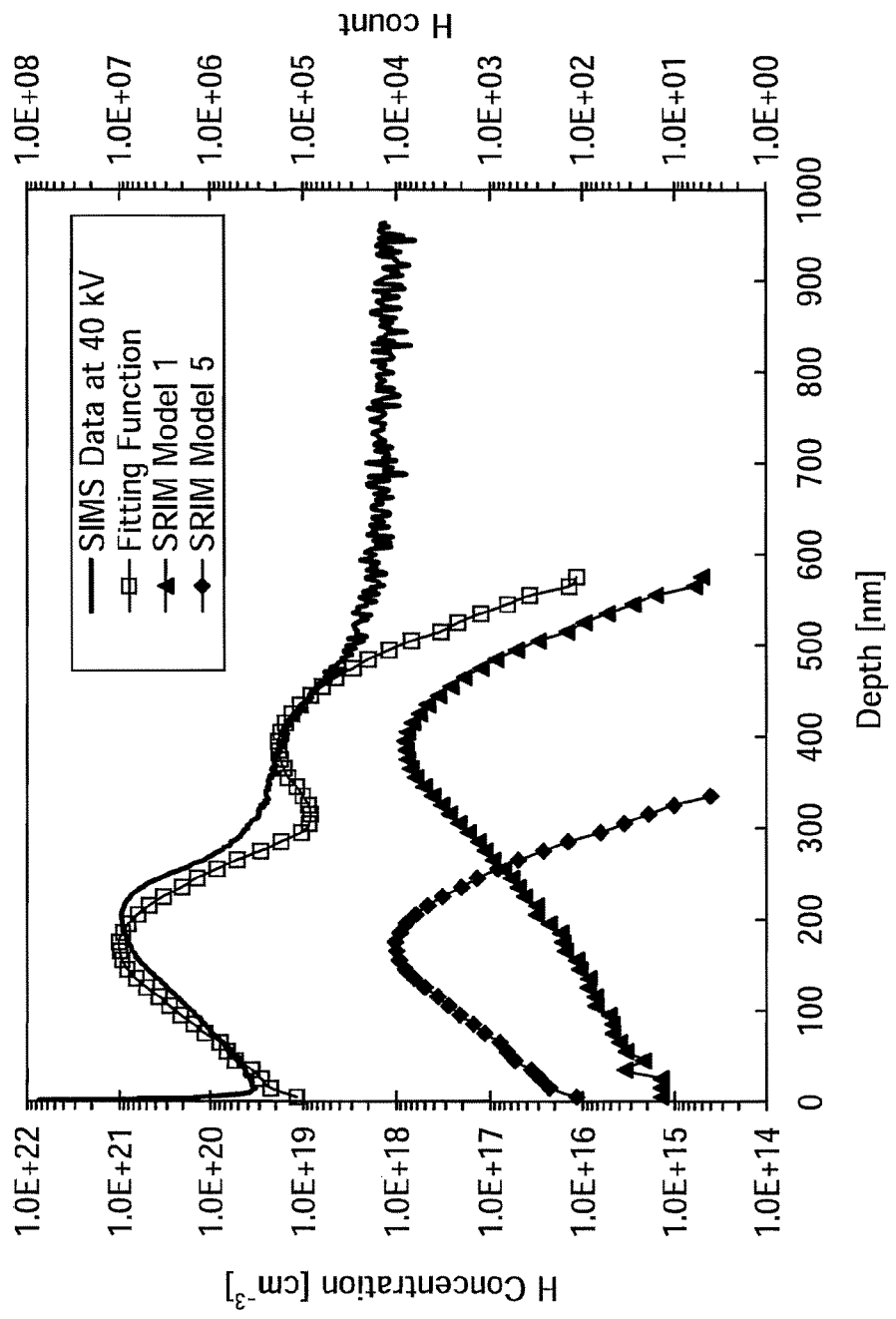
FIG. 44 is a diagram showing the profile (measured values, calculated values, and fitting functions) of hydrogen in the depth direction when the accelerating voltage is 40 kV.
Figure 46A:
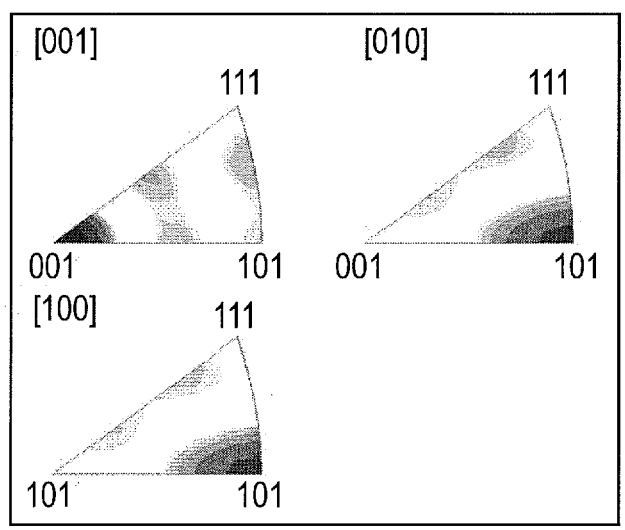
FIGS. 46A to 46C-4 show plane orientation of a silicon layer, which are obtained from measurement data of the EBSP.
Figure 46A:
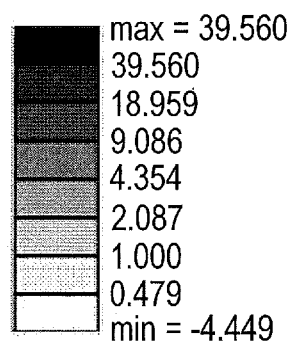
Figures 1, 46B:
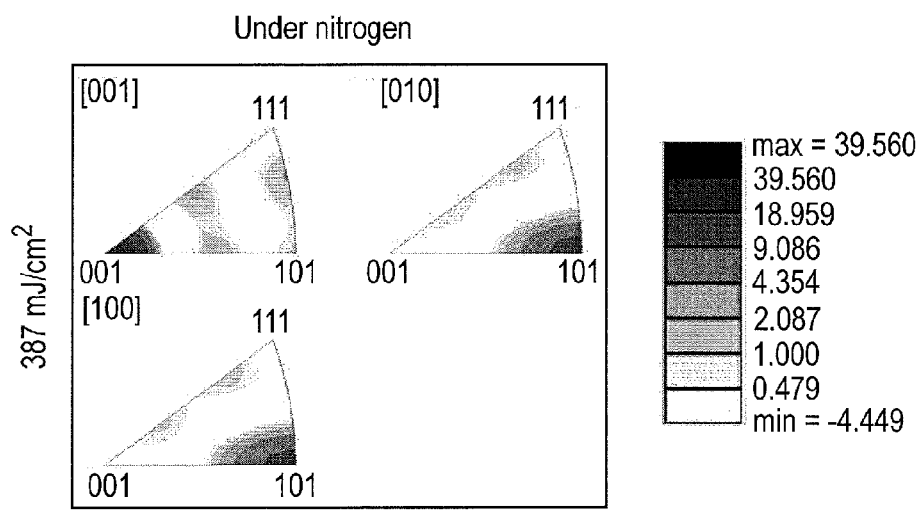
Figures 2, 46B:
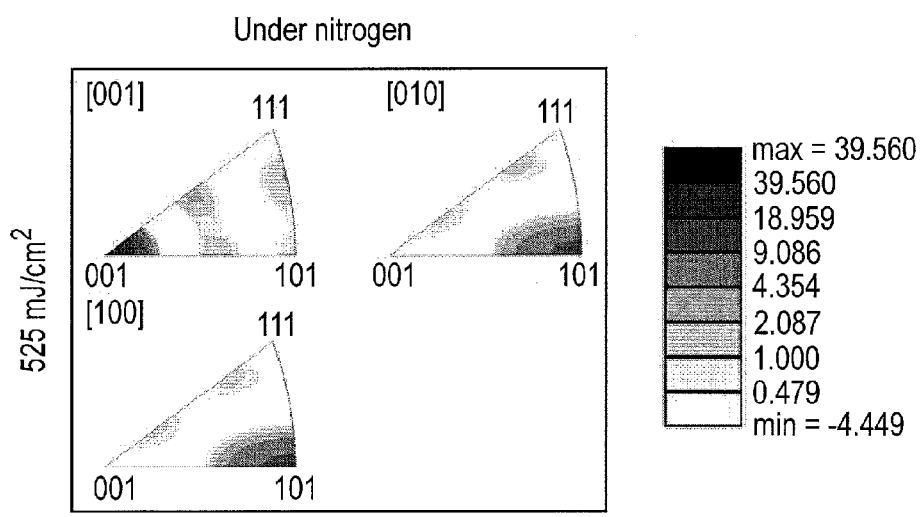
Figures 3, 46B:
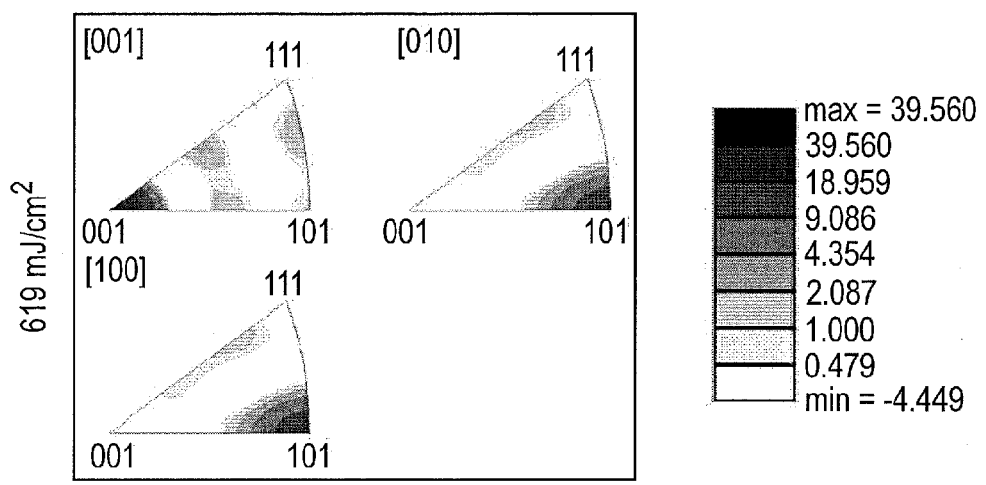
FIGS. 47A to 47C-3 show plane orientation of a silicon layer, which are obtained from measurement data of the EBSP.
Figures 4, 46B:
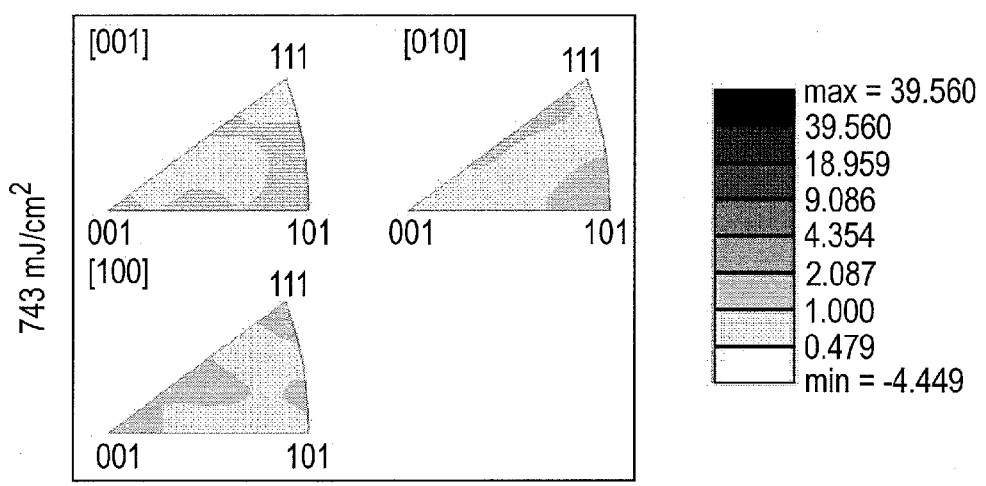
Figures 1, 46C:
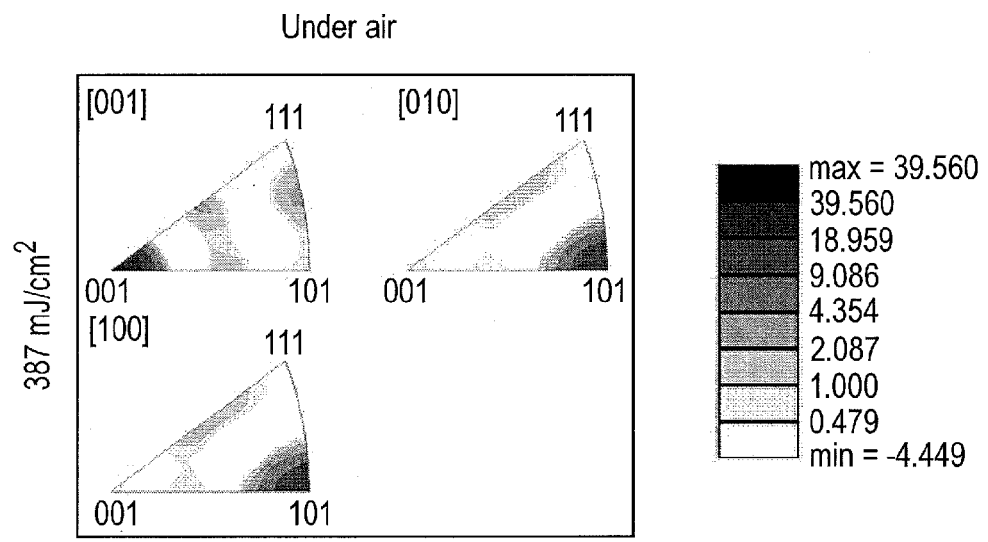
Figures 2, 46C:
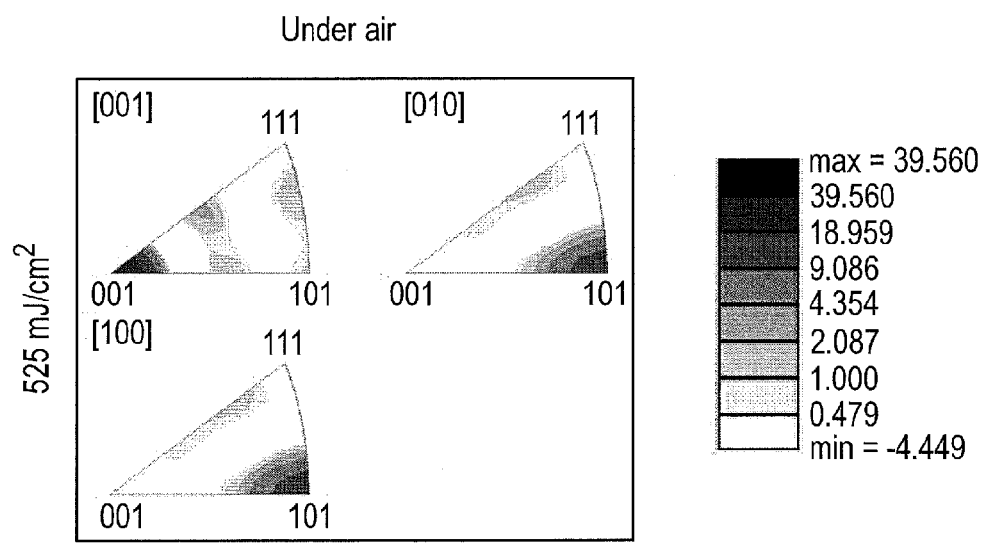
Figures 3, 46C:
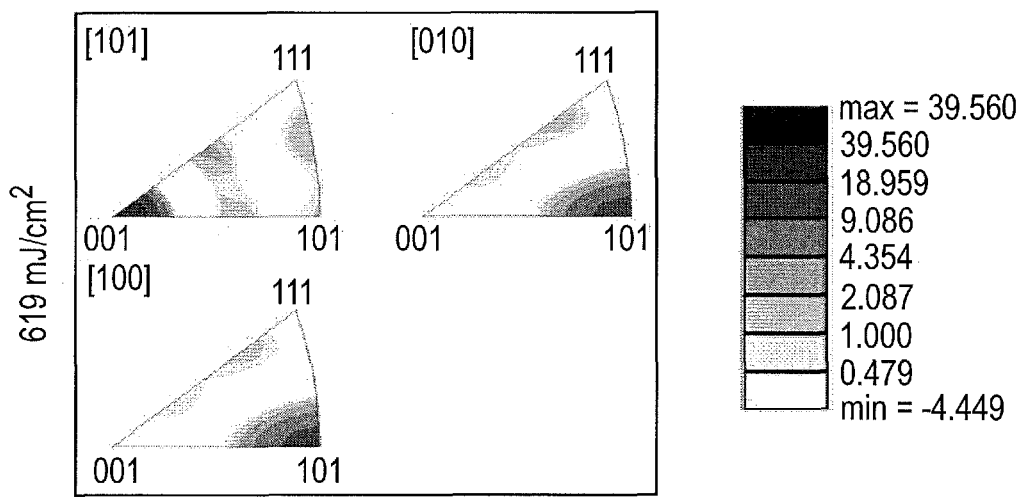
Figures 4, 46C:
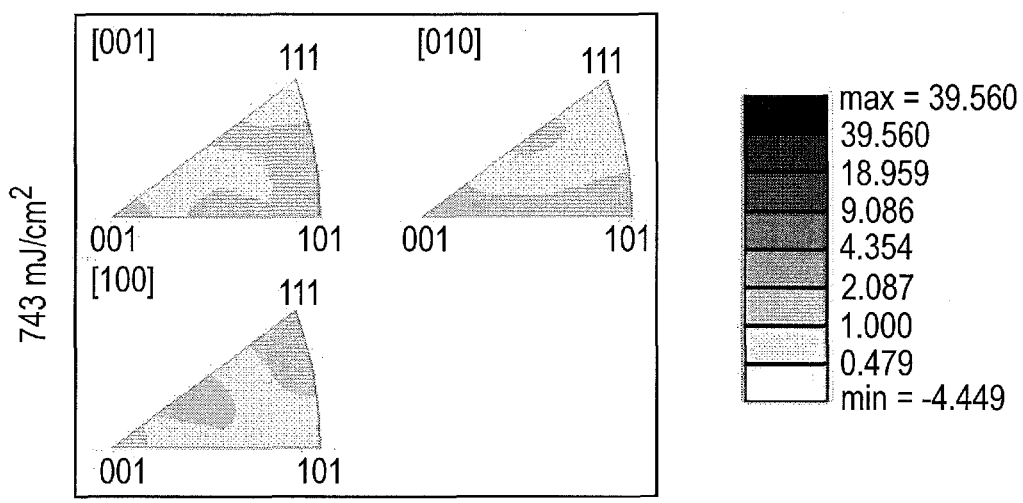
Figure 47A:
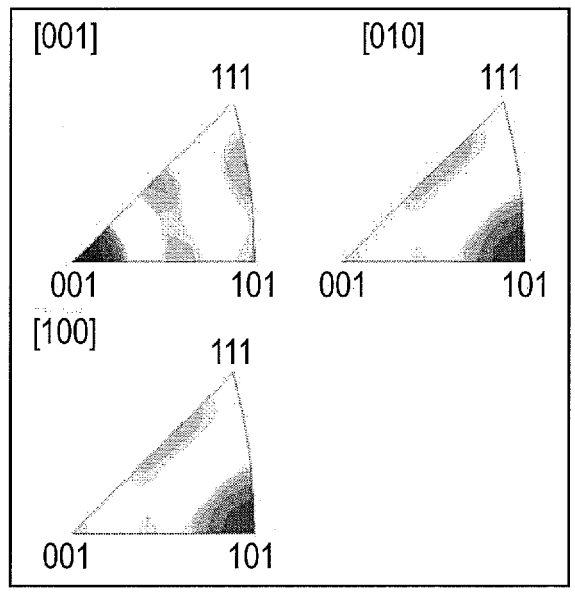
Figure 47A:
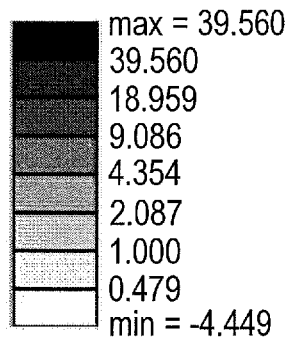
Figures 1, 47B:
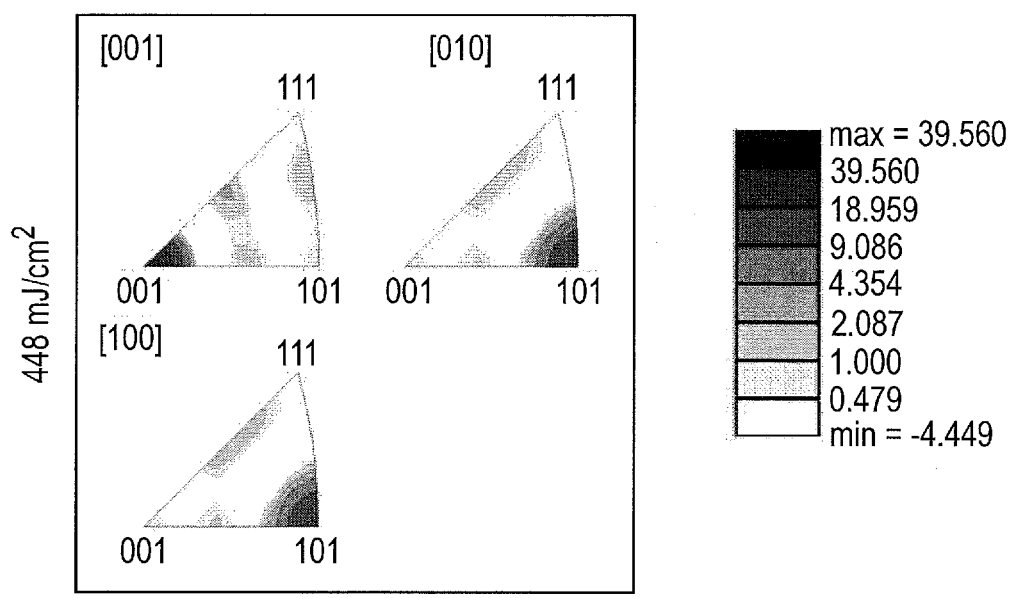
Figures 2, 47B:
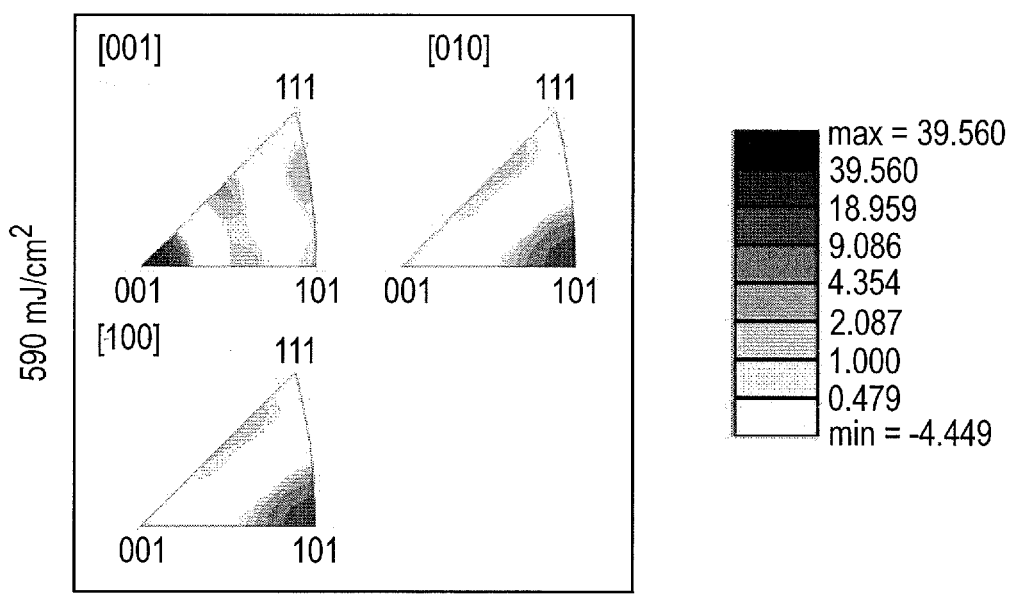
Figure 47B:
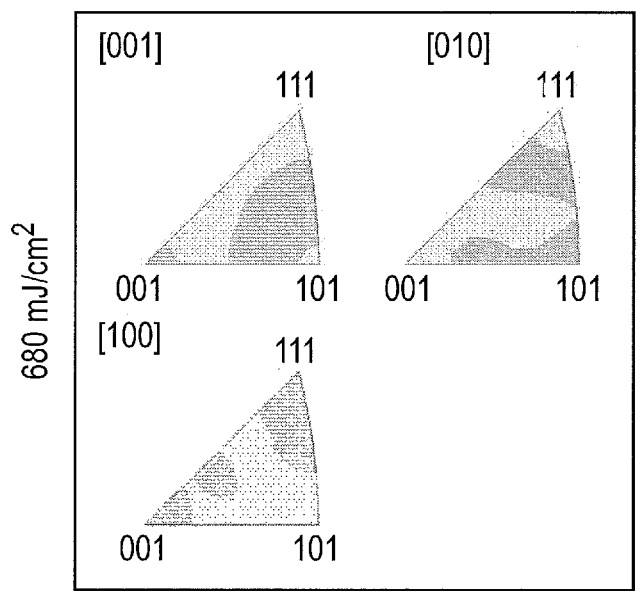
Figure 3:
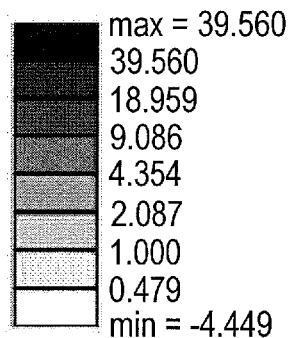
Figures 1, 47C:
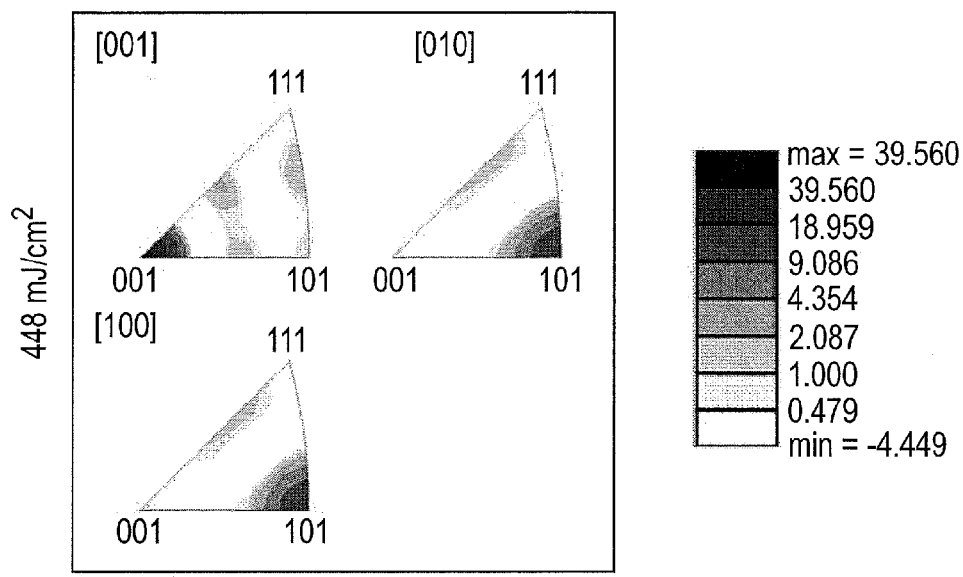
Figures 2, 47C:
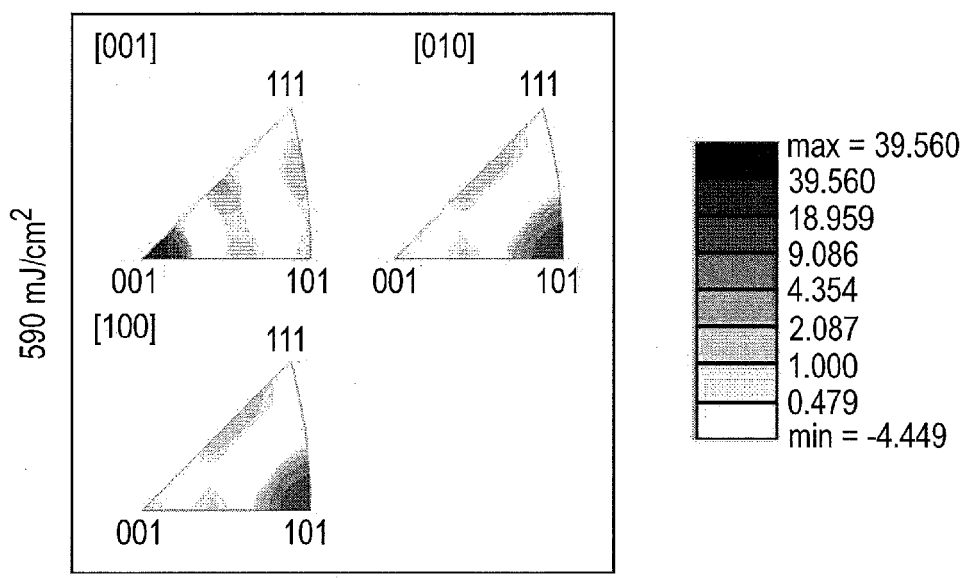
Figures 3, 47C:
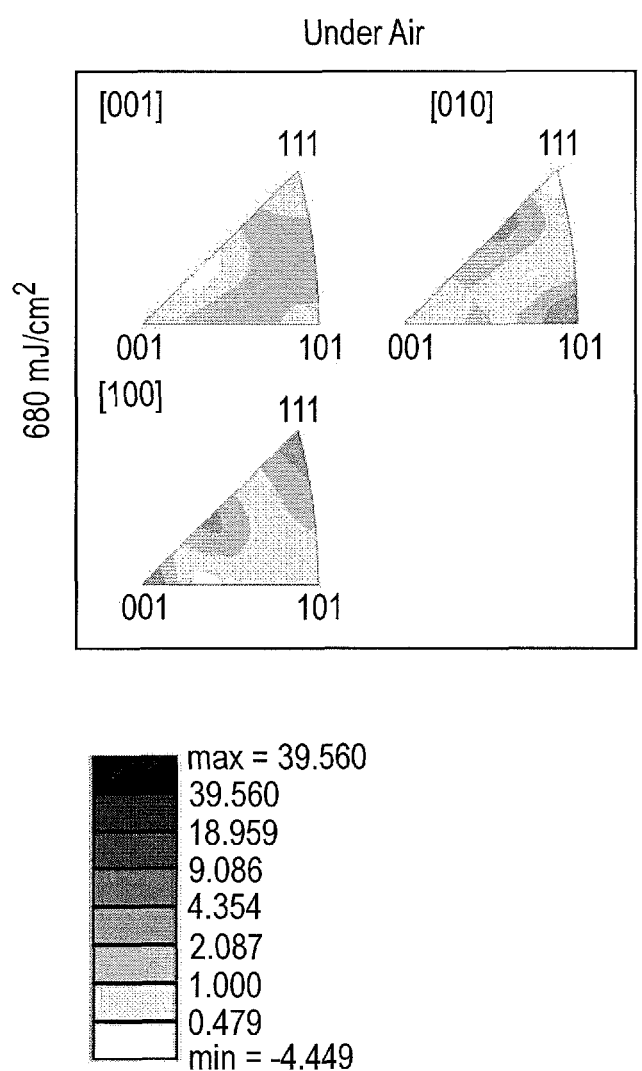

FIGS. 42 to 44 each show the calculation results of a depth direction of hydrogen (H) included in the Si substrate. FIGS. 42, 43, 44 show the calculation results in the case where the accelerating voltages are 80 kV, 60 kV, and 40 kV, respectively. Further, in FIGS. 42 to 44, SIMS data as a measured value and a curve fitted to the SIMS data (hereinafter referred to as a fitting function) are also shown. The sample measured by SIMS was a Si substrate which was irradiated with hydrogen ion species (H$^+$, H$_2^+$, H$_3^+$) produced under the conditions for measuring data of FIG. 39, at accelerating voltage of 80 kV, 60 kV, or 40 kV. Note that the calculation values obtained using Models 1 and 5 are expressed on the vertical axis (right vertical axis) as the number of hydrogen atoms, and the SIMS data and the fitting function are expressed on the vertical axis (left vertical axis) as the concentration of hydrogen atoms. The horizontal axis represents depth from the surface of a Si substrate in the graph.

The fitting function is obtained using the calculation formula (f1) given below, in consideration of Models 1 and 5. Note that, in the calculation formula (f1), X and Y represent fitting parameters and V represents volume.

[Fitting Function]=$X/V$×(Data of Model 1)+$Y/V$×(Data of Model 5)    (f1)

For determining the fitting function, the contribution of H$_2^+$ (i.e., Model 3) should be considered if the ratio between ion species used for actual irradiation (H$^+$:H$_2^+$:H$_3^+$ is about 1:1:8, FIG. 39) is taken into account. However, the contribution of H$_2^+$ is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak corresponding to Model 3 appears in the SIMS data either, FIG. 41).

The contribution of Model 3 is likely to be obscured by channeling (movement of atoms due to crystal lattice structure) that occurs in the irradiation process of Model 5, because the peak position of the profile in a depth direction of hydrogen atoms in the Si substrate of Model 3 is close to that of Model 5 (FIG. 41). That is, it is difficult to estimate fitting parameters for Model 3. This is because this simulation assumes amorphous Si and the influence due to crystallinity is not considered.

FIG. 45 lists the fitting parameters of the calculation formula (f1). At any of the accelerating voltages, the ratio of the amount of H introduced to the Si substrate according to Model 1 to that introduced according to Model 5 is 1:42 to 1:45 (the amount of H in Model 5, when the amount of H in Model 1 is defined as 1, is about 42 to 45), and the ratio of the number of irradiated ion species, H$^+$ (Model 1) to that of H$_3^+$ (Model 5) is 1:14 to 1:15 (the amount of H$_3^+$ in Model 5, when the amount of H$^+$ in Model 1 is defined as 1, is about 14 to 15). Considering that Model 3 is not taken into account and the calculation assumes amorphous Si, it can be said that the ratio shown in FIG. 45 is close to that of the ratio between hydrogen ion species used for actual irradiation (H$^+$:H$_2^+$:H$_3^+$ is about 1:1:8, see FIG. 39).

[Effects of Use of H$_3^+$]

A plurality of benefits resulting from H$_3^+$ can be enjoyed by irradiation of a substrate with hydrogen ion species with a higher proportion of H$_3^+$ as shown in FIG. 39. For example, because H$_3^+$ splits into H$^+$, H, or the like to be introduced into a substrate, ion introduction efficiency can be improved compared with the case of irradiation mainly with $H^+$ or $H_2^+$. This feature leads to an improvement in SOI substrate production efficiency. In a similar way, because the kinetic energy of $H^+$ or H after $H_3^+$ splits tends to be low, $H_3^+$ is suitable for manufacture of thin semiconductor layers.

Note that, in this embodiment, a method is described in which an ion doping apparatus that is capable of irradiation with the hydrogen ion species as shown in FIG. 39 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in cost, and an improvement in production efficiency can be obtained. On the other hand, if first priority is given to irradiation with $H_3^+$, there is no need to interpret the present invention as being limited to the use of an ion doping apparatus.

This application is based on Japanese Patent Application serial no. 2007-132380 filed with Japan Patent Office on May 18, 2007, the entire contents of which are hereby incorporated by reference.

What is claimed is:

1. A manufacturing method of an SOI substrate, the manufacturing method comprising:
    forming a first insulating layer over a semiconductor substrate;
    forming a second insulating layer over the first insulating layer;
    forming an ion introduction layer in the semiconductor substrate by applying an ion beam to the semiconductor substrate through the first insulating layer and the second insulating layer;
    forming a bonding layer over the second insulating layer by a CVD method;
    bonding the semiconductor substrate to a base substrate with the first insulating layer, the second insulating layer and the bonding layer interposed therebetween;
    separating a part of the semiconductor substrate at the ion introduction layer, leaving a semiconductor layer over the base substrate;
    irradiating the semiconductor layer with laser light after the separation step; and
    thinning the semiconductor layer by etching the semiconductor layer.

2. The manufacturing method according to claim 1, wherein the first insulating layer comprises silicon oxide or silicon oxynitride.

3. The manufacturing method according to claim 1, wherein the second insulating layer comprises silicon nitride or silicon nitride oxide.

4. The manufacturing method according to claim 1, wherein the bonding layer is a silicon oxide film.

5. A manufacturing method of an SOI substrate, the manufacturing method comprising:
    forming a first insulating layer over a semiconductor substrate;
    forming a second insulating layer over the first insulating layer;
    forming an ion introduction layer in the semiconductor substrate by applying an ion beam to the semiconductor substrate through the first insulating layer and the second insulating layer;
    bonding the semiconductor substrate to a base substrate with the first insulating layer and the second insulating layer interposed therebetween;
    separating a part of the semiconductor substrate at the ion introduction layer, leaving a semiconductor layer over the base substrate;
    irradiating the semiconductor layer with laser light after the separation step; and
    thinning the semiconductor layer by etching the semiconductor layer,
    wherein the second insulating layer comprises a material selected from aluminum oxide, tantalum oxide, hafnium oxide, aluminum oxynitride film, and aluminum nitride oxide.

6. The manufacturing method according to claim 5, wherein the first insulating layer comprises silicon oxide.

7. The manufacturing method according to claim 1, wherein a thickness of the semiconductor layer after the thinning step is equal to or less than 50 nm.

8. The manufacturing method according to claim 5, wherein a thickness of the semiconductor layer after the thinning step is equal to or less than 50 nm.

* * * * *